US011010076B2

(12) United States Patent
Bennett

(10) Patent No.: US 11,010,076 B2
(45) Date of Patent: *May 18, 2021

(54) MEMORY SYSTEM WITH MULTIPLE STRIPING OF RAID GROUPS AND METHOD FOR PERFORMING THE SAME

(71) Applicant: VIOLIN SYSTEMS LLC, San Jose, CA (US)

(72) Inventor: Jon C. R. Bennett, Sudbury, MA (US)

(73) Assignee: VIOLIN SYSTEMS LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/444,176

(22) Filed: Jun. 18, 2019

(65) Prior Publication Data
US 2019/0303008 A1 Oct. 3, 2019

Related U.S. Application Data

(63) Continuation of application No. 15/467,515, filed on Mar. 23, 2017, now Pat. No. 10,372,366, which is a
(Continued)

(51) Int. Cl.
*G11C 7/10* (2006.01)
*G06F 3/06* (2006.01)
(Continued)

(52) U.S. Cl.
CPC ............ *G06F 3/064* (2013.01); *G06F 3/0619* (2013.01); *G06F 3/0689* (2013.01);
(Continued)

(58) Field of Classification Search
None
See application file for complete search history.

(56) References Cited

U.S. PATENT DOCUMENTS 4,363,094 A 12/1982 Kaul
4,843,288 A 6/1989 Volz
(Continued)

FOREIGN PATENT DOCUMENTS

EP 977121 2/2000
JP H 09265357 10/1997
WO WO 2010071655 6/2010

OTHER PUBLICATIONS

Argument and Amendment in Response to the Notice of Preliminary Rejection for Korean Application No. 10-2012-7000724, dated Jul. 13, 2012, 3 pgs (with translation).
(Continued)

*Primary Examiner* — Brian R Peugh
(74) *Attorney, Agent, or Firm* — Schwabe Williamson & Wyatt, PC

(57) ABSTRACT

A data memory system is described, where there may be an asymmetry in the time needed to write or erase data and the time needed to read data. The data may be stored using a RAID data storage arrangement and the reading, writing and erasing operations on the modules arranged such that the erasing and writing operations may be performed without significant latency for performing a read operation. Where a failure of a memory module in the memory system occurs, methods for recovering the data of the failed module are disclosed which may selected in accordance with policies that may relate to the minimizing the possibility of irretrievable data loss, or degradation of latency performance.

20 Claims, 43 Drawing Sheets

Related U.S. Application Data continuation of application No. 12/901,224, filed on Oct. 8, 2010, now Pat. No. 9,632,870, which is a continuation-in-part of application No. 12/079,364, filed on Mar. 26, 2008, now Pat. No. 8,200,887.

(60) Provisional application No. 61/250,216, filed on Oct. 9, 2009, provisional application No. 60/920,737, filed on Mar. 29, 2007.

(51) Int. Cl.
| | |
|---|---|
| *G11C 29/52* | (2006.01) |
| *G06F 11/10* | (2006.01) |
| *G11B 20/18* | (2006.01) |
| *G06F 12/02* | (2006.01) |

(52) U.S. Cl.
CPC ........ *G06F 11/108* (2013.01); *G06F 11/1068* (2013.01); *G11B 20/1833* (2013.01); *G11C 29/52* (2013.01); *G06F 3/0611* (2013.01); *G06F 3/0659* (2013.01); *G06F 12/0246* (2013.01); *G11B 2220/60* (2013.01); *G11C 7/1072* (2013.01)

(56) References Cited

U.S. PATENT DOCUMENTS

| | | |
|---|---|---|
| 5,128,810 A | 7/1992 | Halford |
| 5,379,262 A | 1/1995 | Okamoto |
| 5,522,031 A | 5/1996 | Ellis et al. |
| 5,623,595 A | 4/1997 | Bailey |
| 5,680,579 A | 10/1997 | Young |
| 5,687,183 A | 11/1997 | Chesley |
| 5,889,795 A | 3/1999 | Niijima et al. |
| 5,974,503 A | 10/1999 | Venkatesh |
| 6,009,547 A | 12/1999 | Jaquette |
| 6,038,570 A | 3/2000 | Hitz |
| 6,118,612 A | 9/2000 | Judd |
| 6,151,289 A | 11/2000 | Rope |
| 6,185,134 B1 | 2/2001 | Tanaka |
| 6,205,571 B1 | 3/2001 | Comporese et al. |
| 6,226,708 B1 | 5/2001 | McGoldrick |
| 6,237,052 B1 | 5/2001 | Stolowitz |
| 6,321,345 B1 | 11/2001 | Mann |
| 6,353,895 B1 | 3/2002 | Stephenson |
| 6,374,337 B1 | 4/2002 | Estakhri |
| 6,425,052 B1 | 7/2002 | Hashemi |
| 6,539,463 B1 | 3/2003 | Kuwata |
| 6,567,311 B2 | 5/2003 | Ishii |
| 6,581,185 B1 | 6/2003 | Hughes |
| 6,591,339 B1 | 7/2003 | Horst |
| 7,111,140 B2 | 9/2006 | Estakhri |
| 7,136,964 B2 | 11/2006 | Yamamoto |
| 7,143,305 B2 | 11/2006 | Hajji |
| 7,149,950 B2 | 12/2006 | Spencer |
| 7,191,304 B1 | 3/2007 | Cameron |
| 7,203,889 B2 | 4/2007 | Oza |
| 7,213,103 B2 | 5/2007 | Eng |
| 7,310,703 B2 | 12/2007 | Frolund |
| 7,356,730 B2 | 4/2008 | Ulrich |
| 7,363,455 B2 | 4/2008 | Shimada |
| 7,366,852 B2 | 4/2008 | Hung |
| 7,451,265 B2 | 11/2008 | Traister |
| RE40,877 E | 8/2009 | Singhal |
| 7,734,867 B1 | 6/2010 | Keeton |
| 7,818,525 B1 | 10/2010 | Frost |
| 7,984,084 B2 | 7/2011 | Sinclair |
| 10,157,016 B2 | 12/2018 | Bennett |
| 2002/0046322 A1 | 4/2002 | Butterworth et al. |
| 2002/0073285 A1 | 6/2002 | Butterworth |
| 2002/0083379 A1 | 6/2002 | Nishikawa |
| 2002/0099904 A1 | 7/2002 | Conley |
| 2002/0103966 A1 | 8/2002 | Wu |
| 2002/0120901 A1 | 8/2002 | Poirier |
| 2003/0046489 A1 | 3/2003 | Yagi |
| 2003/0056142 A1 | 3/2003 | Hashemi |
| 2003/0084397 A1 | 5/2003 | Peleg |
| 2003/0097524 A1 | 5/2003 | Brant |
| 2003/0105928 A1 | 6/2003 | Ash |
| 2003/0110343 A1 | 6/2003 | Hagiwara et al. |
| 2003/0208511 A1 | 11/2003 | Earl |
| 2003/0212858 A1 | 11/2003 | Apperley |
| 2003/0227800 A1 | 12/2003 | Saito |
| 2004/0073767 A1 | 4/2004 | Johnson |
| 2004/0153817 A1 | 8/2004 | Norman |
| 2004/0153902 A1 | 8/2004 | Machado |
| 2005/0015522 A1 | 1/2005 | Elboim |
| 2005/0044313 A1 | 2/2005 | Amemiya |
| 2005/0111249 A1 | 5/2005 | Yagisawa |
| 2005/0146939 A1 | 7/2005 | Conley |
| 2005/0193166 A1 | 9/2005 | Johnson |
| 2005/0223269 A1 | 10/2005 | Stolowitz |
| 2005/0240743 A1 | 10/2005 | Eng |
| 2005/0246362 A1 | 11/2005 | Borland |
| 2005/0279837 A1 | 12/2005 | Haiji |
| 2006/0064545 A1 | 3/2006 | Wintergerst |
| 2006/0123312 A1 | 6/2006 | Forhan |
| 2006/0129876 A1* | 6/2006 | Uemura ............ G06F 11/1076 714/6.12 |
| 2006/0161678 A1 | 7/2006 | Bopardikar |
| 2006/0187715 A1 | 8/2006 | Narvaez |
| 2006/0195657 A1 | 8/2006 | Tien et al. |
| 2006/0271725 A1 | 11/2006 | Wong |
| 2007/0061513 A1 | 3/2007 | Tsumagari |
| 2007/0067563 A1 | 3/2007 | Smith |
| 2007/0079219 A1 | 4/2007 | Nagai |
| 2007/0088754 A1 | 4/2007 | Brannon |
| 2007/0089045 A1 | 4/2007 | Corbett et al. |
| 2007/0101075 A1 | 5/2007 | Jeddeloh |
| 2007/0113029 A1 | 5/2007 | Bennett |
| 2007/0124532 A1 | 5/2007 | Bennett |
| 2007/0162516 A1 | 7/2007 | Thiel |
| 2007/0279993 A1 | 12/2007 | Hemink |
| 2008/0052446 A1 | 2/2008 | Lasser |
| 2008/0059869 A1 | 3/2008 | Brewer |
| 2008/0089135 A1 | 4/2008 | Ito |
| 2008/0098054 A1 | 4/2008 | Carmody |
| 2008/0109616 A1 | 5/2008 | Taylor |
| 2008/0126673 A1 | 5/2008 | Kaneda |
| 2008/0155160 A1 | 6/2008 | McDaniel |
| 2008/0168304 A1 | 7/2008 | Flynn |
| 2008/0183953 A1 | 7/2008 | Flynn |
| 2008/0250270 A1 | 10/2008 | Bennett |
| 2008/0282025 A1 | 11/2008 | Biswas |
| 2008/0316822 A1 | 12/2008 | Ahn |
| 2008/0320366 A1 | 12/2008 | Lin |
| 2009/0006886 A1 | 1/2009 | O'Connor |
| 2009/0010067 A1 | 1/2009 | Lee |
| 2009/0089045 A1 | 4/2009 | Lenat |
| 2009/0106491 A1 | 4/2009 | Piszczek |
| 2009/0147573 A1 | 6/2009 | Hemink |
| 2009/0150599 A1 | 6/2009 | Bennett |
| 2009/0172258 A1 | 7/2009 | Olbrich |
| 2009/0172335 A1 | 7/2009 | Kulkarni |
| 2009/0198947 A1 | 8/2009 | Khmelnitsky |
| 2009/0204872 A1 | 8/2009 | Yu |
| 2010/0023672 A1 | 1/2010 | Gorobets |
| 2010/0115189 A1 | 5/2010 | Lin |
| 2011/0099320 A1 | 4/2011 | Lucas |

OTHER PUBLICATIONS

Amendment from counterpart Korean Application No. 10-2012-7009026, dated Aug. 9, 2016, 14 pgs (with partial translation).

Argument and Amendment from counterpart South Korean Application No. 10-2013-7005934, dated Dec. 18, 2013, 24 pages.

Chang, L.P., et al., "Real-Time Garbage Collection for Flash Memory Storage Systems of Real-Time Embedded Systems", ACM Transactions on Embedded Computing Systems, vol. V, No. N, Jun. 2004, pp. 1-26.

(56) References Cited

OTHER PUBLICATIONS

Chen, P.M., et al., "Maximizing Performance in a Striped Disk Array," Computer Science Division, University of California, Berkeley, 10 pgs. (Published prior to Jan. 1, 1990).
Choudhuri, S., et al., "Deterministic Service Guarantees for NAND Flash using Partial Block Cleaning", CODES+ISSS/08, Oct. 19-24, 2008, Atlanta, Georgia, USA, Copyright 2008 ACM 978-1-60558-470—Jun. 8, 2010, pp. 19-24.
Choudhuri, S., et al., "Real-Time Access Guarantees for NAND Flash Using Partial Block Cleaning", SEUS 2008, LNCS 5287, pp. 138-149, 2008, .COPYRGT. IFIP International Federation for Information Processing 2008.
English translation of Argument and Amendment from counterpart South Korean Application No. 10-2012-7009026, dated Aug. 9, 2013, 8 pages.
European Patent Office Communication for European Application No. 08742320.8, dated Feb. 28, 2012, 5 pgs.
European Patent Office Communication from EP Application N. 11168499.9, dated Oct. 22, 2012, 4 pgs.
Extended European Search Report for European Application No. 10786789.7, dated Nov. 22, 2012, 6 pgs.
Extended European Search Report for European Application No. 10822795.0, dated Apr. 29, 2013, 8 pgs.
Graefe, G., "Write-Optimized B-Trees", Proceedings of the 30.sup.th VLDB Conference, Toronto, Canada, 2004, pp. 672-683.
International Preliminary Report on Patentability for International Application No. PCT/2010/052074, 4 pgs.
International Search Report and the Written Opinion of the International Searching Authority for International Application No. PCT/US2010/037987, dated Dec. 30, 2010, 9 pgs.
International Search Report for International Application No. PCT/2010/052074 (3 pgs). dated Mar. 11, 2012.
International Search Report for International Application No. PCT/US2008/083969, dated Apr. 30, 2009, 3 pgs.
Jeffrey, C.A., "Performance Analysis of Dynamic Sparing and Error Correction Techniques for Fault Tolerance in Nanoscale Memory Structures", Thesis Presentation to the University of Florida, 2004, 104 pgs.
Juonolainen, M.K., "Cand Scient Thesis", University of Oslo, Jan. 2, 1999, 129 pgs.
Norvag, K., et al., "Log-Only Temporal Object Storage", Copyright 1997 IEEE, published in the Proceedings of DEXA'97, Sep. 1-2, 1997, Toulouse, France, 6 pp.
Notice of Preliminary Rejection for Korean Application No. 10-2012-7000724, dated Feb. 20, 2013, 12 pgs.
Notice of Preliminary Rejection for Korean Application No. 10-2012-7000724, dated Jun. 20, 2012, 3 pgs (with translation).
Notice of Preliminary Rejection for South Korean Application No. 10-2012-7009026, dated Nov. 9, 2012, 10 pgs.
Office Action for related U.S. Appl. No. 14/642,910 dated Apr. 28, 2015.
Office Action from counterpart Chinese Application No. 200880007937.4, dated Jun. 29, 2012, and Response dated Oct. 8, 2012, 30 pgs.
Office Action from U.S. Appl. No. 12/901,224, dated Oct. 18, 2012, 23 pgs.
Patterson, D.A., et al., "A Case for Redundant Arrays of Inexpensive Disks (RAID),", Reprint from Proceedings of the ACM SIGMOD International Conference on Management of Data, pp. 3-14, Jun. 1988.
Response to Communication from the European Patent Office for European Application No. 08742320.8, dated Sep. 4, 2012, 14 pgs.
Sanders, D.A., et al., "Terabyte IDE RAID-5 Disk Arrays", 2003 Conference for Computing in High Energy and Nuclear Physics, LaJolla, California, Mar. 24-28, 2003, pp. 1-8.
Shirriff, K.W., "Sawmill: A Logging File System for a High-Performance RAID Disk Array", Dissertation Presentation, University of California, 1995, pp. 164.
Unknown author, Intel.RTM., "Intelligent RAID 6 Theory Overview and Implementation", www.intel.com/design/storage/intelligent_raid.htm, Copyright 2005 Intel Corporation, 13 pgs.
Unknown author, Intel.RTM., "Understanding the Flash Translation Layer (FTL) Specification", Dec. 1998, Order No. 2997816-002, . COPYRGT. 1997, Intel Corporation, pp. 1-20.
Unknown author, NXP Corp "LPC122x", datasheet, in U.S. Appl. No. 12/079,364, filed Mar. 26, 2008, updated, p. 44 of 60.
Unknown author, Samsung Electronics Flash Memory, "1G.times.8 Bit/2G.times.8 Bit/4G.times.Bit NAND Flash Memory", K9XXG08UXA, Date Unknown, 50 pgs (published prior to Jan. 10, 2006).
Unknown author, Violin Memory, Inc., "Spike Free Low Latency", obtained from Internet Address www.vmem.com, .COPYRGT. 2011, Violin Memory, Inc., 8 pgs.
Wan, Jiguang et al., "S2-RAID: Parallel RAID Architecture for Fast Data Recovery";, Journal of Latex Class Files, vol. 6, No. 1, Jan. 2007, 16 pgs.
Written Opinion of the International Searching Authority for International Application No. PCT/US2008/083969 dated Apr. 30, 2009, 5 pgs.
Written Opinion of the International Searching Authority International Application No. PCT/2010/052074 dated Jun. 30, 2011, 5 pgs.
Written Opinion of the International Searching Authority International Application No. PCT/2010/052074, 8 pgs.

\* cited by examiner

FIG. 6B

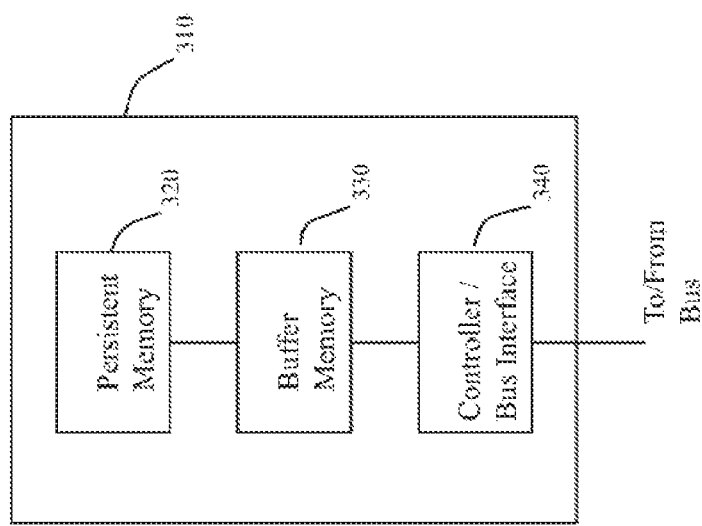

Fig. 41

MEMORY SYSTEM WITH MULTIPLE STRIPING OF RAID GROUPS AND METHOD FOR PERFORMING THE SAME

This application is a continuation of U.S. Ser. No. 15/467,515, filed on Mar. 23, 2017, now issued U.S. Pat. No. 10,372,366, which is a continuation of U.S. Ser. No. 12/901,224, filed on Oct. 8, 2010, now issued U.S. Pat. No. 9,632,870, issued Apr. 25, 2017, which claims the benefit of U.S. provisional application 61/250,216, filed on Oct. 9, 2009. U.S. Ser. No. 12/901,224, filed on Oct. 8, 2010, now issued U.S. Pat. No. 9,632,870, issued Apr. 25, 2017, is also a continuation-in-part of U.S. Ser. No. 12/079,364, filed on Mar. 26, 2008, now issued U.S. Pat. No. 8,200,887, issued Jun. 12, 2012, which claims the benefit of U.S. provisional application 60/920,737, each of which is are all incorporated herein by reference in their entireties.

TECHNICAL FIELD

The present application relates to computer memory systems, and a method of using the same.

BACKGROUND

Computer memory systems may be either of the persistent or non-persistent type. Examples of persistent memory types are magnetic cores, disk drives, tape drives and semiconductor FLASH memories. Non-persistent memory types may be semiconductor memories such as DRAM or the like. Non-persistent memory types typically have rapid access times for both reading and writing of data and are used as computer main memory or cache memory. The data is retained in such memories by means which require a supply of power, and the information stored therein may be lost if the power is interrupted. Systems of non-persistent memory usually have a back-up power supply, which may be a capacitive storage device for short duration power interruptions, or back-up power supplies using batteries, generators, or the like for longer term data retention.

Persistent storage devices, such as disk, tape or FLASH memory retain stored data even if the power source is removed from the device, and are often used to back up the non-persistent data storage devices, and for longer-term data storage where the cost or reliability of providing continuous power is not practical. Additionally, since larger amounts of data are stored in the persistent data storage devices, the technologies developed have been oriented towards the reduction of the cost per bit of storage, rather than access speed. Thus, many computing systems use a variety of memory types to perform different storage functions, where immediately needed data is stored in non-persistent storage, and may be backed up in persistent storage, while less frequently accessed data, and large groupings of data are stored in persistent storage.

Computer data base systems, which may be termed data centers, or distributed data systems such as the Internet and the storage devices associated therewith may store vast amounts of data. Certain aspects of this architecture are currently being termed "cloud" computing. Today, such data storage requirements may exceed 1000 Terabytes (TB), and are expected to continue to grow. Many of these data sets are substantially larger than the capability of non-persistent storage to immediately access, and the response time of the servers in a data center when servicing a request from a client computer may be a serious bottleneck in system performance. Much of this restriction is a result of the data-access-time latency of the persistent storage media. For tape systems, the linear tape must be translated so that the data portion to be read or written is positioned at the reading or writing heads. Similarly, for a disk, the head must be positioned so as to be over the data track where the desired sector of data is located, and then the disk controller waits until the sector rotates under the positioned head. Any of these operations is substantially slower than reading or writing to non-persistent memory devices. Such limitations are particularly severe where data single memory locations having a random location in the data base need to be read, written or modified.

The time between a request for data stored in a memory and the retrieval of data from the memory may be called the latency. FLASH memories, amongst the presently used persistent memory technologies, has a lower latency than mechanical devices such as disks, but has significantly more latency than the non-persistent memory types in current use. The price of FLASH memory and similar solid state technologies has traditionally been governed by a principle known as Moore's Law, which expresses the general tendency for the capacity of a device to double, and the price to half, during an 18-month period. As such, the cost of storing data in FLASH memory rather than in, for example, a disk is expected to reach parity soon.

While having significantly lower latency than a disk device, FLASH memory remains limited in access time by the design and method of operation of currently available memory modules. FLASH memory is a generic term, and a variety of types of solid state devices may be considered to be FLASH memory. Originally there was an electronically erasable programmable read only memory (EEPROM), followed by other developments, which are known as NOR-FLASH, NAND-FLASH, and the like. Each of the technologies has a different design and organization and differing attributes with respect to the reading and writing of data. That is, there may be a restriction on the minimum size of a block of data that may be either read or written (e.g., data word, page, or data sector), or a difference in the time necessary to read or to write data. In many instances, the time for reading or writing data is not deterministic, and may vary over a wide range. The memory controller, or other such device, must keep track of the outstanding requests until they are fulfilled, and this requirement makes the data latency a variable quantity which may slow down the overall system, and may increase the complexity of the hardware and software used to manage the memory. In addition, the lifetime of a FLASH memory device is considered to be subject to a wear out mechanism, and is measured in read, write (also called "program" when referring to FLASH memories) or erase cycles. Herein, the term "write" is used to mean "program" when a FLASH memory is being used.

Although the number of cycles in a lifetime may be large for each location or sector, a computation may be made to show that both in practice, and in pathological situations which may arise, the lifetime of individual components of large memories formed from FLASH devices is sufficiently short that considerable effort may be necessary to level the wear of the memory and to perform error detection and correction, mark bad data blocks, and the like.

The concept of RAID (Redundant Arrays of Independent, or Inexpensive, Disks) dates back at least as far as a paper written by David Patterson, Garth Gibson and Randy H. Katz in 1988. RAID allows disks memory systems to be arranged so to protect against the loss the data that they contain by adding redundancy. In a properly configured RAID architecture, the loss of any single disk will not interfere with the ability to access or reconstruct the stored data, although other performance indicia may be affected. The Mean Time Between Failure (MTBF) of the disk array without RAID will be equal to the MTBF of an individual drive, divided by the number of drives in the array, since the loss of any disk results in a loss of data. Because of this, the MTBF of an array of disk drives would be too low for many application requirements. However, disk arrays can be made fault-tolerant by redundantly storing information in various ways.

For example, RAID-3, RAID-4, and RAID-5 and the like, are variations on a theme. The theme is parity-based RAID. Instead of keeping a full duplicate copy of the data as in RAID-1, the data is spread over several disks with an additional disk added. The data on the additional disk may be calculated (using Boolean XORs) based on the data on the other disks. If any single disk in the set of disks is lost, the data stored on that disk can be recovered through calculations performed on the data on the remaining disks. These implementations are less expensive than RAID-1 (mirroring) because they do not require the 100% disk space overhead that RAID-1 requires. However, because the data on the disks is recovered by calculation, there are performance implications associated with writing the data, and with recovering data after a disk is lost. Many commercial implementations of parity RAID use cache memory to alleviate the performance issues.

In a RAID-4 disk array, there is a set of data disks, usually 4 or 5, plus one extra disk that is used to store the parity for the data on the other disks. Since all writes result in an update of the parity disk, that disk may become a performance bottleneck slowing down all write activity to the entire array.

Fundamental to RAID is "striping", a method of concatenating multiple drives (memory units) into one logical storage unit. Striping involves partitioning storage space of each drive into "stripes" which may be as small as one sector (e.g., 512 bytes), or as large as several megabytes, or more. These stripes are then interleaved so that the combined storage space is comprised of stripes from each drive in the stripe. The type of application environment, I/O or data intensive, may a design consideration that determines whether large or small stripes are used.

RAID-5 may be implemented using the same hardware configuration as RAID-4. In the case of RAID-4, the parity block is stored on the same disk for each of the stripes, so that one may have what is termed a parity disk. In the case of RAID-5, the parity block for each stripe is stored on a disk that is part of the stripe, but the parity blocks are distributed such that they are distributed essentially uniformly over the plurality of the disks making up the storage system. RAID-6 is another improvement in data protection, which involves the computation of a parity across a plurality of stripes, for example using the columns of the stripes as the basis for computing the parity.

The performance of a RAID 3 or RAID 4 array may be advantageous for reads (the same performance as level 0). Writes, however, require that parity data be updated each time. This slows small random writes, in particular, though large writes or sequential writes are fairly fast. Because only one drive in the array stores redundant data, the cost per megabyte of a RAID 4 array can be fairly low. The distribution of data across multiple disks can be managed by either dedicated hardware or by software. Additionally, there are hybrid RAID architectures that are partially software and partially hardware-based solutions.

Conceptually, an organization of data and error correction parity data is shown in FIG. 1, where the data in one block A is striped across three disks as data sets A1, A2 and A3, and a parity data set Ap is on the fourth disk, and where the parity data set Ap is typically computed as an exclusive-OR (XOR) of the data sets A1, A2, and A3. As is known to a person of skill in the art, any one of the data sets A1, A2, A3 or Ap may then be reconstructed from the other three data sets. Therefore an error in any of the data sets, representing, for example, a failure of one of the disks, may be corrected by the use of the other data sets.

An error-correcting code (ECC) is an algorithm in which each data signal conforms to specific rules of computation so that departures from this computation in the received or recovered signal, which represent an error, can generally be automatically detected and corrected. ECC is used in computer data storage, for example in dynamic RAM, FLASH memories and the like, and in data transmission. Examples of ECC include Hamming code, BCH code, Reed-Solomon code, Reed-Muller code, binary Golay code, convolutional code, and turbo code. The simplest error correcting codes can correct single-bit errors and detect double-bit errors. Other codes can detect or correct multi-bit errors. ECC memory provides greater data accuracy and system uptime by protecting against errors in computer memory. Each data set A1, A2, A3, Ap of the striped data may have an associated error correcting code ECC data set appended thereto and typically stored on the same disk. When the data is read from a disk, the integrity of the data is verified by the ECC and, depending on the ECC employed, one or more errors may be detected and corrected. In general, the detection and correction of multiple errors is a function of the ECC employed, and the selection of the ECC will depend on the level of data integrity required, the processing time, and other costs.

SUMMARY

A memory system is disclosed, including a plurality of memory modules, each module having a capability for writing and reading data. A group of modules of the plurality of modules are configured such that data stored on the group of modules may be read without blockage associated with writing or erasing of data from any of the modules of the group of modules.

In another aspect a memory system has a plurality of memory modules, each module having a capability for writing and reading data. A group of modules of the plurality of modules stores user data and parity data for the user data. Write or erase operations of the group of modules are configured such that at least one of at least all of user data in a read request, or less than all of the user data in a read request and sufficient parity data to reconstruct the requested user data, request; and time delay to read or reconstruct the data is less than a less than a time interval where a module of the group of modules is in a write or erase state.

In yet another aspect, a memory system has a plurality of memory modules, each module having a capability for writing and reading data. A group of modules of the plurality of modules stores user data and parity data for the user data, and write or erase operations of the group of modules is arranged such that at least one of at least all of the user data or less than all of the user data and sufficient parity data to reconstruct the user data is readable without encountering a time delay due to erase or write operations performed on the group of modules. The assignment of data to modules comprises assigning groups of addresses to memory modules to a RAID stripe in accordance with a generating pattern in logical address space.

In still another aspect, a memory system may have a plurality of memory modules, each module having a capability for writing and reading data. A group of modules of the plurality of modules are configured such that write operations are performed on the group of modules are constrained so that a plurality of the write operations performed in an overlapping time interval.

A method of storing data in a memory system is disclosed, including: providing a plurality of memory modules controllable so that a group of the plurality of memory modules operates so that only one of the memory modules is performing a write or an erase operation in any epoch; storing an file of user data on the group of memory modules, including parity data of the user data so that the user data can be read by one of: reading all of the user data from memory modules that are not performing the write or the erase operation; or reading less than all of the user data from memory modules that are not performing write or erase operations, where the memory module storing the parity data is not performing the write or erase operation.

In another aspect, a method of storing data in a memory system is disclosed, including: providing a plurality of memory modules controllable so that a group of the plurality of memory modules operates so that only one of the memory modules is performing a write or an erase operation in any epoch; storing an file of user data on the group of memory modules, including parity data of the user data so that the user data can be read by one of: reading all of the user data from memory modules that are not performing the write or the erase operation; or reading less than all of the user data from memory modules that are not performing write or erase operations, where the memory module storing the parity data is not performing the write or erase operation.

BRIEF DESCRIPTION OF THE DRAWINGS

FIG. 6B shows the relationship of write and read operations for sequential time intervals of FIG. 6A;

FIG. 7 is a block diagram of a memory module;

FIG. 41 shows a logical address space of 6×10 having stripes of slope zero, left diagonal and right diagonal.

DETAILED DESCRIPTION

Figure 1:
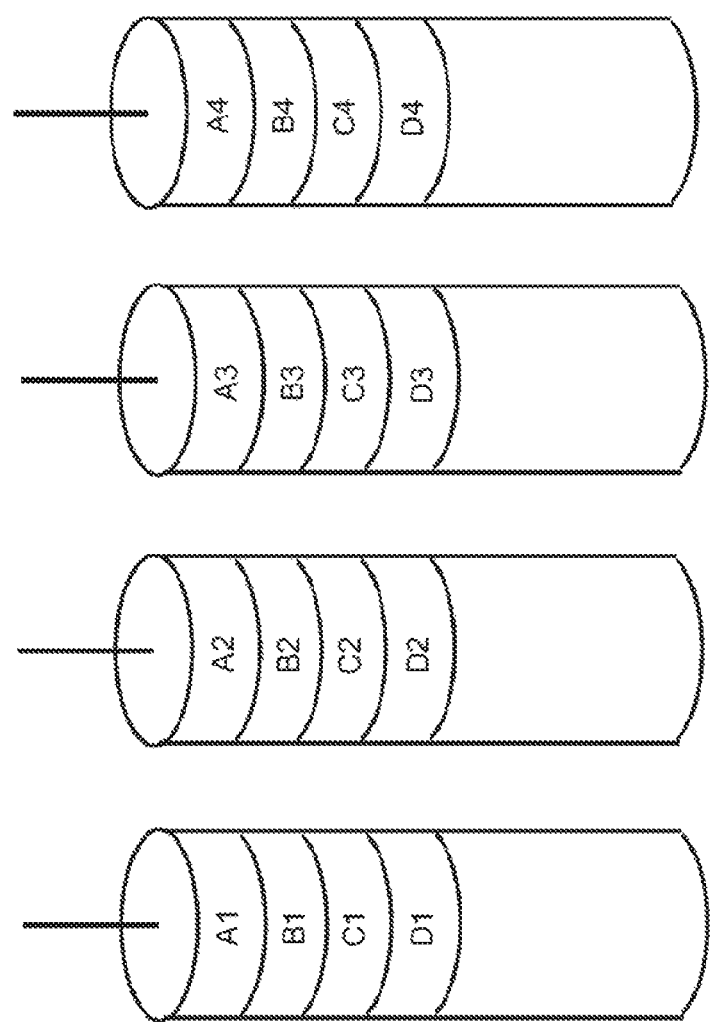
FIG. 1 illustrates a RAID 4 data storage system on a plurality of disk drives (prior art)

Exemplary embodiments may be better understood with reference to the drawings, but these embodiments are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

It will be appreciated that the methods described and the apparatus shown in the figures may be configured or embodied in machine-executable instructions, e.g. software, or in hardware, or in a combination of both. The machine-executable instructions can be used to cause a general-purpose computer, a special-purpose processor, such as a DSP or array processor, or the like, that acts on the instructions to perform functions described herein. Alternatively, the operations might be performed by specific hardware components that may have hardwired logic or firmware instructions for performing the operations described, or by any combination of programmed computer components and custom hardware components, which may include analog circuits.

The methods may be provided, at least in part, as a computer program product that may include a non-volatile machine-readable medium having stored thereon instructions which may be used to program a computer (or other electronic devices) to perform the methods. For the purposes of this specification, the terms "machine-readable medium" shall be taken to include any medium that is capable of storing or encoding a sequence of instructions or data for execution by a computing machine or special-purpose hardware and that may cause the machine or special purpose hardware to perform any one of the methodologies or functions of the present invention. The term "machine-readable medium" shall accordingly be taken include, but not be limited to, solid-state memories, optical and magnetic disks, magnetic memories, and optical memories, as well as any equivalent device that may be developed for such purpose.

For example, but not by way of limitation, a machine readable medium may include read-only memory (ROM); random access memory (RAM) of all types (e.g., S-RAM, D-RAM, P-RAM); programmable read only memory (PROM); electronically alterable read only memory (EPROM); magnetic random access memory; magnetic disk storage media; FLASH memory, which may be NAND or NOR configured; memory resistors; or electrical, optical, acoustical data storage medium, or the like. A volatile memory device such as DRAM may be used to store the computer program product provided that the volatile memory device is part of a system having a power supply, and the power supply or a battery provides power to the circuit for the time period during which the computer program product is stored on the volatile memory device.

Often the data is managed in the form of a logical array as the data structure. However, the same logical array may be associated with a physical memory array having the same organization, or other organization. Although the operation of many of the examples, herein is described as if there were a direct correspondence between the logical data structure and the physical apparatus, this may not be the arrangement in practice, where the assignment of data to memory locations may be governed by the architecture of the memory system, the possibility of bad (e.g., failed or missing) memory locations, wear leveling considerations, and the like. Such assignment of the data to physical locations may be performed by a file management system, such as the PCMCIA FLASH Translation Layer FTL, or file systems such as the Linux Journaling FLASH File System version 2 (JFFS2), the Aleph One Yet Another FLASH File System (YAFFS), or storage-aware file systems such as the Sun ZFS (Sun Microsystems), and others which would be known to a person of ordinary skill in the art, or may be developed to perform a similar or equivalent function.

A relationship between logical and physical addresses may be presumed when interpreting the examples described herein. The choice of one or the other for discussion is a matter of convenience and is not a restriction, unless specifically mentioned. As such, data stripes of a RAID-organized memory may be mapped to any of the actual memory locations in the memory system. The constraints on the timing of erase, write and read operations should therefore be interpreted with respect to the data in a stripe, wherever such stripe is located in the memory system. That is, the terms memory module, memory location, data block and the like may generally be effectively used interchangeably. The structure or method of interconnecting the memory elements is not intended to be constrained by this description. Moreover, the physical memory may be realized as a plurality of modules, a single module or a single substrate, as examples.

Furthermore, it is common in the art to speak of software, in one form or another (e.g., program, procedure, process, application, module, algorithm or logic), as taking an action or causing a result. Such expressions are merely a convenient way of saying that execution of the instructions of the software by a computer or equivalent device causes the processor of the computer or the equivalent device to perform an action or a produce a result, as is well known by persons skilled in the art.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

A memory array may be constructed from memory elements other than disk drives. For example the memory array may be formed by a plurality of FLASH memory modules or other semiconductor memory devices, which may be volatile or non-volatile memory devices. Herein, while the examples are provided using FLASH memory circuits as the memory device of the memory system, there is no intent to preclude the use of any form of persistent or non-persistent memory such as has been described above, or which may hereafter be developed for a same or similar function, either alone or in combination in the design or construction of a memory system.

In a first example, a RAID 4 architecture is used, without suggesting that other RAID architectures, or the like, are excluded. Indeed, RAID numbers (3, 5, 6, etc.) are helpful shorthand ways of describing systems of storage but they are neither precise nor distinct descriptions of such systems; a RAID 4 system with only 2 storage components could as well be called a RAID 1 system. A RAID 4 system where the common access size is a full stripe could be called a RAID 3 system. A RAID 3 system is not precluded from using the rotational parity of a RAID 5. Additionally any RAID system might have additional properties such as parity or delta logging which have no correspondence to a RAID number. Others, such as RAID 6, indicate more than one bit of parity may be used but do not specifically indicate which of the many possible multiple parity implementations is intended. Thus, it should be understood that the use of RAID numerology herein is purely for illustrative purposes and should not be taken as indicating a limitation on the applicability of the techniques described. The choice of a RAID architecture is an engineering and economic decision based on such criteria as cost, reliability, latency for reading or writing, power consumption, data recovery speed, and the like. A person of skill in the art will understand that system and method shown in this example can be adapted to improve the performance of a RAIDed system in one or more of that acts of reading data or writing data (including erasing data), whether in response to user requests or for housekeeping operations.

FLASH memories have a finite lifetime. The failure of FLASH memories may be broadly divided into a conventional failure mode which is associated with a defect in the construction which is either latent, or which develops by the passage of time, and which is considered typical of electronic components, and a wear-out mechanism. Typically, the wear-out mechanism is related to the number of times a FLASH memory module is accessed for an erase operation although, depending on the specific technology, reading or writing may be the wear-out mechanism. Although this is an electronic failure mechanism, one may consider it as more typical of a mechanical failure mechanism, such as is known as being due to the number of miles that a car has been driven. Both mechanisms may need to be considered in system design, and the overuse of a particular memory location avoided, by hardware or software management of the system operation.

When FLASH memory is used, a failure mechanism at wear-out may be a single bit error in an array of data. Such a single bit error may ordinarily be detected and corrected by an error correcting code (ECC) associated with the data set in a particular memory module. The corrected data is then transmitted to the memory controller and combined with the data read from the other stripes to form a requested data set A. Since the data retrieved from stored data subsets A, A2, A3 does not have any errors, or the errors have been corrected by the ECC, the data from data set Ap is redundant. Only when one of the data sets A1, A2, A3 has a detected, but uncorrectable error, such as due to a memory module failure, is the data set Ap needed to correct the data of data set A. Such a multi-bit error would result, for example, if a memory module itself failed, and the data of data set A needed to be reconstructed using the remaining three data sets (the other three of the set of A1, A2, A3, Ap). For design purposes, the occurrence of such an error type may be considered to be characterized by the electronic mean time between failure (MTBF) of a single memory module, or disk. Generally, only the data in the stripes A1, A2 and A3 is used, and the parity stripe Ap is retrieved and used only for the reconstruction of data when a failure occurs.

In an aspect, in a FLASH memory system, when a single bit error in the data stored in a memory module has been reported, a FLASH memory module may be considered to be unreliable, and the memory controller may "mark" or record the location of the memory module as being unusable, until such time as the memory module is replaced. Alternatively, a determined number of single-bit or multi-bit errors may be permitted to accumulate before the memory module or memory circuit is considered unusable and a repair action may be conducted.

The characteristics of some FLASH memory technologies may make the writing and reading of small-sized blocks of data somewhat impractical, and a situation may arise where the size of the block to be written may be smaller than the minimum block size that the memory system is capable of writing or erasing. For example, a software system may segment files into block sizes of 512 bytes; however, the minimum practical erase size for the memory system is 128 Kbytes.

The four 512 byte data elements may be considered together make up a 2 Kbyte page. When referring to the FLASH memory, using an analogy to disk architecture, such a group of contiguous memory locations may be termed "sectors" even though no rotating medium is involved. The term "block" when used generically to refer to any type of data, including parity data, is not intended to connote a specific size in bytes or any other measure, but is used to refer to groups of data which may be associated with a particular description.

Where a RAID 4 system is used, the sectors of the 2 K data page, each comprising 512 bytes may be striped across four memory modules, while a fifth memory module is used for the parity data. In this example, the 512 byte sector size, the use of 5 memory modules to store aspects of the page and parity data, and a minimum erase size of 128 Kbytes for each memory module will be assumed, but it will be understood that these parameters are merely an example and not intended to suggest any particular limitation of the system or method.

Figure 2:
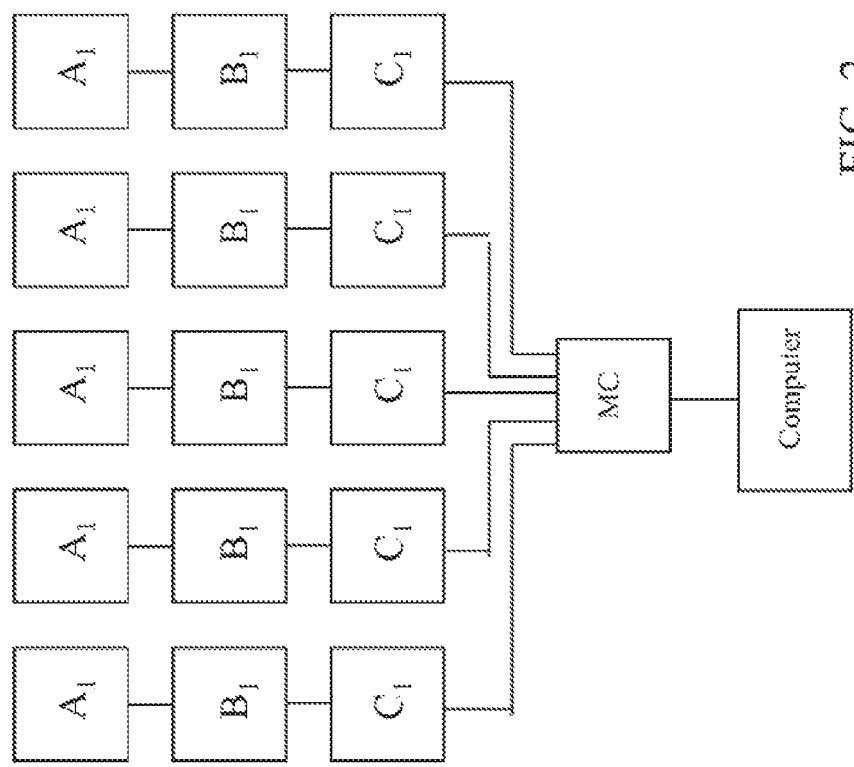
FIG. 2 illustrates a plurality of memory modules arranged in a row and column storage array.

FIG. 2 illustrates a memory system comprising a plurality of memory modules, the memory modules being connected to a memory controller through a bus. Each bus has a plurality of memory modules connected in a serial bus configuration, and has an organization which may be considered as comparable to that of a disk of the disk array of FIG. 1. In addition to being representative of a physical arrangement of memory modules, this arrangement may be considered as a logical address space for memory modules having a different physical organization.

Figure 3:
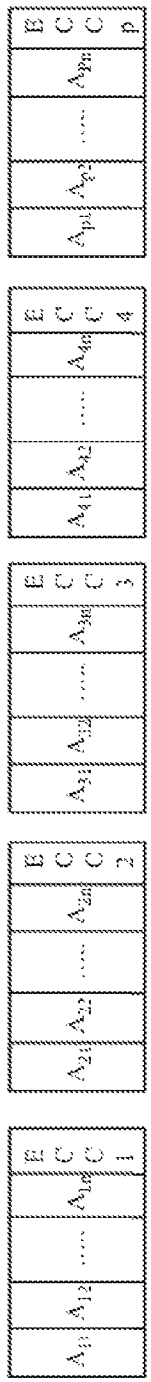
FIG. 3 is an example of a data structure for an array A stored on a plurality of memory modules.

FIG. 3 illustrates an organization of memory locations corresponding to the data array A, where the data array size may be considered to be a multiple of the size of the sector size that may be written to the memory device. Each of the memory modules has an erase block size of 128 K bytes, made up of a plurality of memory sectors of size 512 bytes, and designated Amn, where m is the memory bus on which the memory module is located and n represents the individual memory locations associated with 512 byte sectors in each memory module write block. In this example, there are 256 sectors of 512 bytes in each 128 K byte erase block of the memory module. The memory module may comprise a multiplicity of erase blocks.

A 512 byte data block may thus be written to sectors A11, A21, A31, A41, and the parity sector Ap may be updated by computing an exclusive-OR on the data arrays A1, A2, A3, and A4. When writing the data to sectors A11, A21, A31 and A41, the data contained in, for example, sectors A12-A1$n$ of memory module 0 may also be written. This may arise as the data in data array A1 may need to be erased prior to recording changed or new data in sector A11. An example of this operation may include reading the data array A1 into a non-persistent memory device, erasing the memory associated with data array A1 in memory module 0, changing the data in sector A11 of the data of array A1 in memory module 0, and then writing the data of array A1 from the non-persistent memory to memory module 0. This represents an example of the operations which may be performed in the process of changing the data being stored in a FLASH memory. Housekeeping operations of a FLASH memory system will not be described herein. Such housekeeping operations may include checking for bad blocks, wear leveling, consolidating data to reclaim memory locations ("garbage collection"), error detection and correction, and the like. Such operations may be considered as overhead, and result in a reduction in the capacity or the bandwidth of the system for reading or writing, and also increase the latency time. The operation of the FLASH memory in the examples herein is being described at a macroscopic level, where any internal operation that is substantially transparent to the user is presumed to occur without further description. However, when a restriction of a read or a write operation of the memory is asserted, the housekeeping operations may generally conform to the restrictions on external reading or writing, but may be given priority in their execution, if necessary, during the time intervals where they are permitted. Internal operations that may be needed to effect an external command, such as "read" or "write" may be performed during the periods allocated to read and write, even though such operations may be a combination of read and write internal operations. This should not be interpreted to exclude housekeeping operations being performed at any time, preferably where the housekeeping operation can be interrupted so as to effect the requirements of a user. In an aspect, housekeeping operations requiring reading of data may be performed on a memory circuit where external read operations are temporarily inhibited.

In an example, using presently available single-level-cell (SLC) NAND FLASH memory components, the data transfer inside the FLASH chip of 2 K bytes between the FLASH memory and the internal data register may take about 25 µsec for a read operation. Transferring 512 bytes of data from the internal register to the device controlling the FLASH may take about 20 µsec at a speed of 25 MB/s on the bus used to access the FLASH chip by a controller on the memory module, for a total time of about 45 µsec. However, the time to perform an erase of a 128 KB erase block of the FLASH so that new data can be written may take from about 1 msec to about 2 msec, which is about 20 to 40 times as long as the time to perform a read operation. Performing a program (write) operation of the FLASH can take about 20 µsec to transfer 512 bytes of data on the bus into the internal register of the FLASH chip and about 200 µsec to about 700 µsec to program the data into a sector of the FLASH memory, which is about 5 to 15 times as long as it takes to perform a read operation. Erasing a 128 K block and programming the 128 K block may take from about 13 msec to about 42 msec, or about 200 to 800 times as long as to perform a read operation. During the time period that the memory module is engaged in the erasing or programming (writing) operations, the memory module may not be able to perform other functions such as reading data from any of the other sectors A12 through A1$n$, if the data which is desired to be read resides on the same device of the module which is being erased or programmed. So, for a time period, reading operations for what may be unrelated data also stored in the same memory array block A1 may be precluded (inhibited) when a write (program) operation or an erase operation is in progress when a read request is received. In many data base systems such a delay, which may be termed latency, may not be desirable and may be unacceptable. The time delay may become comparable to the time delays encountered in disk storage media.

The example for SLC uses particular time periods for execution of various commands. These are typical of current production devices, and may be expect to evolve in the future, but to faster or slower times, depending on the development objectives. For example, multi-level-cell (MLC) FLASH technology typically has longer time periods for execution of commands, while providing a greater spatial memory density.

In a situation where the asymmetry between the read operation time and the write operation time for a data sector is intended to result in more rapid reading of the data than the writing of the data, the action of writing a block of 2 K bytes, striped across 4 memory modules and a parity module, may result in a blockage of reading operations in which up to 10 K to 30 K of data could have been read during the write operation period. Similarly, an erase operation could block the reading operations for about 80K to 160K of data.

This situation may be mitigated by an operation of the memory controller and memory modules so that the data is written in one or more sectors of 512 bytes to each of the memory modules A1, A2, A3, A4 and Ap in sequence rather than in parallel. Thus, the write operation for array A1 is permitted to complete before starting the write operation for A2, and similarly, the write operation for A2 is permitted to complete before starting the write operation for A3. This continues until all of the memory modules in the stripe A, including the computation and writing of parity to module Ap, is completed. During the time that each of the module of the modules containing data arrays A1, A2, A3 and Ap is being written, the specific data array associated with the module cannot be read. However, in this example, only one of the modules A1, A2, A3, A3 and Ap may perform a write operation at any one time.

When a read command is issued, for example, for 512 bytes of data stored in modules A11, A21, A31, A41 and Ap, each of the memory modules may receive the read request. The memory modules may be in a state where a read request may be promptly processed and the data returned to the memory controller. However, when a write (or erase) command is being processed by a memory module, the data may not be readable from the memory module immediately, and thus one of the responses from data arrays A1, A2, A3, A4 or Ap may be substantially delayed. In the circumstance where the module Ap is used for data recovery purposes only, the module Ap may not be read unless there is a memory failure. Since typical memory management hardware or software expects to have responses from all of appropriate memory modules A1-A4, the completion of the response may delayed, if one or more of the memory modules is being written to, either due to an external command or housekeeping operations.

However, in the situation where there are 4 memory modules containing data, and one memory module containing parity data, only 4 of the 5 modules may need to return data in order that the desired data be recovered. That is, one of the data modules may be failed, or may report an unrecoverable error, or be blocked by a write or erase operation. For example, if the data module not returning data is A2, the remaining data modules may be A1, A3, A4 and Ap, in which case the desired 512 bytes have been retrieved. Where the missing data is from one of the modules, A1, A2, A3 and A4, the data from module Ap, being parity data, may be used to recover the data of the missing or delayed response module.

When the data stored in memory module A1 is read, for example, the data may verified using an error correcting code, whose data ECC1 may be stored in the same memory module as the data. If the read data is correct, then no action need be taken. If an error is detected, the error may be corrected, the number of errors capable of being detected or corrected being a characteristic of the particular error correcting code (ECC) being used. As returned to the memory controller, the data being read is either correct, or has been corrected by the ECC, or marked as being in error where the ECC has been able to detect the error(s), but not able to correct the error.

Typically, in a FLASH memory system, either a single error occurs due to the wear-out phenomenon, or the memory module has a larger-scale hardware failure which results in multiple errors of a type that can be detected by the memory controller. The memory module may become inoperative.

In the situation where a single error is reported, but the error is corrected by the ECC, the occurrence of an error may be reported to the memory controller or other hardware or software used to manage the FLASH memory system, including on-chip memory management, and the memory module or a specific chip or data block may be marked as being defective, or monitored for further correctable errors. The memory management algorithm may determine that a memory module or chip may no longer be used for data storage. The data presently being stored in the memory module or chip will be moved to another memory location that is not marked as defective.

Alternatively, when an entire memory module is defective, for example due to a larger scale hardware failure, the data from one of the data arrays A1, A2, A3, A4 will be absent or determined to be in error. The data from the Ap may be used to reconstruct the data of the failed module, and the reconstructed data stored in a module that is not marked defective. Alternatively, if Ap is in error, then the data from data arrays A1, A2, A3, A4 may be used to reconstruct Ap. The data integrity is thus maintained even when a large scale hardware failure occurs.

In the cases where the data is known to be correct, or had had an error corrected by the ECC, the desired data may be available to the memory controller when the data from module containing arrays any four of the five memory modules A1, A2, A3 and A4 and Ap have been returned. For example, the data from memory modules A1, A2, A3 and A4 may be received. The data from the module containing Ap is then redundant as it is not needed either to determine the correctness of the data in the desired data, or necessary to correct an error. In a situation where any one of the modules having the data arrays A1, A2, A3 or A4 does not return data, or returns data that is known to be incorrect, or the data is delayed, the data from module Ap may be used to reconstruct the missing data, using the parity data in Ap and the remaining three data arrays. When the term "does not return data" is used, the criteria may be, for example, that the data is not returned within a particular time period, which would be typical of a read operation. The longer time to return data may be due to an interfering write or erase operation, or due to a hardware fault. The data from the module that "does not return data" may be either allowed to be returned at a later time, or the read operation for that module cancelled. In any event, the time to retrieve the data from a data stripe may not therefore be prolonged by a module failing to return data within a reasonable time frame.

Hence, in an arrangement of memory modules, where one of the memory modules is used for redundant data (for example, parity data), not all of the memory modules need return valid data before the requested data is available, or the data can be reconstructed. That is, for example, the requested data is available when the data from modules A1, A2, A3 and Ap has been read. Data from A4 is may not be needed.

A reason that the data from A4 may not be available, or not be available in a timely manner, is that data is being written to some sector of A4, and this may delay the reading of data from the block being written or a block is being erased, and the read operation on other blocks is being inhibited due to the access characteristics of the memory device. Data from 4 of the 5 memory modules are available at a time after receipt of a read request that is characteristic of the read tithe. The data from the $5^{th}$ module may be available in a timely manner, providing that a write operation is not in progress, but data from the $5^{th}$ module may be ignored, except in the case of an uncorrected error. When the data is substantially delayed, the delayed data is redundant data and may be ignored in the routine processing of the data in the memory controller.

In an aspect, in a configuration of 5 modules, at least one module having parity data for a stripe stored on the other 4 modules, read commands may be issued only to four memory modules (locations) that are known to be capable of reading data immediately. The fifth read command may be omitted. However, there are circumstances where the fifth read command may be issued, even if the data from the fifth module may not be intended to be used under ordinary circumstances. Such a command may be explicitly cancelled, or cancelled at any level in the memory system, when a time-out interval is exceeded. Such a pending read command may preserve data from being erased during the interval between determining that an error exists in the previously retrieved data and the time that a request for the fifth data block to be used in reconstruction can be acted upon.

In an aspect, read commands may be issued only to memory modules that, due to a sequential writing or erasing constraint or some other constraint, are known to be capable of reading data immediately. The other read commands may be omitted. However, there are circumstances where if the data from the other modules may not be intended to be used under ordinary circumstances instead of the another read command being issued a preserve command may be issued. Such a command may be explicitly cancelled or cancelled at any level in the memory system, when a time-out interval is exceeded. Such a pending command may preserve data from being erased during the interval between determining that an error exists in the previously retrieved data and the time that a request for the another data block that may be used in reconstruction can be acted upon. The preserve command may serve to prevent the erasure or loss of data by any of a number of methods.

In the event of a subsequent write command to an address which is the subject of a preserve command the module may read the existing data before writing the new data. In an aspect, the module may track the location of the old data before writing the new data to a new location, thus retaining the ability to read the old data if needed. The preserve command could cause the following write command to the same address to be delayed until the preserve command is cancelled or times out. To retrieve the data protected by the preserve command a special read command would be used to retrieve the old preserved data for a given address as opposed to the most recently written value of an address. It is possible following a sequence of reads and writes to an address that there may be multiple outstanding preserve commands for a single address and that some of the data that they preserve may be stored in volatile memory having not yet been committed to non-volatile storage.

Therefore, for example, data from any 4 of the 5 memory modules in a stripe may be used to read the data stored in the stripe, with a low latency, since the reading of data 4 of the 5 modules is unimpeded by a write operation to the 4 of the 5 modules that are being read.

The process of managing memory in a memory system where the read and write times are asymmetrical, and the write time is substantially longer than the read time may include: writing the data to a plurality of memory modules, the memory modules being organized logically in a stripe pattern. Each of the memory modules may have an error correcting code with respect to the data in the memory module, and an additional memory module may have an error correcting code (e.g. XOR parity) with respect to the data in the plurality of modules. Write or erase operations may be performed by, for example, sequentially writing or erasing data to each of the memory modules, the writing or erasing operation to each successive module being delayed until the completion of the write operation to the pervious memory module. On completion of the write or erase operation to each of the memory module, the redundant data in the additional module is updated so that the data integrity is maintained. Thus only one memory module at a time may be in a write state. Alternatively, the redundant data may be updated in a non-persistent storage until the writing or erasing of the data-containing modules is completed, and the data is then written to the additional module. The non-persistent storage may be local to the module or more global.

When write or erase operations are conducted to memory modules in a stripe in a sequential manner, only one of the memory modules in the stripe is blocked from reading data immediately in response to a read request and, in this example, at least 4 of the 5 memory modules will promptly return data to the memory controller. This is sufficient to complete the read operation, using the parity data when appropriate. As such, the read operation is not delayed by a write or erase operation, although the overall speed of write or erase operations may be reduced, depending of the time-line loading and mix of operations, since only one module associated with a stripe may be in a write or erase state at a time. The substantially non-overlapping period of time for the writing of the data to memory modules minimizes the conflicts between reading and writing operations for a data stripe.

The memory controller may wait a period of time for the read operation to complete, and then use the at least 4 of the 5 responses to assemble the requested data sector, being the data or the reconstructed data. Should all 5 of the data blocks be returned, either one data block may be ignored, or the redundant data may be used as an additional error detection step, depending on the level of data confidence desired in the design.

The term memory module is used in a generic sense, and a physical memory module may have a plurality of memory devices, such as a FLASH chip, each one of which may have the characteristics of a "memory module." Thus, the sequential operation of memory devices to perform the write operations, even if such memory devices are in a higher level memory module is practical.

The descriptions herein usually use five memory modules as an example, where four of the memory modules store the data and a fifth memory module stores the parity. But, more or less than four memory modules may be used for data storage, and more than one memory module may be used as storage for the parity data associated with the other memory modules. Whether a memory module contains data, parity data, or a combination of the two is not intended to be a constraint.

The writing of data may be a priority in an initial population of data, for example, in a previously unused memory system, and the data may be written to a plurality of memory modules in a stripe in parallel. In these circumstances, the reading of data may be delayed as previously described, however this may be acceptable when initializing large arrays or moving large blocks of data. In the present example, the data writing speed is about 20 percent of the maximum writing speed, as each of the 5 memory modules is written sequentially, while the read speed is no longer than approximately the expected read speed for a single module, since 4 of the 5 memory modules need to respond for a successful read. The write blockage may be managed as the write load increases.

Figure 4A:
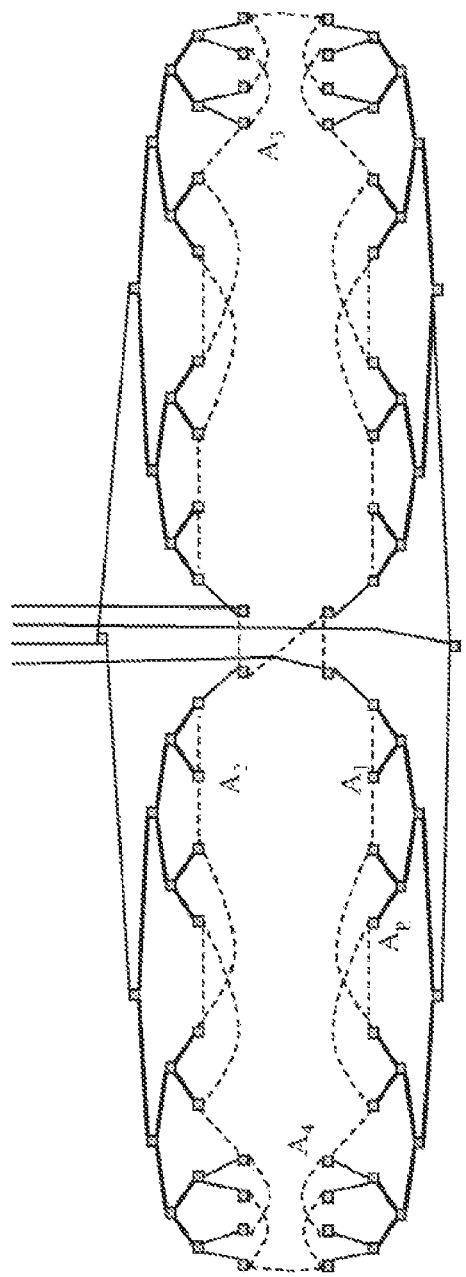
FIG. 4A illustrates an arrangement of memory modules arranged in a tree architecture, where the memory modules in a logical data stripe are located at leaves at the end of branches.

In another example, the organization of the memory array may be other than a row and column matrix as in the previous example. The row and column designation of the data described above may be understood, for example, as a logical address and the logical address mapped to a physical address. In the memory architecture of FIG. 4, the memory modules are organized in a tree, as taught by the present inventor in U.S. patent application Ser. No. 11/405,083, filed on Apr. 17, 2006, entitled "Interconnection System", and which is incorporated herein by reference. In the arrangement of the present example, tree-like structures are may be interconnected and have external connections to one or more memory controllers. An attribute of the tree system as shown in FIG. 4A is that any of the memory modules (shown by the square boxes) may be accessed by at least one of the memory controllers, even if one of the memory modules has completely failed, if any of the physical links had been broken, or if one of the memory controllers had failed. As such, the individual memory modules M may be assigned to data arrays A, without detailed regard to the physical position of the memory module in the system. (In this example, the memory module designations M are replaced with the associated data array designations A, for simplicity). The tree architecture may be adapted to contain a large number of memory modules, each module may be relatively near to a root, in terms of the distance that signals may have to travel, when compared with linear architectures having a similar number of memory modules and memory controllers.

As an example, the data arrays A are shown in one example of an assignment thereof to physical modules of the memory system of FIG. 4A, it being understood that this is one of a large number of possible assignments. The assignment of data arrays to memory modules may be changed to account for the failure of one or more memory modules without having a significant effect on latency time or other performance measures. An attribute of a tree memory system with a redundant interconnection architecture is that individual memory modules may be replaced while the memory system is in operation. This may be termed "hot swapping"

Figure 4B:
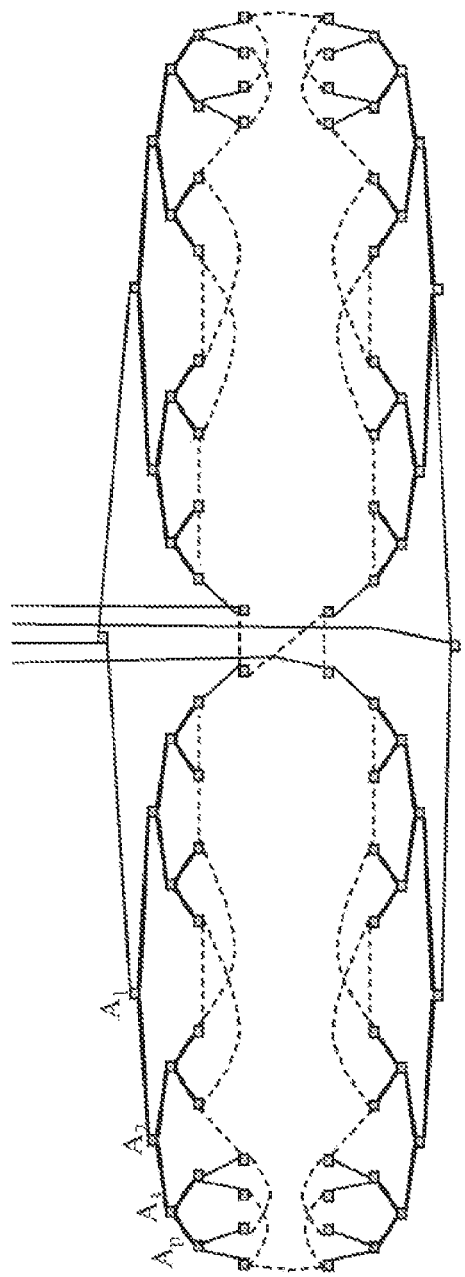
FIG. 4B illustrates an arrangement of memory module as in FIG. 4A, where the memory modules in a logical data stripe are located in a branch.

FIG. 4B illustrates another possible assignment of the data arrays A1, A2, A3, A4 and Ap to different physical memory modules in the memory architecture of FIG. 4A. Here, the modules are selected to be close to each other, and using the same, or part of the same data path between the memory modules and one of the memory controllers. Should either the memory controller or one of the memory modules fail, the alternative paths (some of which are shown as dashed lines) would be used to connect the memory modules to the original controller or an alternative controller. As such, the association of a logical representation of the data array A with a physical memory module is flexible. Re-designating any part of the data array A with respect to the location in the memory system is a change to the logical-to-physical mapping and data routing, and is usually limited only by the availability of a physical memory module and not by the location of the memory module in the memory system.

When a memory module fails and needs to be eventually replaced, the possibility exists that a second failure may occur during the single-failure time period. The failure mechanism of a memory module may be divided into a wear-out mechanism and a conventional electronic circuit mechanism. The latter is dependent on the total time of operation, and the former is dependent on the usage of the memory module. Wear-out failure is gradual, with a correctable single bit failure as the initial failure. In such a case, the probability of a second module failing while the first module is being replaced may be estimated to be of the order of the inverse of the MTBF of the memory system, divided by the number of hours required to replace the failed memory. Similarly, if the cause is electrical, then the wear-out failure is unlikely to cause a failure during the short time that is required to replace a failed memory module, and the probability of a second failure is similarly small. As the system described is RAID 4, loss of data occurs if a overlapping-in-time failure two of the memory modules of the 5 memory modules containing an array of data and parity occurs prior to repair or rebuilding of the RAID stripe.

An error mechanism of FLASH memories is such that a wear-out phenomenon occurs, resulting in an error state. The wear out mechanism may differ between the various types of FLASH memories and the manufacturing technologies used by individual manufacturers. However, as the wear out of the FLASH memory results in equipment failure, system down time, and possible loss of data integrity, a variety of strategies for managing the wear of FLASH memories have been developed. Often the number of write or erase cycles of each block of data is recorded, and as the number of write cycles increases, data may be moved from a high-usage area to a low-usage area so as to extend the lifetime of the memory module. The characteristic failure mode of a FLASH memory module due to wear out, is that a single bit will be in error. That bit will tend to remain as an error in repeated read operations, until a second bit also exhibits an error. Since the error correcting codes (ECC) that may be used have the capability of detecting and correcting a single error and detecting, but may not be capable not correcting, for example, a double error, the memory module may continue to be used until a two bit error occurs. When a two bit error is encountered, the redundant parity data is needed to reconstruct the desired data. Thus, alternative system management policies may be used.

In a first policy, the memory module may be marked as unusable when a single bit error is encountered. Since the single bit error is corrected by the ECC associated with the memory module, the redundant data (for example the parity data) associated with the stripe need not be used. Since only 4 of the 5 modules of the previous example would suffice to represent the desired data, and the read operation is not delayed by waiting for the completion of a write operation. Alternatively, the memory module may continue to be used until a second bit error is detected in the data array of a memory module. In this circumstance the redundant (parity) data may used to reconstruct the data, if the error occurred in a memory module other than that containing the redundant data.

When compared with a disk system using multiple disks, a solid state memory system may access data arrays stored in a plurality of memory modules with substantially less interference between read and write or erase operations or between multiple operations of the same type.

Figure 5:
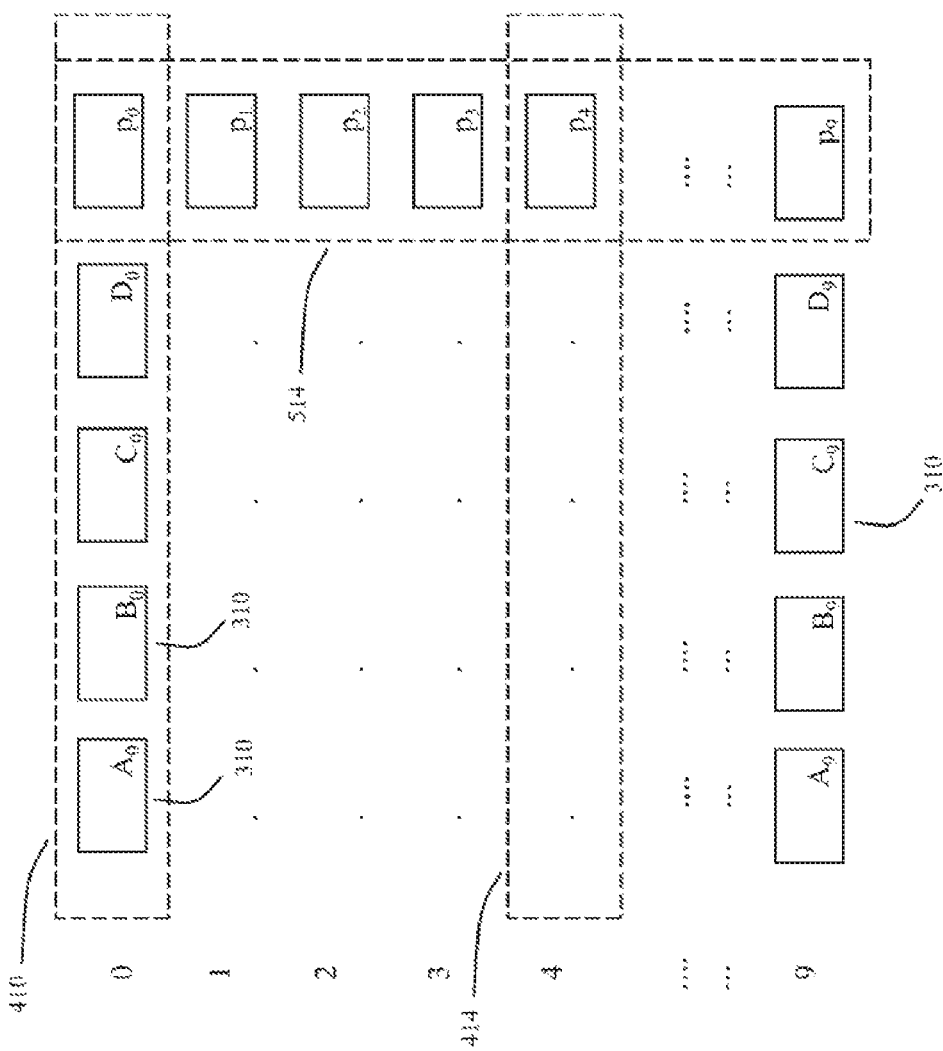
FIG. 5 is a schematic arrangement of the data in a RAID memory.

In another example, shown in FIG. 5, the management of a two dimensional array of data is shown. As previously mentioned, when the RAID-4 system was operated such that only one of the five, memory modules A1-Ap was permitted to be in a write mode at any time, the four remaining of the memory modules promptly return data so that the latency for a read operation is not compromised for a write load of 20 percent or less. This situation contrasts with a system not having this constraint on the sequence of write operations, where the interference between read and write operations begins at a very low write load.

However, there may be situations where the write load is desired to be greater than 20 percent of the time line, yet the read latency is still desired to be as small as possible consistent with this situation. This may be accommodated by the management of the write operation over groups of stripes.

In describing the operation of this and other examples, the loading and response times of the memory module and system are varied so as to explain the principle of operation. For convenience, the time distribution of read and write requests is presumed to be uniform in time, at the average rate corresponds to a read or a write load. Also, even over a short period of time, the loading is considered as a steady state value, for simplicity of explanation. The limitations of bus bandwidth and the like are also ignored as, generally, the latency and response times of the memory modules is fairly long compared with the latency associated with bus transit time. Moreover, as various data areas in a memory system may experience different read and write loads due to, amongst other factors, the type of data stored, the application program accessing the data, virtualization, and the like, the loading may vary at different stripes in the memory system, and the situation described may be considered to represent a local loading value rather than a global loading value. As such, the adaptation of the memory management may be on a local rather than a global basis. Coordination of operations, where needed, may be effected by a global or a local timing algorithm, passing of tokens, polling, signaling, or the like, or other methods of coordinating temporal operations in a computer or memory system.

The data in FIG. 5 is shown as organized in stripes, and a $0^{th}$ stripe 410 comprises memory modules 310 (or, for example, chips) A0, B0 C0, D0 and P0, arranged in columns A, B, C, D, and P respectively. The remaining stripes of the system, 2-9, are similar, so as to form a memory system of 50 modules.

Figure 6A:
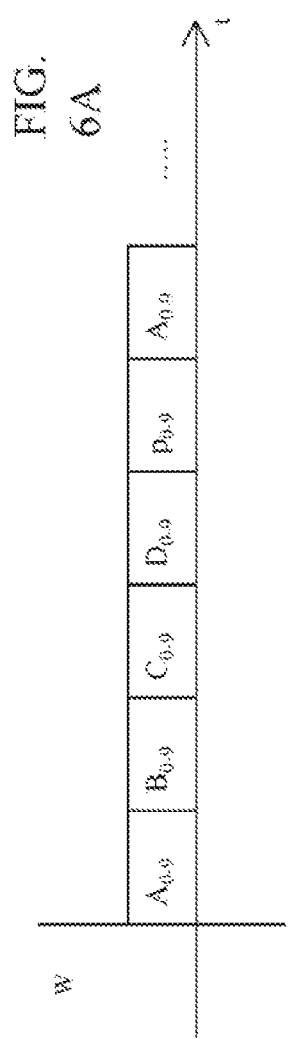
FIG. 6A shows the time sequence of write operations for a RAID stripe.
Figure 6B:
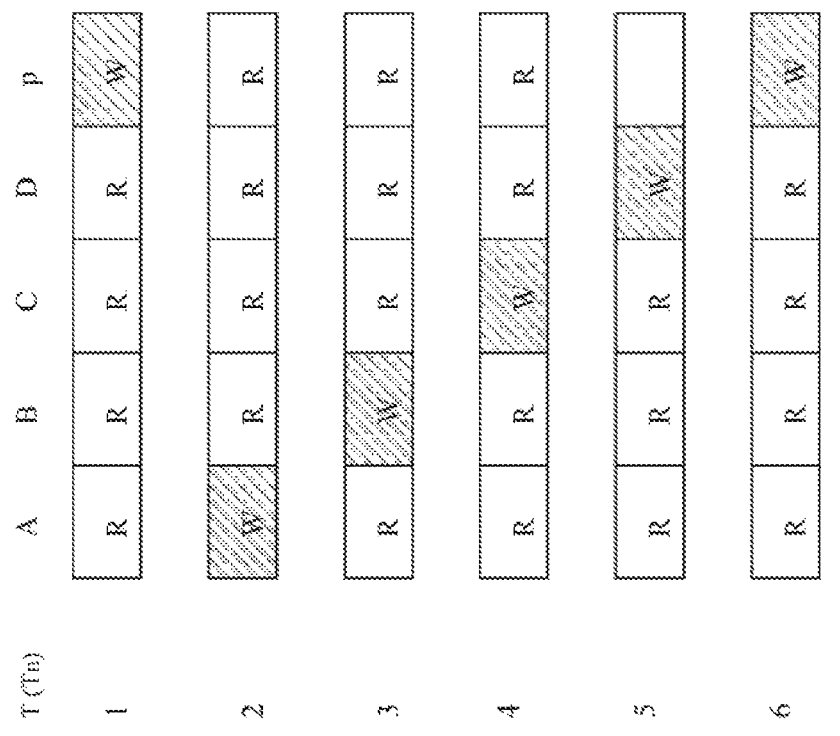

For purposes of explanation, a timing circuit on each memory module may be considered to have been initialized at the same time as on the other memory circuits, and marks time in intervals of, for example, 1 msec, which may corresponds to a time sufficient to complete at least one write or erase operation. Such write or erase operations are performed one column at a time in successive time intervals. FIG. 6A shows columns 514 of the memory modules being enable for writing operation in successive time intervals $t_1$, $t_2$, ... $t_{10}$, and which repeat, modulo 10. As shown in FIG. 6B, where a time history of stripe 0 is shown, it may be seen that a single memory module is enabled for a write operation at any time period. This satisfies the criterion that 4 of the 5 memory modules in a stripe be available for a read operation at any time. This results in a latency that may be dependent only on the read latency with no write-load influence.

When the write load-exceeds 20 percent, this strategy is not able to keep up with the amount of data that is desired to be written, or the erase requirements. Additional write periods may need to be allocated. To the extent that they are allocated as needed, more than one memory module of a stripe may be in a write, state at the time of a read request. As such, 4 of the 5 memory modules cannot promptly respond to the read request, and the read latency increases from a very small value (tens of microseconds) to at least about 1 msec, corresponding to the duration of the write or erase state.

When discussing latency, and with a uniform arrival rate of requests, the actual mean latency is one half of the duration of the blockage due to the write state (For simplicity, typically the term "write state" and the term "erase state" should be understood to represent a period of time where read operations are blocked, and both terms will not be used repetitively in combination so as to simplify the discussion). Typically, the duration of the write state is used, and this would correspond to the maximum latency.

As the write load increases, the number of memory modules in a stripe that are in the write state at any time may increase, and the latency may rise to the sum of the delays associated with the write states of the strip, perhaps to about 4 msec.

However, the maximum value of the write state under high write load may be limited to 1 msec, if all of the memory modules in a stripe 410 are caused to be in a write state at the same time. For example, when the write load exceeds 20%, in this example, but is less than 28%, each stripe may also be enabled for a write operation every 10 time intervals. As such, in addition to a column (for example P in FIG. 5) a stripe 410 (stripe 0) may be enabled for the duration of the first time interval. In this strategy, all of the stripes are written to simultaneously, so that the total write time blockage is limited to 1 msec. As the write load increases, additional time intervals may be allocated for stripe writes. In particular, the strategy may space the stripe writes as far apart as possible in time. That is, the next increment may use both the first and the fifth time interval of a modulo 10 repetition.

The write load for the memory modules in a stripe may be expected to be about the same during any epoch as, if at least pages are written, a write to one memory module would result in writing to all of the memory modules in the stripe. Nevertheless, there will be differences in the write load, which may be due to writes of less than a page, or due to the housekeeping activities, which depend on the particular memory chips (due to bad blocks and the like).

A memory module 310, as shown in FIG. 7 may include, for example, persistent memory 320, which may be FLASH memory, a buffer memory 330, which may be, for example, DRAM, and a controller/bus interface 340, which may be a configurable switching element (CSE) such as described in U.S. application Ser. No. 11/405,083, or other bus interface. The memory module may be capable of buffering input and output data and command, so that a memory module may maintain a queue of pending operations.

Operations that conflict with low latency read operations, may be restricted to the time intervals designated for write operations. When a memory module timing slot permits a write operation, as many write or erase operations as may be performed in the time duration of the slot may be de-queued from a queue maintained in the controller 340, or elsewhere, and performed. However, if there are no pending write or erase operations, pending read operations may be de-queued from the queue in the controller 340 or, for example, the module and performed.

Alternatively, there may be write or erase operations remaining Depending on the operating policy programmed, when additional write operations remain, this is taken as an indication that the write load has exceeded 20%, and that additional write periods may need to be allocated. Either the main memory controller may be notified so as to throttle write operations to the stripe, or additional time slots may be allocated to the write operation, until the queue is reduced to a nominal level, which may be either zero or a small number of pending operations. On a global allocation basis, the write operations may be directed to memory modules that do not currently have a high write load. When allocating time slots to the write process, the time slots are spaced apart during the modulo-10 repetition of the pattern for the example described. As the write load increases and more write slots are needed, they become spaced closer together, however, a slot is left between successive writes for as long as possible. In this manner, the total length of any write blockage of a read request is minimized as the write load increases, and for less than about a 50% write load, the maximum blockage may be only one write period. The time line available for reads is correspondingly reduced; however, high read loads and high write loads to the same stripe are likely to be transient in nature and have a small impact on overall system response time.

The policy of allocating additional write-time blocks depending on a local queue, permits the adaptation of the operation of each stripe to the read and write demands imposed by the dynamic operation of the system.

In another aspect, when the individual modules in a stripe communicate with each other, for example, using a token passing construct, the token may represent a permission to perform a write interval. The token may be passed between the memory modules A-P of a stripe (for example, stripe 1) in sequence. When the token is held by A1, a write interval of, one write interval, which in this example is 1 msec, is permitted. If there are write operations in the queue, those write operations which may be completed within that interval are executed. The token is then passed to B1 where the process is repeated; the token is continually passed, and when P1 has the token it is passed to A1, so that a round robin is performed.

Where write operations remain pending after completion of the write interval, this is an indication that the current write load exceeds the 20% value for which the read latency is transparent to writing. Absent other means of limiting the write load, the pending writes may have to be executed in the near future so as to avoid overflow of the buffer memory 330. In this circumstance, another write operation is performed after the token has been passed, which may allow at least one time interval between write intervals. The number of write intervals used during any round robin may thus vary with the write load, but the number of consecutive write intervals may be unity until the write load has become very high.

The allocation of time periods in which memory modules may perform their erase or program (write) operations may be done in any number of ways: for example, allocating time periods with respect to a global reference time so that modules operate with local determination of the period of time, by the transmission of a control messages from a global controller, by token passing from module-to-module, by command buses or wires between the modules, or the like. A combination of approaches may be used: for example, in a system where when the desired programming data rate was greater than could be satisfied by having a single column of the RAID group performing programming at one time, and there were multiple RAID groups, then one module of some or all RAID groups may be programming or erasing while, at the same time for some number of RAID groups, more than one or all modules are programming or erasing as shown in FIG. 5. In such a system, for example, the column which may perform an erase or program may be determined by a fixed allocation of time periods, while the determination of when an entire row or RAID group may perform an erase or program operation may be determined by one of the modules in a RAID group sending a command to the next RAID group indicating the next RAID group can start, a form of token passing, and the module may have determined that all modules in its RAID group had completed their program or erase operation by use of a second token passing scheme, or a 'pull down' wire that all modules hold until they are done, or a command bus the other modules use to indicate they are done, or a similar method or configuration.

Where all time periods are non-overlapping then the latency effects of the erase or program operations may be completely hidden; where the time periods are only substantially non-overlapping the erase or program operation latency may be observable up to the time duration of the overlap. As long as the amount of time overlap is less than 100% then the apparatus and method may still result in reduced access time latency where compared with a fully overlapped erase and program operations.

As shown in FIG. 5, where some RAID groups perform a program or erase operation across more than one module, or all the modules in the group, the non-overlapping times are those of one RAID group with respect to the next RAID group, rather than from one module in a RAID group to the next module.

The latency improvement here is not that of a single read access but if, for example, there are read accesses being made to all RAID groups, then only those accesses to RAID groups where more than one module is programming or erasing will experience increased latency, while accesses to those RAID groups only programming or erasing one module will not experience such an increase. As a result, the average latency over all the read accesses may be improved.

The approach may be applied to FLASH memory in other configurations, which may be removable or fixed. The approach described herein may be performed within a module itself providing that the module had a sufficient number of FLASH devices. The approach may thus be used independently at multiple levels in a memory architecture; for example, in Solid State Disks (SSD) in the form factor of a presently used standard hard drive interconnected by a disk access protocol such as SATA, SCSI, Fibre Channel, or other form factors or access protocols that are known or which may be developed. The correspondence between RAID groups and modules is such that there may not be a one-to-one correspondence of modules and "columns" of a RAID group. For example, where a "column" of a RAID group may be spread across more than one module, or where due to RAID reconstruction the data on a module may be in the process of being moved to a replacement module and, for some period of time, more than one module may contain a "column" of the RAID group, In another aspect, a RAID-6 organization may be superimposed on the RAID-4/5 where another parity computation is made on the columns of the data array. Alternatively, the additional parity computation may be made on the memory modules considered as a physical configuration. That is, without regard to the allocation of memory modules to stripes, the data in a column of a linear array of modules may be XORed so as to compute parity data. This may also be done in the case of a binary tree such as shown in FIG. 4A or 4B. For example, the data from the two memory modules in the tree may be XORed when received at the next higher level in the tree to create first parity data. Similarly this parity block may be XORed with the data at the receiving module to create a new parity block. As this is a binary tree, the two new parity blocks may be transmitted from their respective nodes to the next higher physical node in the tree, where the process of XORing may be again performed, and so on until the root of the tree, or some other higher level node is reached. This parity data may be used similarly to the column parity of a RAID-6 system so as to provide additional parity data in the event of a failure of more than one module. The propagation of the XOR parity data is limited to the amount of data needed for the data block itself at any level of the tree, and may be performed without a substantial bus load, and with the computations associated with the computation of XOR parity distributed over the memory modules in a substantially even manner.

Where the term memory module is used, the memory module may be, for example, a pluggable circuit card with a plurality of memory circuits thereon, or the memory module may be each one of, or a group of, memory circuits on the circuit card, or what is known as a Solid State Disk (SSD); SSDs come in many form factors, from individual cards to packages that may conform to the size and shape of a presently standardized mechanical disk drive which they may be intended to supplant. The scale size of the logical address range that may be associated with a memory module or storage location is not intended to be limited by the description herein, and a memory module may thus encompass both larger and smaller data storage devices or data structures.

Figure 8:
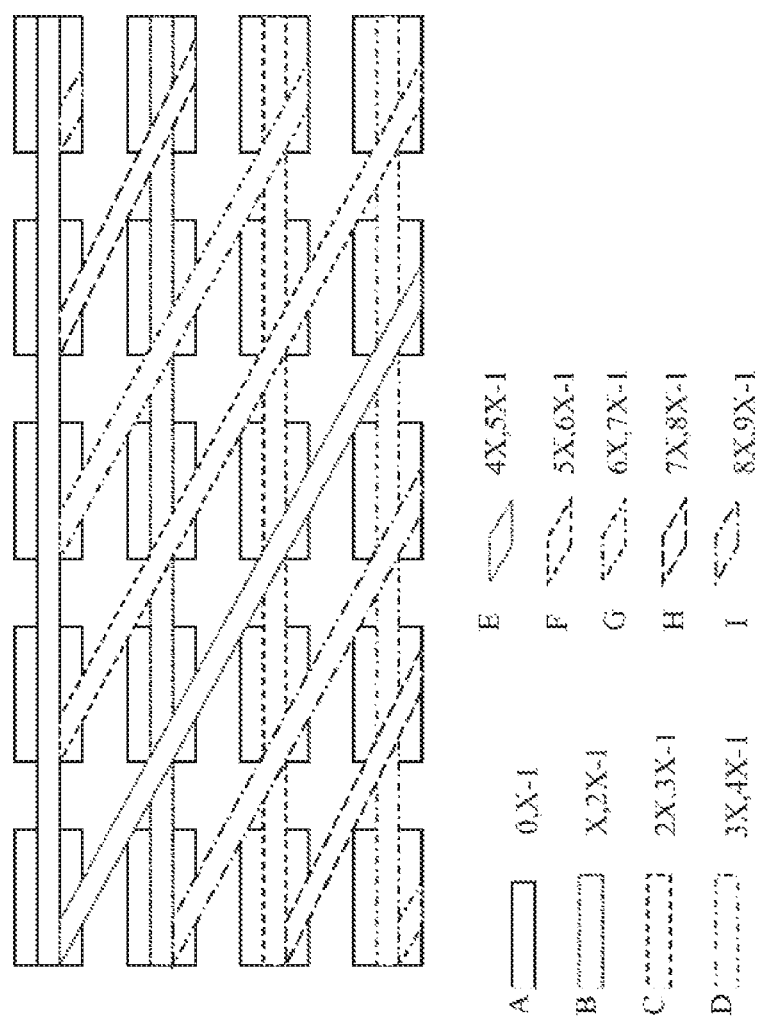
FIG. 8 shows a group of memory modules where each module belongs to more than one raid group, and the raid groups are striped in different ways across the modules.
Figure 9:
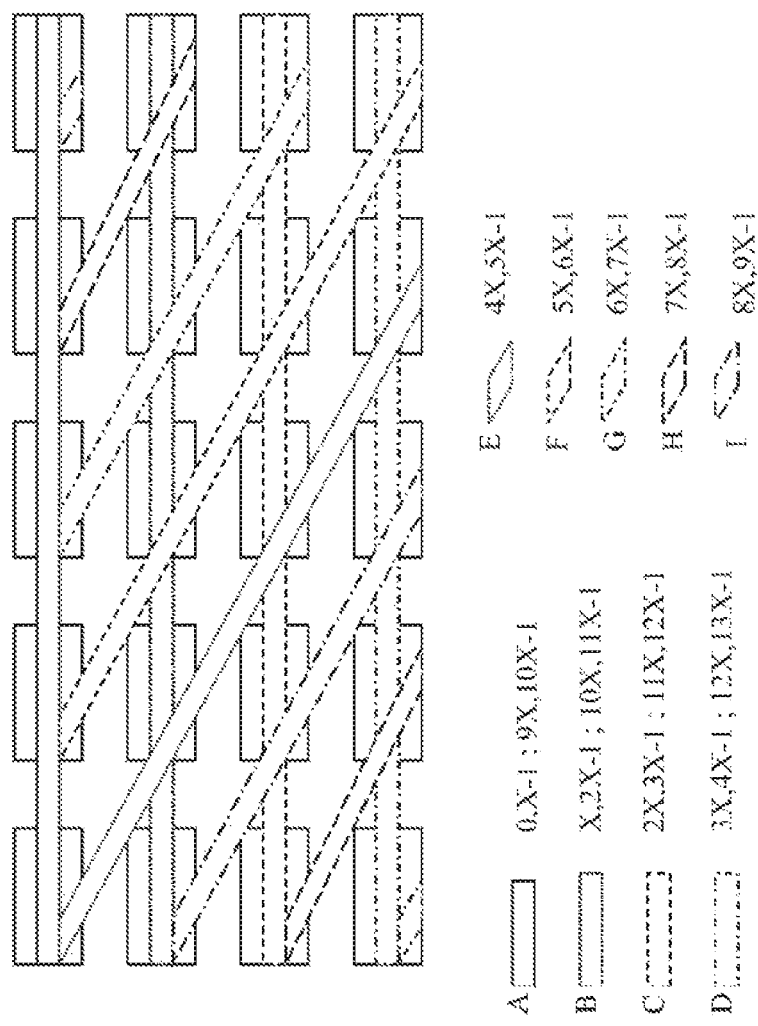
FIG. 9 shows a RAID arrangement where the sequence of addresses in a group may not be contiguous.

As an example FIG. 8 shows a group of modules where not only does each module belong to more than one RAID group, but the RAID groups are striped in different ways across the modules. For example, RAID groups A, B, C, D are stripped horizontally, with each stripe containing X addresses, stripe A has addresses 0 to X−1, B has X to 2X−1, as so on, while groups E, F, G, H, I are stripped diagonally, each group also containing X addresses. FIG. 9 shows that the number of addresses in a group need not be contiguous, or identical to other groups. In this example, after the last address in group 1 the addressing wraps around to start with group A, which has address 0 to X−1 and 9X to 10X−1.

While FIGS. 8 and 9 show layouts that are uniform and regular, there is no requirement that the RAID stripes be regular or uniform, as an example the ZFS file system makes every piece of data written its own RAID stripe which may be placed on any set of modules in a storage system as described herein.

In an aspect, the data of a RAID stripe may be divided into a plurality of groups of data. A parity pattern is computed as the exclusive-OR (XOR) of the plurality of groups of data. The groups of data and the parity are written to a RAID stripe. The parity data may be distributed amongst the memory modules of the RAID stripe, or written to a memory module of the RAID stripe separate from the data. When the RAID stripe is read, and the RAID stripe has M memory modules, the data from the first M−1 memory modules to be received by the memory controller may be used to determine the data that has been stored in the RAID stripe has been read. When the memory modules of a RAID stripe are managed such that a write or erase operation can be performed on only one of the modules at a time, a read operation sufficient to recover the stored data may be performed without waiting for the completion of any write or erase operation.

In another aspect, the arrangement of stripes in a memory system may be selected in accordance with a policy that optimizes one or more aspects of the performance of the system, such as latency, read or write speed, failure tolerance or the like. The next examples are described in terms of the assignment of logical address ranges to physical memory modules so as to create a plurality of different stripe characteristics. The allocation of logical addresses to physical addresses in a memory module may be performed by policies that emphasize different characteristics of system performance, such as garbage collection, error detection and the like. However, in establishing these policies, the organization of the memory circuits may mimic the organization of memory modules at a higher level of the system so as to achieve similar goals. Again, the level in the hierarchy at which the logical-to-physical addressing conversion takes place is not restricted by this discussion.

Figure 10:
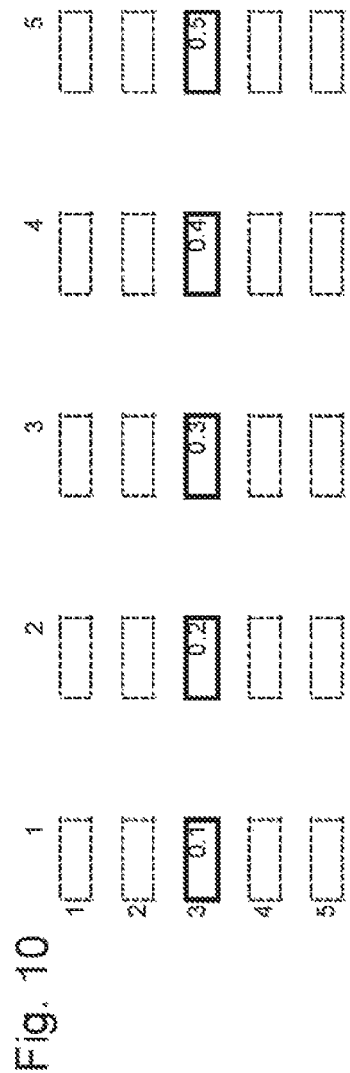
FIG. 10 shows a logical address space of dimension 5×5 and a stripe of length 5, oriented with a slope of 0 (rows per column)

The appearance of a stripe in an array of logical addresses may be such that the assignment of a stripe to logical address ranges is ordered in a column and row approach, such as shown in FIG. 10. Such an arrangement may be convenient for descriptive purposes, but is not intended to be limiting. A variety of assignment algorithms may be used. The convention used to describe a location is (column, row). In some examples, the columns or rows may be associated with the write/erase periods previously described, and the use of less than all of the data from a stripe, in conjunction with the parity for the stripe to recover the data without latency associated with the write or erase operation (at least up to a some level of write bandwidth). It should be understood that the arrangement of address ranges in a row and column format is only one of many possible arrangements, and that the row and column representation has been selected for use in examples as being most easily comprehended when describing a plurality of examples.

There term "erase hiding" may be used to generally describe the concepts previously disclosed, where less than all of the data in the stripe may be used to recover the data of the stripe so that the effect of writing to the memory or erasing the memory does not appear to affect the process of reading data from the memory. The "erase hiding" may be completely effective, below a certain system loading, or may be partially effective as the system loading continues to increase.

The location of data in memory for a particular application, such as a program operating in a virtualized system, may be selected so as to, for example, emphasize the minimization of latency, the transfer bandwidth, the speed of data recovery, the probability of data loss, or the like, depending on the performance characteristics to be represented to a particular virtualized user. In order to understand the storage of data in such systems, the concept of the logical array space and the physical memory space is used, for simplicity of explanation. The mapping of the logical array space to the physical memory may be constrained in some instances by the requirements imposed by erase hiding. The data may be dispersed in the logical address space using data stripes. The data stripes may have associated parity data. Single parity, dual parity or some other error correction technique may be applied to the data of a stripe, and stored in the stripe, or stored elsewhere, as when row or column parity is used.

In an array of address spaces, FIG. 10 shows, for example, stripe "0" at row 3 of the array. The stripe has a length of five, all of which address ranges may be associated with data. Alternatively, one or more of the address ranges may be associated with a parity computed on the remaining data. In the limit, an address range may be the smallest address range that may be written to the particular storage media being used. This may be a page, a sector, or the like. More than one page may be associated with each storage area of the stripe "0". In this example, the logical address ranges of stripe "0" of length L=5 are designated 0.1 through 0.5.

Figure 11:
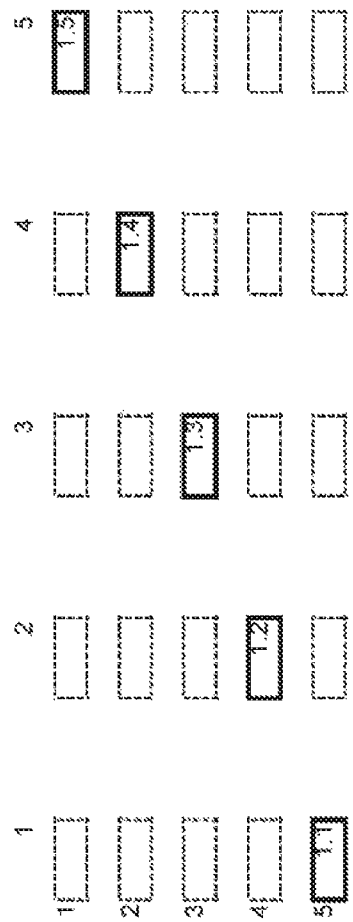
FIG. 11 shows a logical address space of dimension 5×5 and a stripe of length 5, oriented with a slope of −1.
Figure 12:
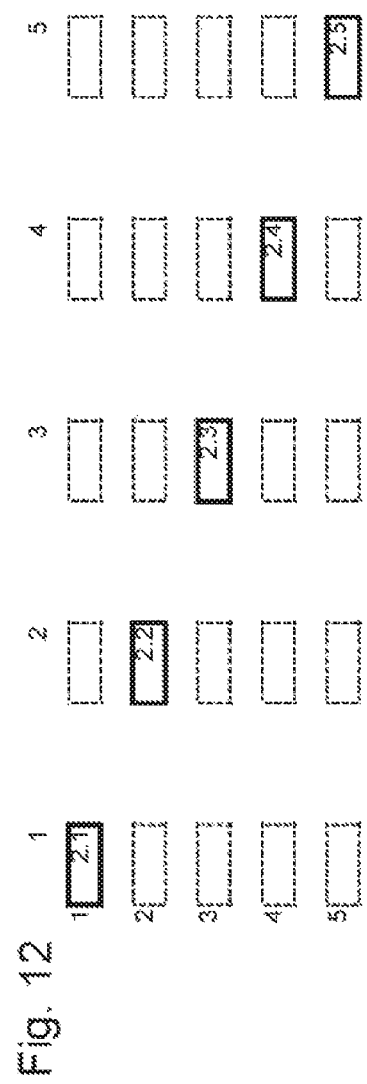
FIG. 12 shows a logical address space of dimension 5×5 and a stripe of length 5, oriented with a slope of +1.

The stripes may be arranged so as to traverse some or all of the columns of a logical array. The address range of a stripe may occupy a different row of the logical array for each of the columns, such as shown in FIG. 11. Here, a second stripe "1" of length 5 is shown, were the row number decreases by unity for every column increment. In FIG. 12, another stripe, for example stripe "2," may be similar to stripe "1," but be arranged so that the row number increases by unity for every column increment.

Figure 13:
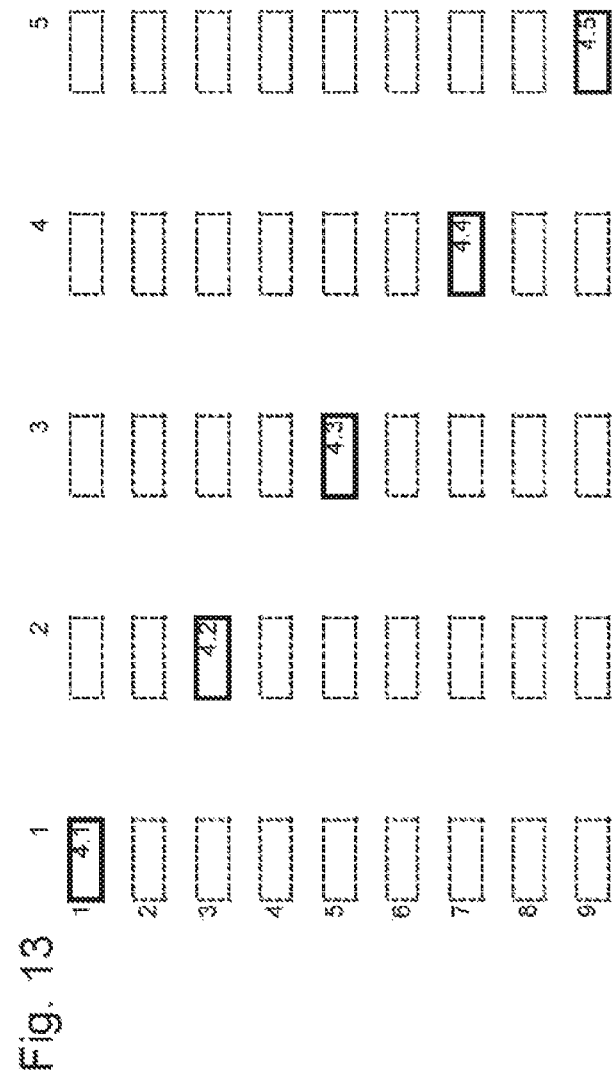
FIG. 13 shows a logical address space of dimension 5×9 and a stripe of length 5, oriented with a slope of +2.
Figure 14:
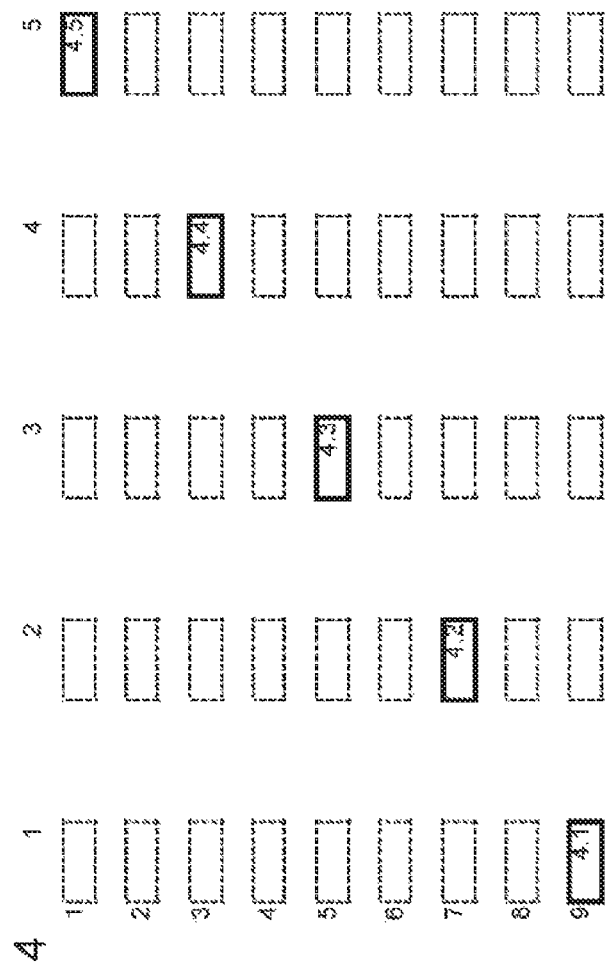
FIG. 14 shows a logical address space of dimension 5×9 and a stripe of length 5, oriented with a slope of −2.
Figure 15:
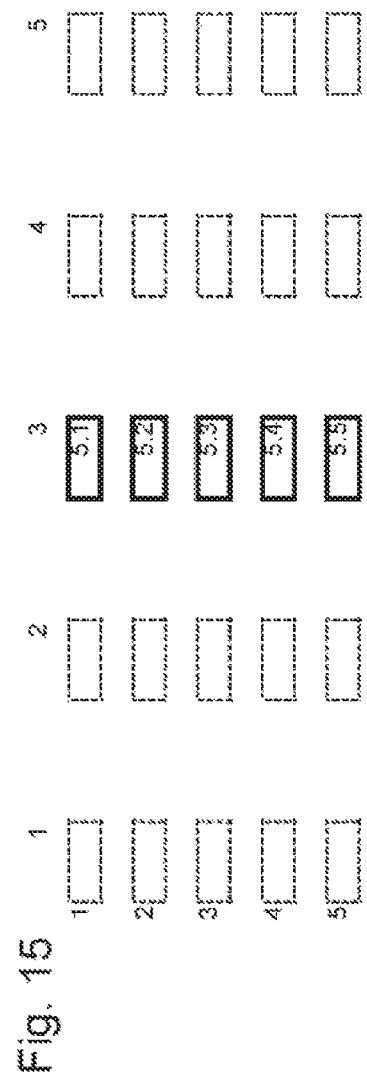
FIG. 15 shows a logical address space of dimension 5×5 and a stripe of length 5, oriented to coincide with a column.

The value of the increment in row number may be greater than unity where, as shown in FIG. 13, the row number increases by two for every column increment. The size of the array in this figure has been expanded from 5×5 to 5×9 so as to show the stripe in a simple manner. FIG. 14 shows the having a row decrement of two. A stripe may also be oriented vertically, so as to occupy a column, as shown for stripe "5" in FIG. 15. Stripe "5", corresponding to a column may be unsuitable for use in a memory application where erase hiding is employed, and where the erase hiding is organized so that erases are performed for the physical memory modules corresponding to the column during common period of time. Such a situation would result in insufficient data to reconstruct the stripe when the response of the physical memory is compromised by an erase period conflicting with a user data request. However, should the erase periods be organized on a row basis, the stripe "0" would have encountered the erase hiding blockage, while stripe "5" would avoid erase hiding. For simplicity of presentation, typically columns are considered to be erased during a common erase period. However, it will be apparent to a person of skill in the art that rows may be similarly treated, and that the locations of the physical memory modules associated with these operations may be controlled by an allocation table that depends on the physical properties of the memory array, and may not appear as a row and column organization. This would be apparent, for example in FIG. 4.

The individual modules may be organized into erase-time groups, and each erase-time group may correspond to a logical column.

Figure 16:
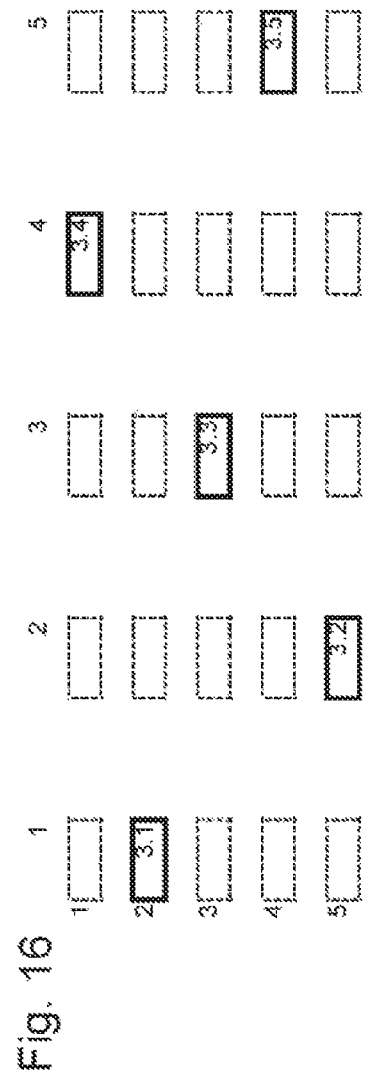
FIG. 16 shows a logical address space of dimension 5×5 and a stripe of length 5, oriented with a slope of −2, showing wrapping of the stripe at the array boundary.

Alternatively, the physical modules may be organized so as to have separately addressable "even" and "odd" memory locations, and the even and odd memory locations may be allocated to different erase hiding periods, which may performed independently in a logical row and column manner. Such an organization may be useful where the internal bandwidth of a memory module is a limitation on the data transfer rate.

Where the extent of the stripe, in either rows or columns, exceeds the boundary of the logical array, the stripe may wrap around on a modulo arithmetic basis, such as shown in FIG. 16, which corresponds to the stripe of FIG. 14 when used in a 5×5 matrix. The array of FIG. 16 is sized so that the stripe is wrapped around in both columns 1 and 5, however, in larger arrays, the wrap around would occur for the portion of the stripe that extends past the boundary of the array in a particular direction. FIG. 11 shows a similar situation for the stripe orientation of FIG. 13.

In outline, the orientations of the stripes of this example may be visualized as line having slopes are generalized as lines having slopes of 0, ±1, and ±2 rows/column. Larger step sizes may also be used.

Figure 18:
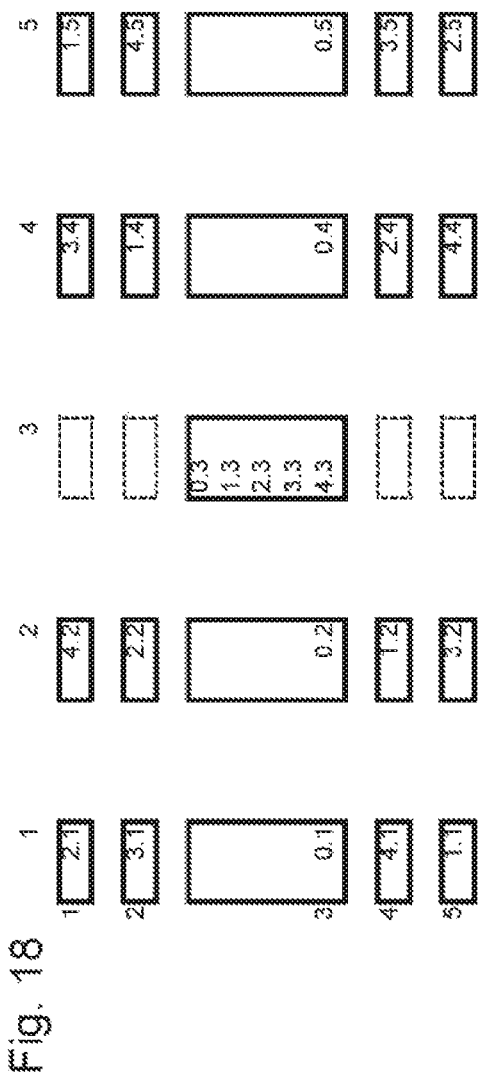
FIG. 18 shows a logical address space of dimension 5×5 and a stripe of length 5, with stripes of slope 0, ±1, ±2 passing through (3, 3)
Figure 19:
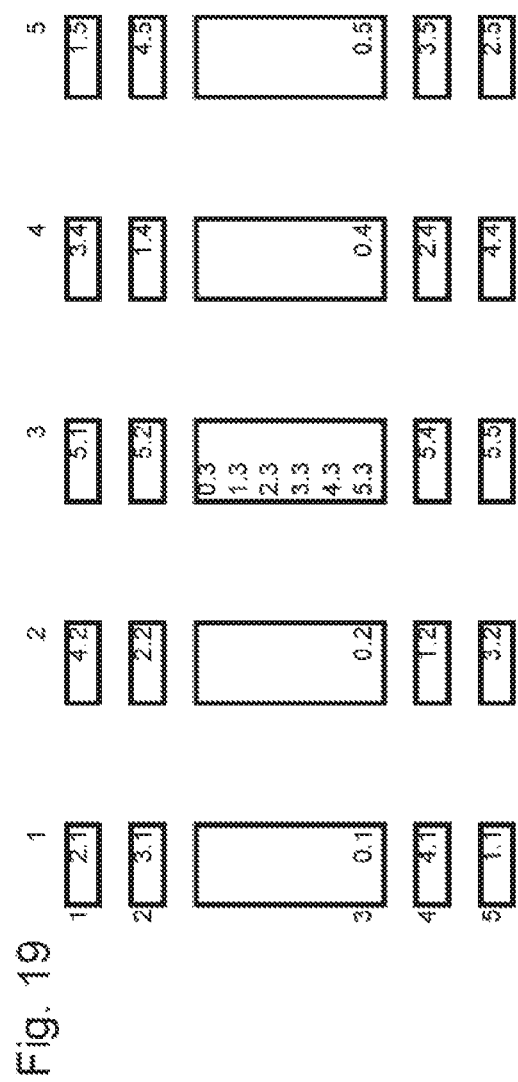
FIG. 19 shows a logical address space of dimension 5×5 and a stripe of length 5, with stripes of slope 0, ±1, ±2 and vertical passing through (3, 3)

The logical address ranges comprising a particular stripe may differ from stripe-to-stripe. Portions of a plurality of stripes may be stored in the same row and column, as shown in FIG. 18. Here the stripe orientations previously shown in FIGS. 10, 11, 12, 16 and 17 are superimposed so that logical address range 3 of each stripe is found in (3, 3) of the logical array. The vertical stripe of FIG. 15 may also be used as shown in FIG. 19. All of the stripes are found in the central array location (3, 3), and each stripe is also otherwise found in a separate array location.

This stripe pattern may be termed a stripe cluster and has an effect of dispersing the data that may be used in a number of ways to control the performance of a memory system. In larger arrays and larger stripe lengths L, other stripe slopes and patterns may be used, such as ±3, ±4, and the like, as part of a stripe cluster.

Figure 20:
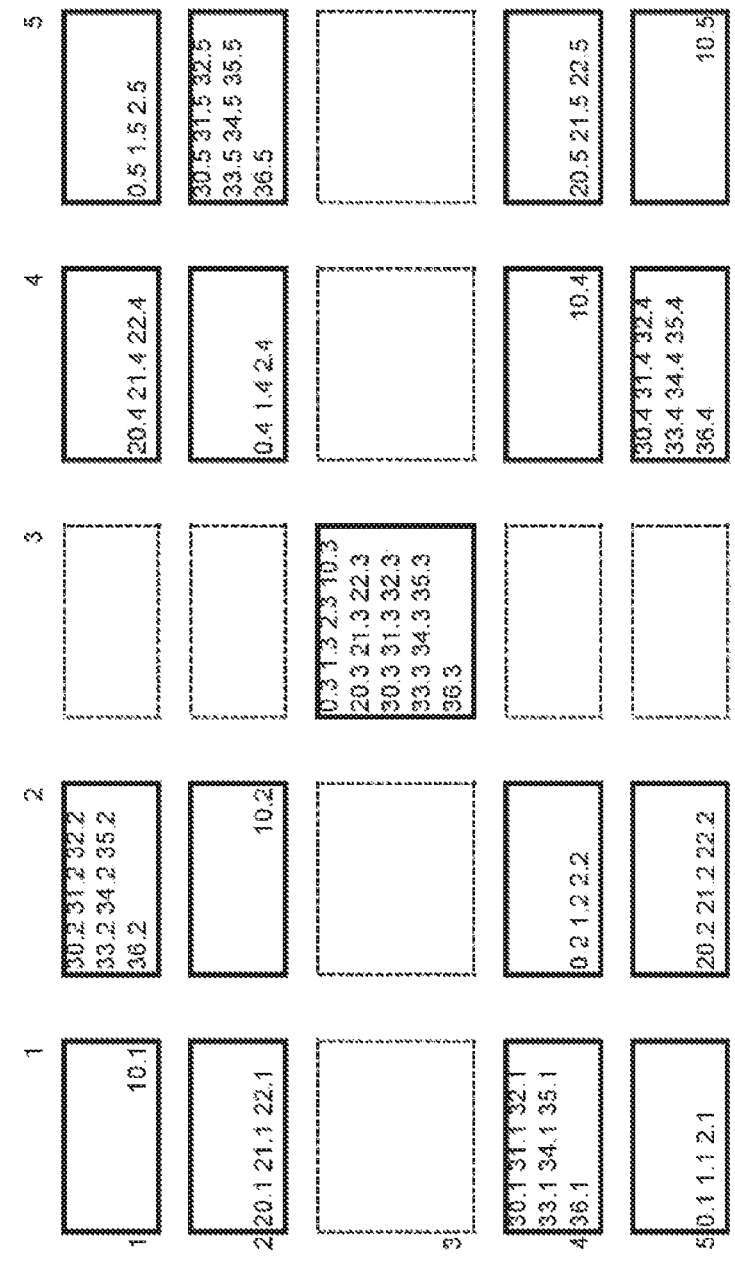
FIG. 20 shows a logical address space of dimension 5×5 and a stripe of length 5, with stripes of slope 0, ±1, ±2 and vertical passing through (3, 3) where the stripe patterns have differing widths.

In FIG. 18, each stripe would appear to have the same amount of data. That is, as shown, there is no notation characterizing the storage capacity of each address range group. Each stripe may be said to have a width $W_s$. The total amount of memory in stripes allocated to a physical memory module may be up to a maximum amount determined by considering the total physical memory of the module, and the percentage of the total physical memory in the memory module that is available to the user, taking account of the housekeeping requirements such as garbage collection, the maximum desired time-line loading, and the like. In the present example, the housekeeping functions are ignored, and the physical memory may fully allocated to the stripes. Thus the sum of $W_s$ over the stripes allocated to the module may be equal to the total physical memory.

Where location (3, 3) in FIG. 18 corresponds to a physical memory module, all of the stripes of the stripe cluster may be accommodated in that module, providing that the sum of the widths W of the stripes is less than or equal to the physical memory available. FIG. 20 is a representation of the array where the stripes may have differing widths. In this example, the stripe "20", which is a stripe of −3 slope, is replicated as stripes 21 through 23, whereas stripe 10, which is a stripe of slope −1, is not replicated. So, if each of the stripe address ranges X.3 represented an amount of memory M, the stripe direction −3 may be seen to contain 3M of memory space, while the stripe direction −1 may be seen to contain M of memory space. Other arrangements are equally possible, and the memory space of a stripe may be allocated to a particular application program, or to a plurality of application programs.

Figure 21:
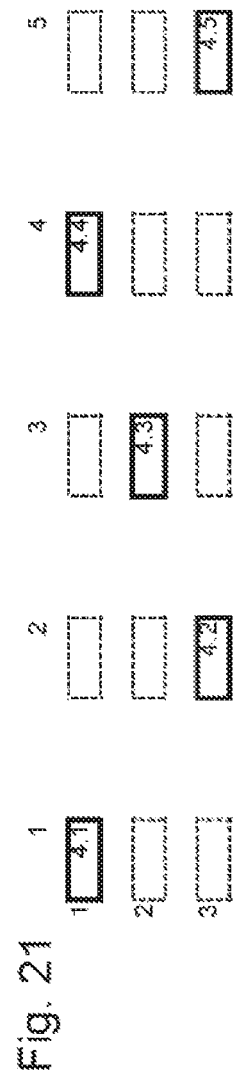
FIG. 21 shows a logical address space of dimension 5×3 and a stripe of length 5, with a stripe of slope of −1.
Figure 22:
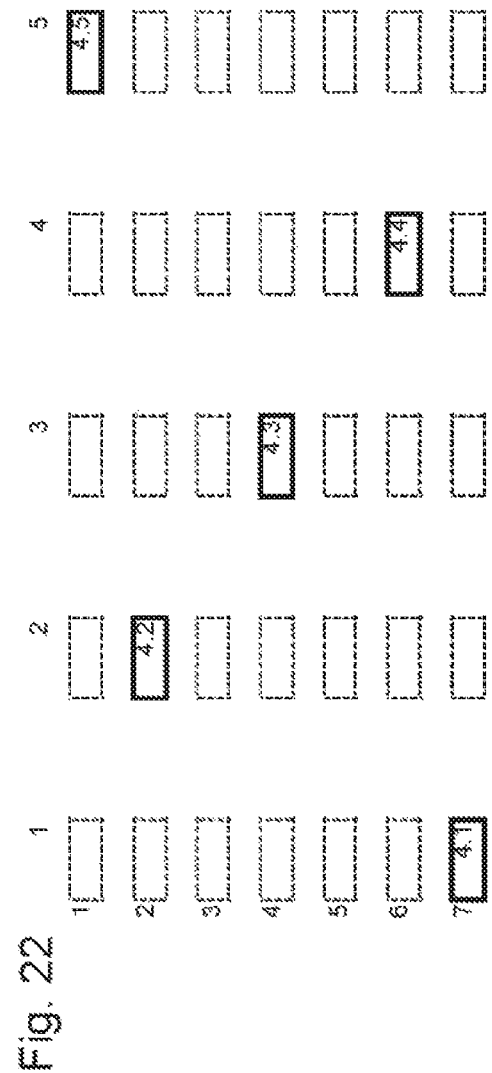
FIG. 22 shows a logical address space of dimension 5×7 and a stripe of length 5, with a stripe of slope of +2.

For example, but not by way of limitation, if the stripes each comprise four data elements and a parity computed from the data elements of the stripe, then any of the stripes may be accessed while another one is being accessed, even if there is a resource conflict at (3, 3), without any performance degradation. This follows from the use of the parity to substitute for any address range of the stripe that may be delayed in being read due to a hardware conflict or limitation. An arrangement such as shown in FIG. 18, or a similar arrangement, may be used, for example, in the allocation of data to physical memory within each memory module of a larger memory system. FIGS. 21 and 22 show module wrapping in different sized arrays.

Figure 23:
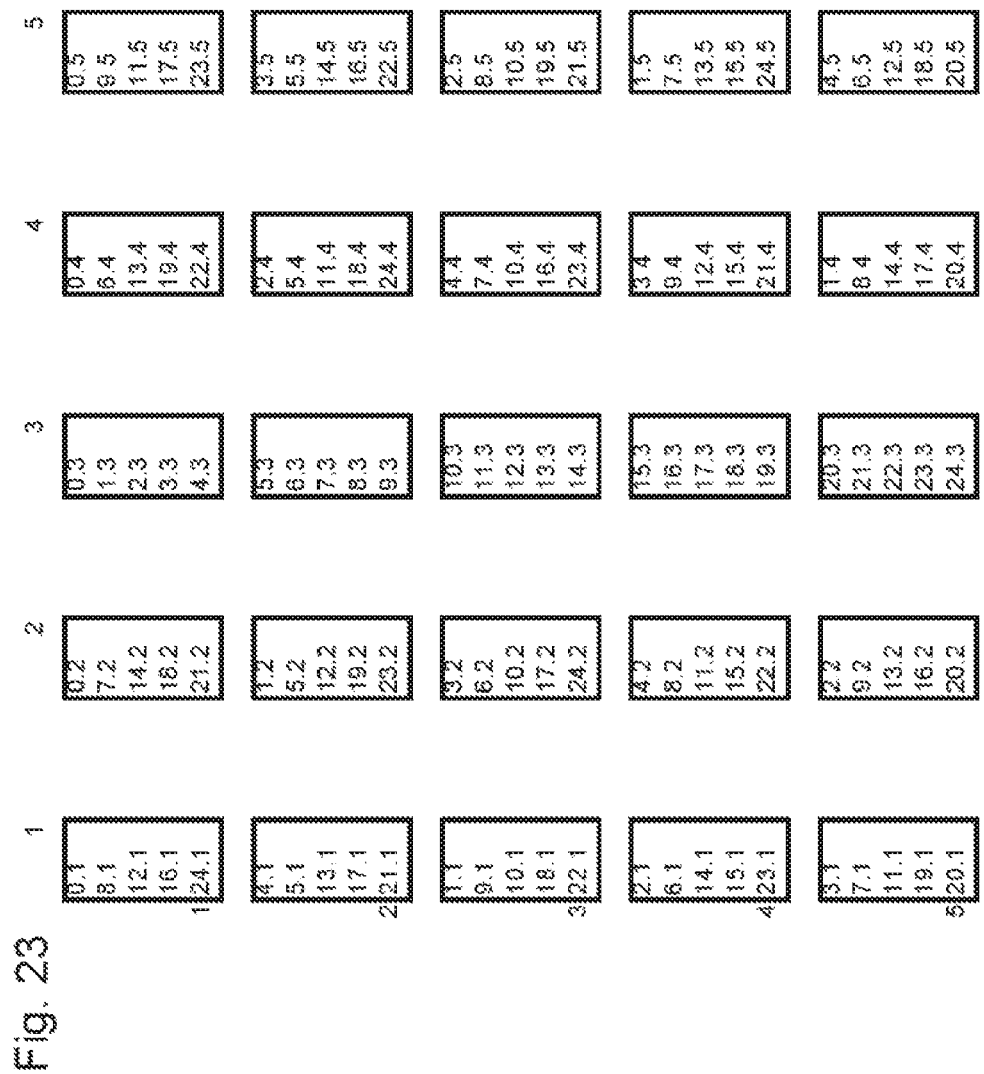
FIG. 23 shows a logical address space of dimension 5×5 where a generating function of FIG. 18 is positioned at each row of column 3.
Figure 34:
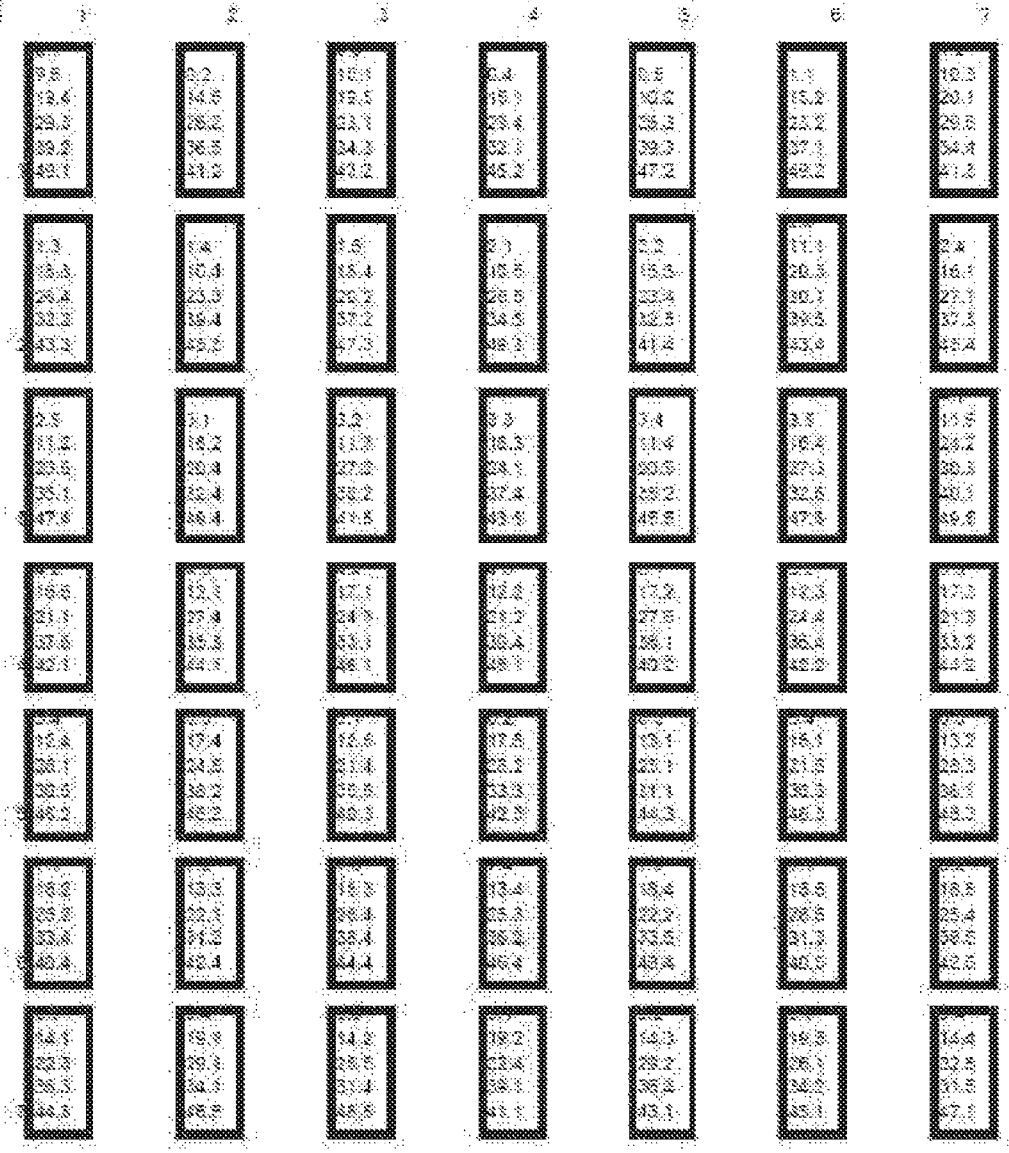
FIG. 34 shows the striping pattern of striping pattern patterns of FIGS. 31-33 and higher increments are used to produce a total of stripes.

The generation stripe patterns may use a policy or method which may be understood, for example, with reference the following macros, executing in Microsoft Excel, the operation of which would be understood by a person of skill in the art:

```
//Code for FIG. 23
For i = 0 To 4
    Call make_stripe(5, 5, 5, 0, i, 5 * i + 0, 0, 2)
Call make_stripe(5, 5, 5, 0, i, 5 * i + 1, 1, 2)
    Call make_stripe(5, 5, 5, 0, i, 5 * i + 2, 2, 2)
Call make_stripe(5, 5, 5, 0, i, 5 * i + 3, 3, 2)
    Call make_stripe(5, 5, 5, 0, i, 5 * i + 4, 4, 2)
    Next i
            //Code for FIG. 34
        For i = 0 To 9
            Call make_stripe(7, 7, 5, (i * 5), 0, i, 6, 0)
            Next i
        For i = 10 To 19
            Call make_stripe(7, 7, 5, (i * 10), 0, i, 7, 0)
            Next i
        For i = 20 To 29
            Call make_stripe(7, 7, 5, (i * 15), 0, i, 8, 0)
            Next i
            For i = 30 To 39
            Call make_stripe(7, 7, 5, (i * 20), 0, i, 9, 0)
            Next i
            For i = 40 To 49
            Call make_stripe(7, 7, 5, (i * 25), 0, i, 10, 0)
            Next i
// helper functions
Sub make_stripe(width As Integer, height As Integer, ssize As Integer, x As Integer, y As Integer, addr As Integer, stype As Integer, pivot As Integer)
Dim i As Integer
Dim j As Integer
Dim l As Integer
For l = 0 To (ssize − 1)
    j = stripe_x(ssize, stype, pivot, 1)
    i = stripe_y(addr, stype, pivot, l, j + x, width)
    j = (((j + x + width) Mod width) + 1)* 2
    i = (((i + y + height) Mod height) + 1) * 2
    Cells(i, j).Value = Cells(i, j).Value & " " & addr & "." & (l + 1)
    Cells(i, j).Select
    Call make_border
Next l
End Sub
Function stripe_x(ssize As Integer, stype As Integer, pivot As Integer, pos As Integer)
Select Case stype
Case −1
    stripe_x = 0
Case 7
    stripe_x = pos * 2
    Case 8
        stripe_x = pos * 3
```

-continued

```
    Case 9
        stripe_x = pos * 4
    Case 10
        stripe_x = pos * 5
Case Else
        stripe_x = pos
    End Select
End Function
Function stripe_y(n As Integer, stype As Integer, pivot As Integer, pos As
Integer, x As. Integer, w As Integer)
Dim q As Integer
Dim p As Integer
Select Case stype
Case −1
    stripe_y = pos
Case 0
'horizontal line
    stripe_y = 0
Case 1
'forward slash
    stripe_y = pivot − pos
Case 2
'backward slash
    stripe_y = pos − pivot
Case 3
    stripe_y = 2 * (pivot − pos)
Case 4
    stripe_y = 2 * (pos − pivot)
Case 5
    q = (pos + (n \ pivot)) Mod 8
' q = pos
        p = n + pos
            Select Case q
            Case 0
                stripe_y = p * 101
            Case 1
                stripe_y = p * 79
            Case 2
              stripe_y = p * 41
            Case 3
              stripe_y = p *223
            Case 4
              stripe_y = p * 467
            Case 5
              stripe_y = p * 373
            Case 6
              stripe_y = p * 157
            Case 7
              stripe_y = p * 191
            End Select
    Case 6
      stripe_y = 0 + (x \ w)
    Case 7
      stripe_y = 0 + (x \ w)
    Case 8
      stripe_y = 0 + (x \ w)
    Case 9
      stripe_y = 0 + (x \ w)
    Case 10
      stripe_y = 0 + (x \ w)
    Case Else
        stripe_y = 0
End Select
```

Similar algorithms were used to generate the other figures used in the explaining the examples. Moreover, this algorithm, or similar, may be used so as to compute the association of address ranges with locations in a practical system, where the algorithm is a part of a computer software product. So, a choice may be made between computation of the association as needed, a pre-computed look-up table, or combinations of the techniques.

Thus far, the examples have shown a stripe cluster centered on a single memory module. However, from the foregoing, it would be understood that, with appropriate modulo arithmetic where wrapping is needed, the stripe cluster may be centered on each of the memory modules in, for example, a column of an array, as shown in FIG. 23. Here, stripes of length 5 and slopes 0, ±1 and ±2 may be used as a generating function. The generating function may, for example, first be used at (3, 1) to generate stripes 0 through 4, and then at (3, 2) to generate stripes 5 through 9, and so on down to (3, 5) to generate stripes 20 through 24. Here, we have assumed for purposes of illustration that the five stripes in each module occupy the total memory space of the associated physical memory module.

Figure 24:
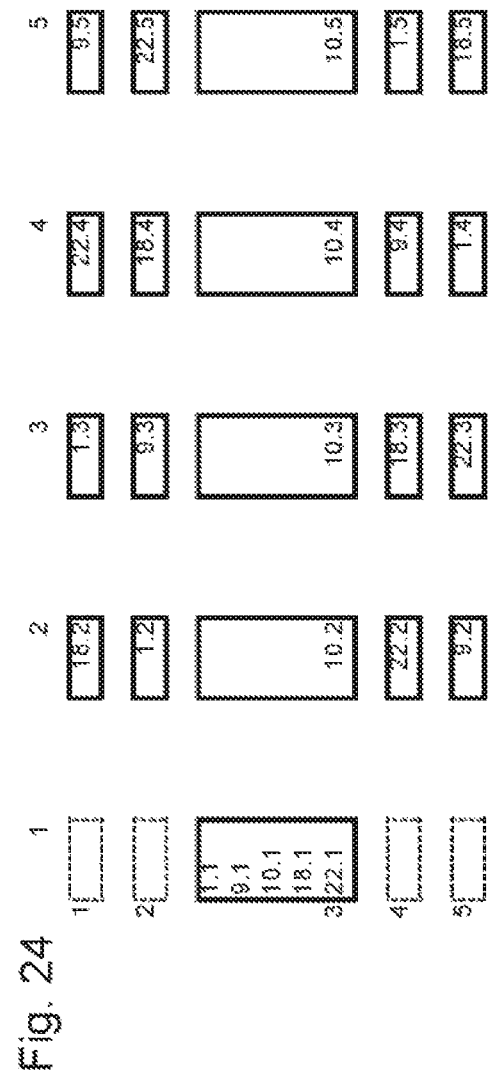
FIG. 24 shows a logical address space of dimension 5×5 where the generating function of FIG. 18 is positioned at (1, 3)
Figure 25:
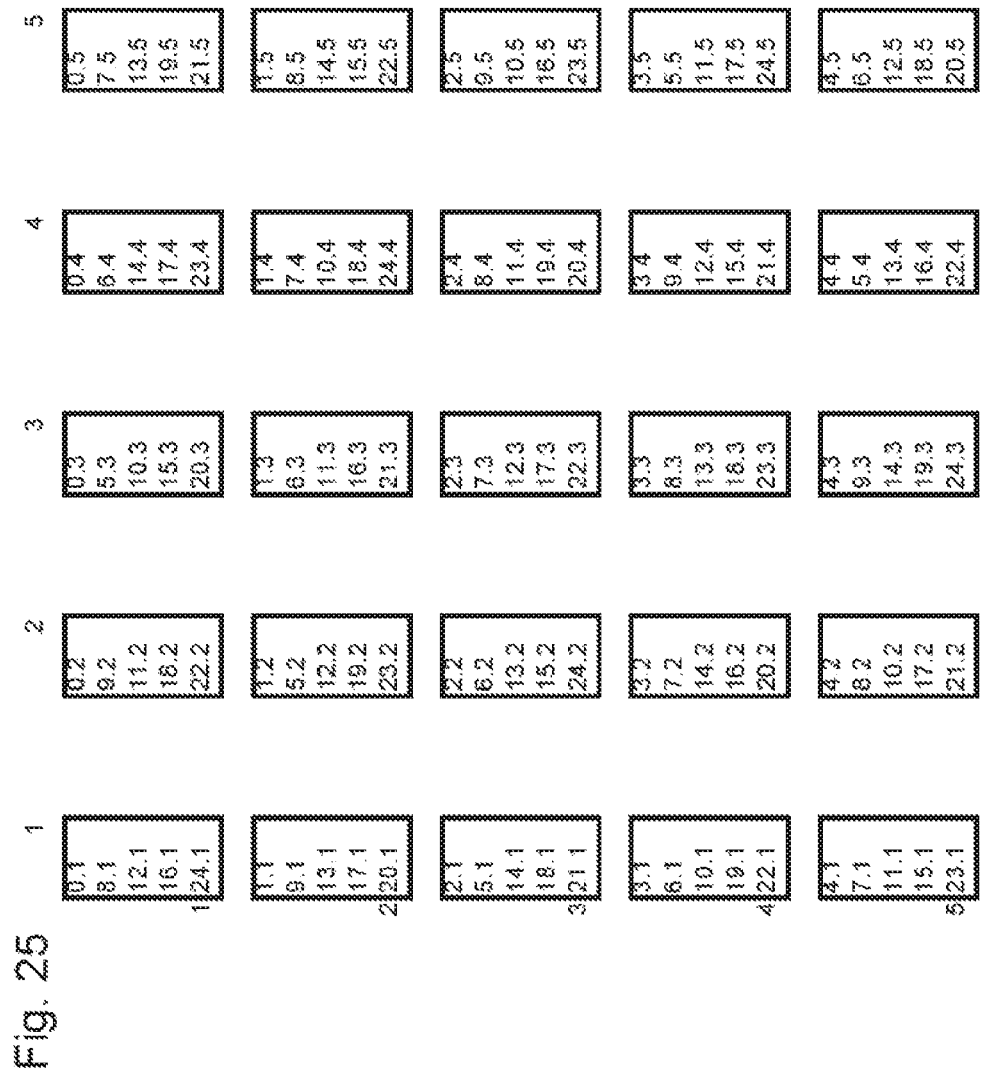
FIG. 25 shows a logical address space of dimension 5×5 using another example of a generating function.
Figure 26:
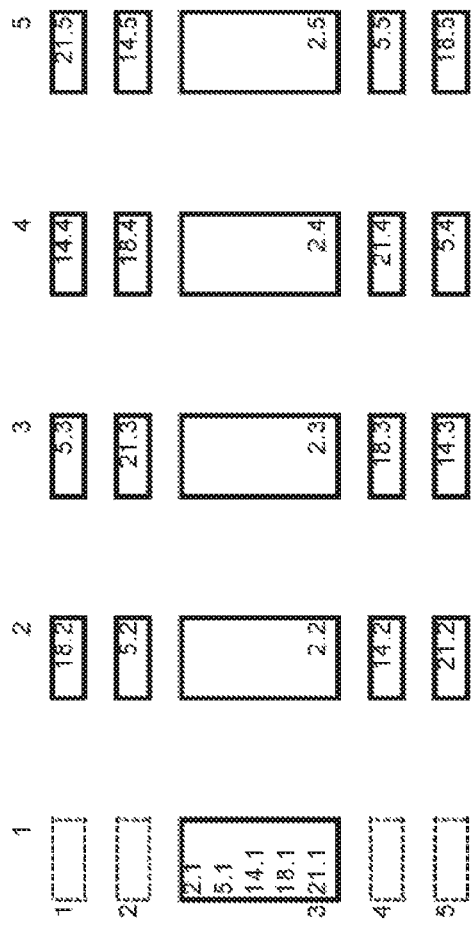
FIG. 26 shows a logical address space of dimension 5×5 with the generating function of FIG. 25 positioned at (1, 3)

No matter where the central intersection point of the stripes is positioned, one may observe, as in FIG. 24, that the data of the remainder of a stripe is dispersed such that only one of the stripes that intersected at (1, 3) passes through any of the other modules. Such an arrangement may be useful in facilitating recovery from a module failure. If the module corresponding to (1, 3) has failed, the remaining data in the stripes having data to be recovered would need to be used so as to recover the data in the failed module. In doing so, the loading of the system associated with reading the remaining data is widely spread over the module having the dispersed data, so that each of the modules is less affected than would be the circumstance for the arrangement of FIG. 5, where the stripes are all of slope 0. In the arrangement of FIG. 5, all of the data needed to recover the data of the failed module is located in 4 modules, whereas in the situation represented by FIGS. 23 and 24, the data may be spread over 20 modules. Another similar example is shown in FIGS. 25 and 26.

The properties of a memory array, which may be significantly larger than that shown in the examples, may understood by considering one stripe cluster as a generating function. Although each of the strips may have a width W, which may be different for each stripe, it is easier to visualize the situation if each strip has a width W equal to the minimum permitted write range: for example, a page. In practice, where memory circuits have capacities measured in MB or GB for a single device package, the width W for each of the stripes may be considerably larger than a page. In an aspect, the width W may be measured in terms of blocks, which may be 128 KB or 256 KB, or in terms of a die having multiple blocks, where a plurality of die are contained in the memory circuit.

More than one stripe cluster type may be defined, with different length L and different stripe slopes. For example a stripe of length 7 may be used, as well as the stripe of length 5 previously discussed. The stripe of length 7 may have a differing number of data and parity units. For example, there may be 5 pages of data and 2 pages of parity. This would be representative of other lengths L having varying numbers of data and parity pages, depending on the application requirements. Providing that the memory modules of array have not been filled with the first stripe cluster pattern, a second stripe cluster pattern may be also used as a generating function so as interleave the data from the two patterns.

Since a first program in a virtualized system and a second program in a virtualized system may have different optimization requirements, such as latency, input-output operations, transfer bandwidth, recovery speed, probability of irretrievable loss of data, and the like, a striping pattern (including parity) may be chosen so as to best meet the criteria.

When each stripe is written as a plurality of pages, the parity may be computed for the stripe being written, and is written to memory at the same epoch as the data. In this way, reading of data from memory is not needed for the computation of parity. Either the data was read at a previous time and is now being written as modified data, or the data is new data that has not been previously stored.

Figure 27:
FIG. 27 shows a logical address space of dimension 5×5 with the generating function of FIG. 18 positioned at each column and row of the array.
Figure 28:
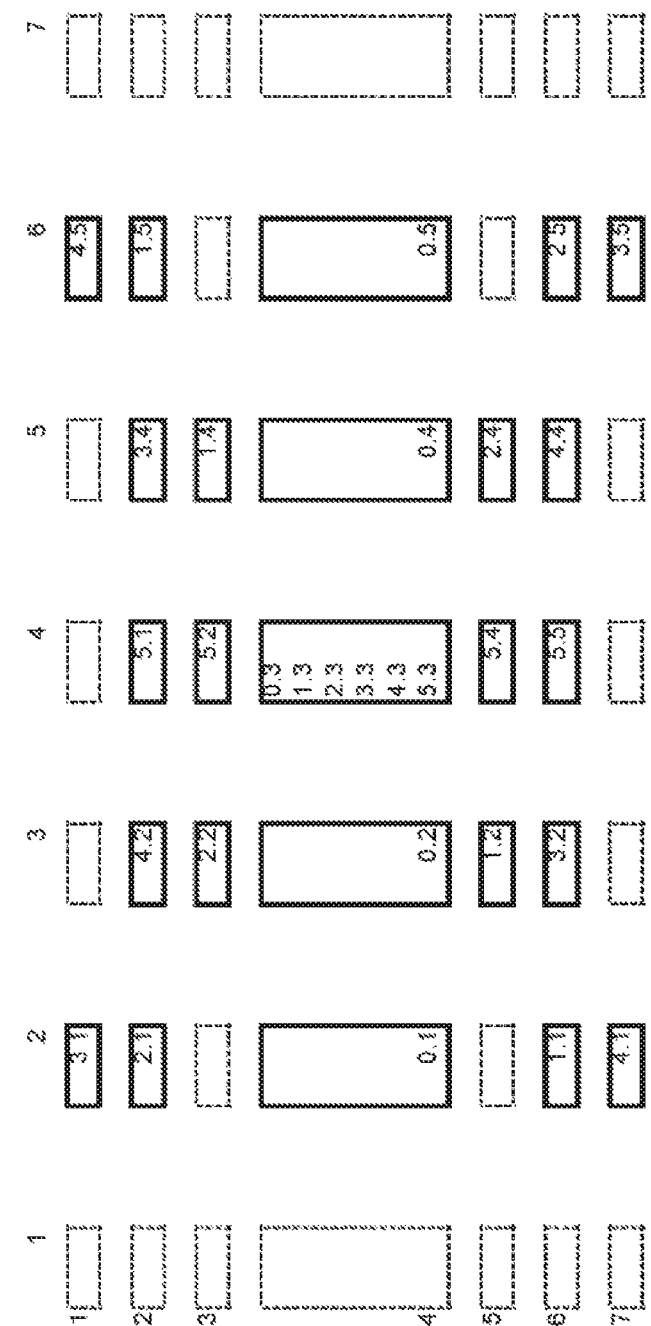
FIG. 28 shows a logical address space of dimension 7×7, with a generating function of dimension 5×7.
Figure 29:
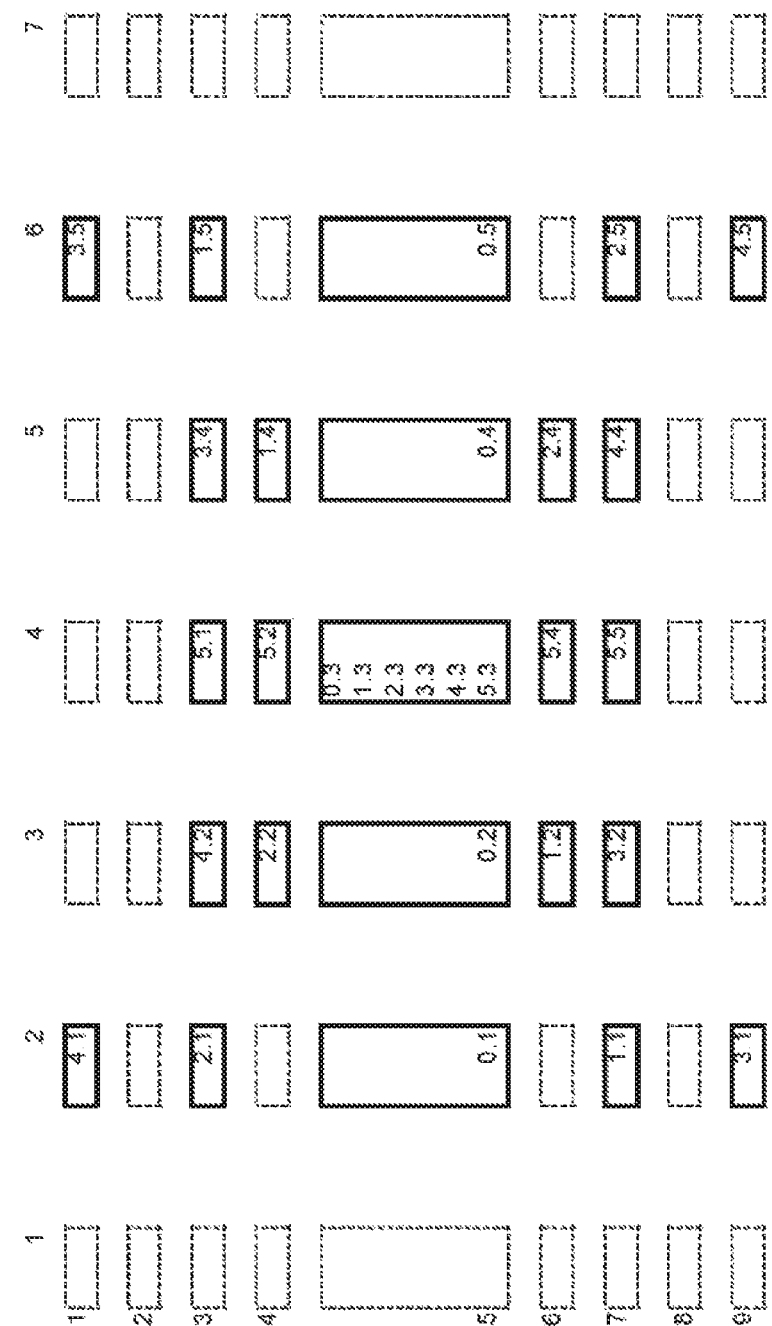
FIG. 29 shows a logical address space of dimension 7×9, with a generating function of dimension 5×9.

FIG. 27 shows an example of a memory system where the physical memory modules have a capacity equal to 25 stripe widths of width 1. The striping pattern for this example is produced similarly to that of FIG. 25, except that the generating pattern is centered on each of the logical address range rows and columns. The patterns produced are broadly dispersed and may have the property of dispersing write and read loads of a plurality of applications so as to reduce the occurrence of "hot spots". Hot spots occur when a user application program or a virtualized space repeatedly references a logical address range that is mapped into a memory module. This may result in performance problems such as increased latency, rapid memory wear and the like.

Consider the situation then, where address range (1, 3) corresponds to a memory module where a failure has occurred, and it is desired to reconstruct the data using four of the five elements in each of the stripes. To do this, the four pages of the stripe may be used to reconstruct the parity, if the parity was the data lost due to the failed module; or, three of the four data pages and the parity page used to reconstruct the missing data page, if a data page was the data lost due to the failed module, and the recovered data (which may include recovered parity data) stored in an operable memory location.

When the data has been recovered, the recovered data is stored in an operable memory module having available storage space. The selection of the location of this data storage is discussed elsewhere. In an aspect, to preserve erase hiding in a system, the data being recovered may be stored in a memory module associated with the same erase-hiding interval as the failed memory module. A spare memory module may be synchronized with the erase-hiding interval of the failed memory module, and the recovered data stored into the spare module either directly, or after an intermediate storage operation. The individual recovered data blocks may be written into any stripe not passing through the failed module. As each of the recovered pages is written to the stripe, the parity of the stripe may be updated by the XOR computation so that the recovered data is being protected against a subsequent failure as it is being recovered. Alternatively, recovered data is assembled into a stripe with an associated parity and is written as such.

In an aspect, a spare module may be used to receive the recovered data. The memory architecture of FIGS. 4A-B is compatible with hot sparing of data recovered for a memory module. The spare memory module may be synchronized with the erase period of the failed module and the recovered data written to the spare module. Since the memory capacity of the spare module may be the same as the failed module, the data may completely recovered into the spare module.

However, the writing rate of data into the spare module may be a limitation on the speed with which the data can be stored, since it may be desired to restrict the writing of data to the erase interval period of the column so that the response time of the memory system to read requests for data in the stripe being recovered is not compromised. In an aspect, the writing of recovered data into a spare module may be limited to less than the maximum bandwidth. As the spare module becomes filled with recovered data, the timeline-loading status comes closer and closer to that of the module having this data before it had failed. That is, there is an increasing read and write load on the module due to the user program accessing the module, and due to housekeeping activities such as garbage collection and wear leveling. The response time of the spare module to user requests would be compromised if the writing speed of the recovered data into the spare module was not moderated.

An intermediate recovery step may be introduced. For example, the recovered data may be written into operable memory modules having spare space. Such spare space may be specifically reserved for recovered data, or may be a consequence of the garbage collection strategy. For example, the persistent garbage collection strategy described in U.S. provisional application 61/186,626, filed on Jun. 12, 2009 and which is incorporated herein by reference, may result in some spare space in each module that may be used on a temporary basis.

During normal operation, the act of performing garbage collection consumes some portion of the available read and write bandwidth of the module as an overhead, reducing the average write bandwidth of a module as the amount of the total memory space in use increases. If there is sufficient free memory space in modules in use and/or more than one spare module, then altering, reducing, or halting the process of garbage collection during a rebuild of data may allow more bandwidth to be available both for reading for the reconstructing data of the failed module as well as for writing operation to store the reconstructed data.

Where recovered data is being written to a memory module temporarily during reconstruction is identified, for example, by a special command option, the use of tags on the data, special address ranges, or local determination based on address or some other metadata, then the location of the temporarily stored data can be selected to reduce or eliminate the need to garbage collect the blocks used for storing the temporary data.

In an example, temporary reconstruction into the available space of a plurality of modules may be performed. The routine garbage collection process may be slowed or halted as long as memory space is available. Blocks containing reconstructed data maybe generally be limited to no more than some predetermined fraction of data that was not being temporarily stored on the memory module. Little or no garbage collection may be performed for data blocks largely or wholly containing temporary data.

When the temporary data representing the reconstructed (recovered) data are transferred to the replacement memory module, blocks that were largely or entirely used for the storage of such data may be efficiently garbage collected, perhaps needing only to be erased. Taking account of the space that may be needed from in a specific module for temporarily storing reconstruction data, the average or maximum write bandwidth of user data, the spare memory space available, and the time to perform the reconstruction, as well as the time to copy the reconstructed data to the replacement module, the garbage collection process may be slowed, altered, or stopped so as to accommodate the failure event. Failure events may therefore be considered as an exception case to the routine operation of the memory system, and the effect of recovery from a failure would be spread over the system both physically and temporally, thus mitigating the effect on most of the users.

In another aspect, the degree to which the garbage collection process may be slowed, altered, or stopped may affect the time to perform the reconstruction, and so the calculation might have to be performed more than once to converge on an answer. Based on the amount of free memory space on a given module, where the free memory space was located on the module, whether the memory was free and available to be written to, or free but needed to be garbage collected before it could be used, the amount or nature of temporary reconstruction data allocated to a module may be altered.

For example, a module with more free space could be assigned more temporary data than another module with little free space or with free space requiring significant garbage collection effort to make free memory available. A module with significant free memory space, but where little or moderate garbage collection was required to make it available may be allocated a larger amount of temporary reconstruction data, but from addresses to be recovered later in the reconstruction process so again free the memory space.

The garbage collection policies and/or parameters used during reconstruction need not be the same for each module in the system and could be policies and/or parameters that would be considered undesirable under normal operating conditions. However, the particular strategy selected would be intended for use during the recovery period and revert to a routine operation once the recovery operation no longer involved a particular module.

Where such spare memory space exists, the recovered data may be written into modules in the same column as the failed module. This data would immediately be within the erase hiding regime. However, it may be desirable to more widely disperse the recovered data. In effect, all of the remaining modules may be used, except for modules containing the stripe being recovered. The recovered data may fall into a column having a row containing the stripe of the recovered data, a stripe page may be in an erase interval. An increase in latency may occur as two data reads would be needed rather than one data read. This may be avoided by, when writing data into a column that is not the same as that of the failed module, the same data, or a parity of the data, is also written into a spare area of another column. This may be considered as mirroring the recovered data. While this temporarily uses more space, the data is more widely spread over the memory by this distribution and reducing any performance degradation. When data stored in such a temporary column is to be read, either both of the storage locations are read, and the first data of the two identical data pages is used or, taking account of the timing, the data is read from the one of the two memory modules that is not in the erase interval.

At the latest, after all of the data has been recovered into persistent memory, the recovered data can now be moved to the spare module so that the mirrored data is no longer needed. The spare module becomes the replacement of the failed module, and its location is mapped as such with respect to the logical address space.

As the data being used for recovery may be dispersed over 20 of the 25 memory modules in the example shown, the reading of this data may proceed essentially in parallel. The effect of the reading of the data for reconstruction on the normal operation of the memory system is spread over the entire memory system. Similarly, the effect of the normal operation of the memory system of the reading of the data needed is likely to be more evenly spread.

This may be compared with the arrangement in FIG. 5, where the data is written to, for example, stripe "0" so as to store data in row "0" and columns A through D. Here, all of the data and parity that would be used to recover data from a failed memory module is stored in only the four remaining memory modules of the stripe. So, to accomplish the reading of data to reconstruct a failed module (A, 0), for example, the data is read from modules (B, 0), (C, 0), (D, 0) and (P, 0). To restore the data in the same time period as for the arrangement in FIG. 20 the data would have to be read out from the memory modules in FIG. 5 at about 4 times the data rate. Similarly, if the writing of the recovered data to operable memory modules is performed in accordance with the same striping strategy, then the writing rate of recovered data to modules would again be about 4 times as fast as for the example in FIG. 20.

The description of the arrangement of FIGS. 10 through 27, and the recovery of data after a failure of a module did not specifically address the subject of erase hiding, which may place a constraint on the location of data in the physical memory, and of the reconstructed data in the event of a memory module failure.

In an example, consider the 5×5 address range matrix of FIG. 25 having a failure in the module containing the address ranges of (1, 3) as shown in FIG. 24. The address ranges of the arrangement of FIG. 25 may be associated with memory modules of the physical memory system in a manner similar to that previously described, for example in FIGS. 4A-B. Where erase hiding is a design objective at a particular level of the system architecture, the timing of each the erase (and write) intervals for each physical memory module, wherein a module may be a module, a sub-module or the like, may be such that only one of the modules associated with a stripe is performing writes or erases during a particular interval. To the extent that the intervals are only partially overlapping, the erase hiding aspect may be less effective.

Where a memory module is comprised of a plurality of memory circuits, each of the memory circuits may be written to or erased independently of the other memory circuits in the memory module. For a FLASH memory, this property may be at the level of a die, where there are a plurality of die in each memory circuit. At present, such memory circuits may be associated with a packaged device having a pin or ball grid array or other interface so that the memory circuit may be assembled into a memory module. However the technology of memory circuits and packaging is continually being developed and the descriptive terminology herein should be considered to be conceptual rather than limiting.

When the memory module is comprised of a plurality of memory circuits, not all of the memory circuits will have an erase pending when an erase interval occurs for the memory module. Those memory circuits not having a pending erase may execute pending write operations or write operations that arrive during the erase interval. To the extent that neither an erase nor a write is being performed on a memory circuit of the memory module, a pending read operation may be executed. Thus, even during an erase interval for a module, read operations may be performed on some of the memory circuits of the memory module. Read and write requests to be executed on the basis of the available time line during an erase interval may be de-queued for execution based on a policy which may give priority to requests from a particular user, service, or the like.

However, when a read operation is received for a memory circuit where an erase operation is in progress, the erase hiding mechanism described herein avoids the latency associated with the completion of the erase interval. This may become increasingly important in situations such as multi-level FLASH (MLC) where there appears to be a trend towards longer write and erase times.

Figure 17:
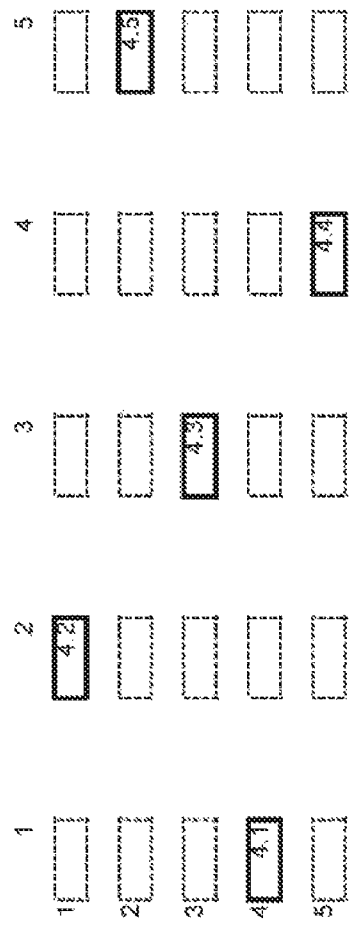
FIG. 17 shows a logical address space of dimension 5×5 and a stripe of length 5, oriented with a slope of +2, showing wrapping of the stripe at the array boundary.

Here, let us consider that in the case of FIG. 17 and a stripe length of five, where the non-overlapping property may be obtained by sequentially permitting the address ranges columns 1-5 in FIG. 17 to be assigned to memory modules so that all of the rows in column 1 are in an erase interval at the same time. After completion of the erase interval for column 1, the erase interval for column 2 would occur, and so forth.

Since the individual addresses of a stripe, such as stripe "0" are spread over all of the columns, regardless of which row is being considered, and all of the rows in a column are assigned to memory modules associated with the same erase interval, it follows, as before, that four of the five address windows, which may be elemental pages, are always available for immediate reading. So, the arrangement of FIG. 17 is compatible with the erase hiding architecture, while distributing the data widely over the physical memory. Only one address range of the stripe is associated with each erase time.

Figure 30:
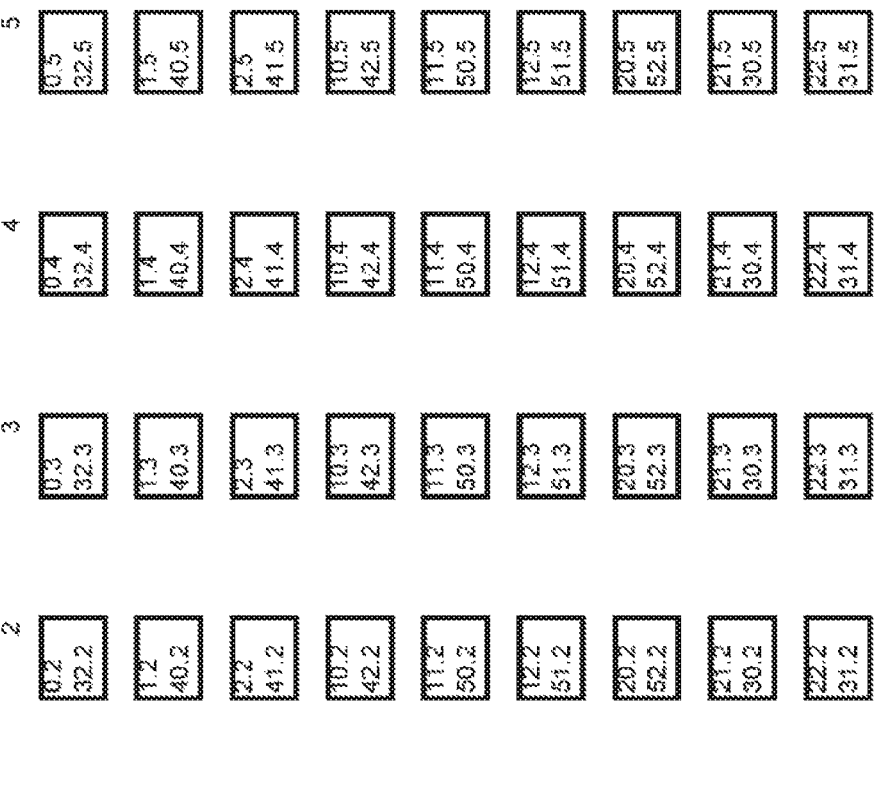
FIG. 30 shows a logical address space of dimension 5×7 where the stripes are allocated to applications A-F so as to result in a particular data loss pattern.

The allocation of data loss to users may be managed through a policy when allocating stripes to users, taking account of the mapping of stripes to memory modules. This may be visualized in logical address space, where each of the row/column designations is associated with a plurality of stripes. For simplicity, FIG. 30 illustrates this concept with row/column logical address ranges having sufficient space for the width of two stripes. Let us presume that stripes 0, 1, 2 are assigned to user A; stripes 10, 11, 12 are assigned to user B; stripes 20, 21, 22 are assigned to user C; stripes 30, 31, 32 are assigned to user D, stripes 40, 41, 42 are assigned to user E; and, stripes 50, 51, 52 are assigned to user F. Again, for simplicity, the stripes shown are for stripe slope 0.

The first row contains data for users A and D, the second row contains data for users A and E, and the third row contains data for users A and E, and so on, until the ninth row contains data for users C and D.

The effect of multiple failures of modules on the data loss pattern may be understood by, for example, considering the effect of two failed modules in the memory system on the integrity of the stored data. That is, a second module may have failed prior to complete recovery of the data associated with the first failed module. If single parity is used, then data will be lost if the second failure occurs in the same row as the first failure. For example, if (1, 2) failed and (3, 2) have failed, data in row 2 will be lost. This will affect users A and E. If the second failure has occurred in any other row, then each of the users will have had a single failure only, and the data can be recovered. So, when the data is dispersed by the stripes, the second failure has only a small probability of causing irretrievable data loss. This suggests that, for example, column parity may be used, where the parity is computed over a column as a protection against double failures. Even if the recovery of data using the column parity is slower than the use of the single parity, the low probability of specific module failure combinations makes this a useful strategy.

Where each stripe is protected by a double parity, then the same general considerations would apply if a third module were to fail prior to the recovery of the data from a failed module.

A number of example patterns of striping are presented so as to illustrate the striping of data in logical arrays that are not commensurate in the number of columns with the length of a stripe. Some of the resultant arrangements may not appear to be optimal, particularly for a small number of stripes. However, the differences become less significant for a large number of stripes, and permit choices of array width, stripe length, stripe stepping and the like, so as to achieve other system objectives.

Figure 31:
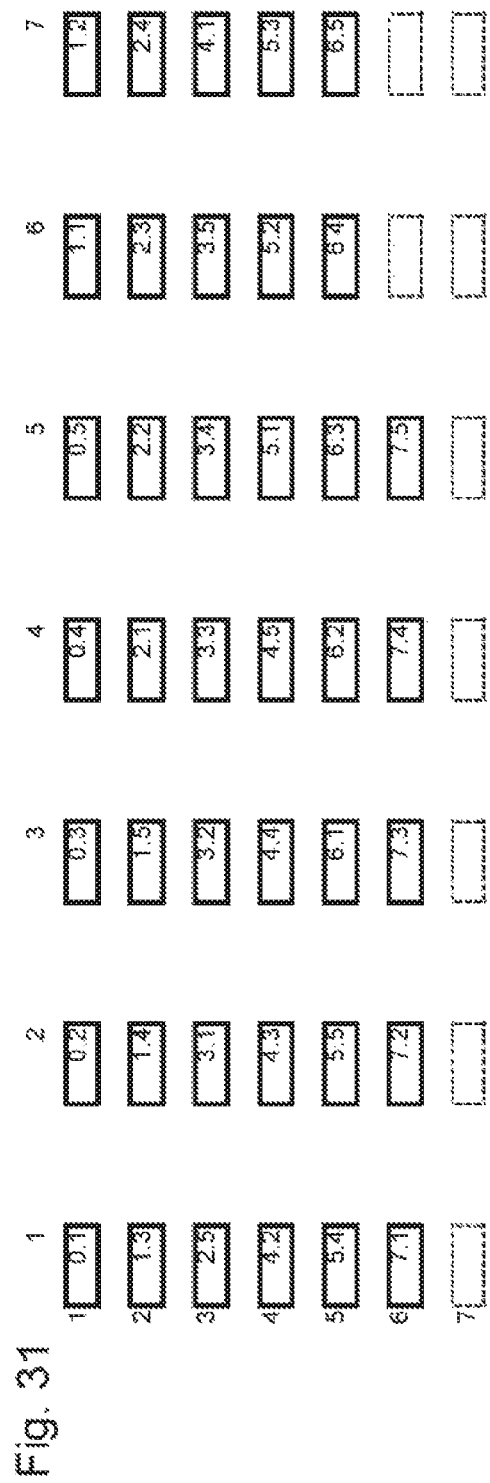
FIG. 31 shows a logical address space of dimension 7×7 including left diagonal striping.

FIG. 31 shows a logical array of dimension 7×7 where the stripe length is 5. As in other examples, the number of data address ranges and the number of parity data address ranges in a stripe may be selected based on system performance requirements. For example, a stripe of length 5 may have 4 data address ranges and one parity address range, or 3 data address ranges and 2 parity address ranges. The first stripe 0.0 occupies array locations 1-5, and the second stripe occupies array locations (6, 1) through (3, 2). That is, the stripe wraps around the right array boundary with an increment of one row. In a disk array this is sometimes called left diagonal striping. In a typical disk system, a row of disks is configured, and the wrap around continues in the group of disks corresponding to row zero of the present example. In the present example, the address ranges of the stripes may allocated to logical array locations which, in turn, may be mapped to memory modules. The term "left diagonal" may be understood by considering the first element in each stripe (for example 0.1, 1.1, 2.1, 3.1, . . . ) where a line passing through groups of the address ranges slopes from the upper right to the lower left, taking account of wrap-around.

The array locations (6, 6) through (7, 7) are shown with dotted lines. These indicate address ranges which may be filled by an eighth stripe, and part of a ninth stripe, where the remainder of the ninth stripe wraps around to the first row. Alternatively, the array may not be filled, perhaps corresponding to a system with a different number of memory modules, and the wrapping to row one may occur after array location (7, 5).

Figure 32:
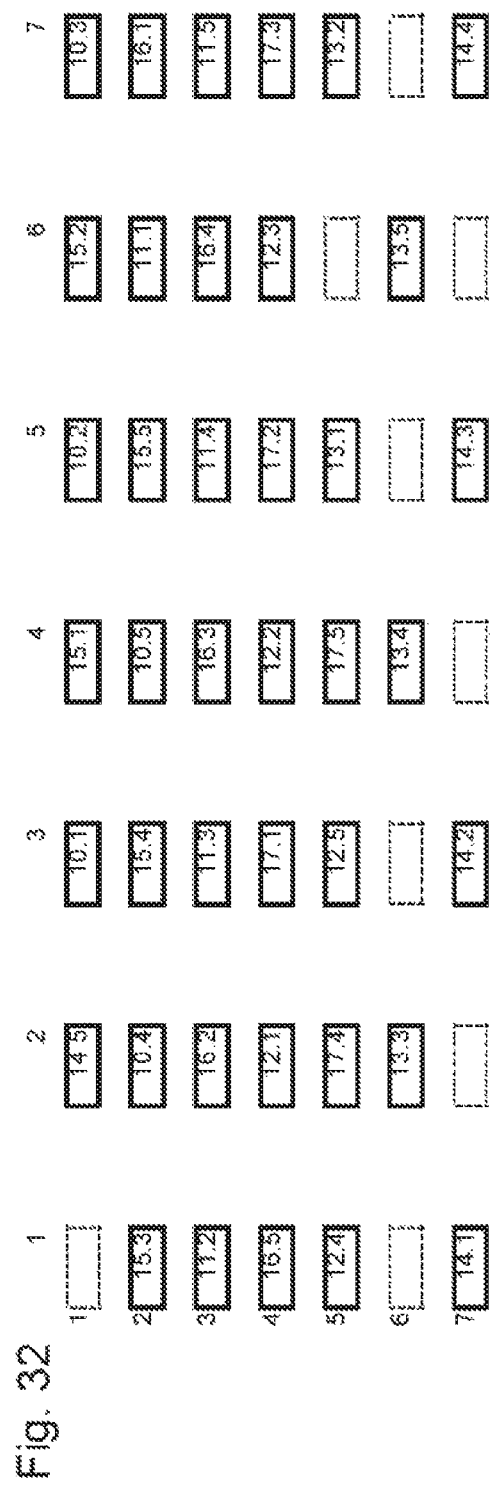
FIG. 32 shows a logical address space of dimension 7×7 where the logical addresses ranges of a stripe are incremented by two columns between address ranges, and the resultant wrap-around pattern.

In another arrangement, shown in FIG. 32 for a 7×7 logical array, a first stripe (stripe "10") of length 5 may begin at (3, 1) and be incremented by 2 so that the next logical address range would be located at (5, 1) and so forth, continuing to (4, 2). The next stripe (stripe "11") begins at (6, 2) and so on, until address range 14.4 is located at (7, 7) and the stripe wraps around to the beginning of the array so that 14.5 is located at (2, 1). The highest number stripe shown is stripe "17". However, it is clear that the array is not yet filled, and adding stripes "18" and "19" would both fill the array the first time and begin to wrap around.

Figure 33:
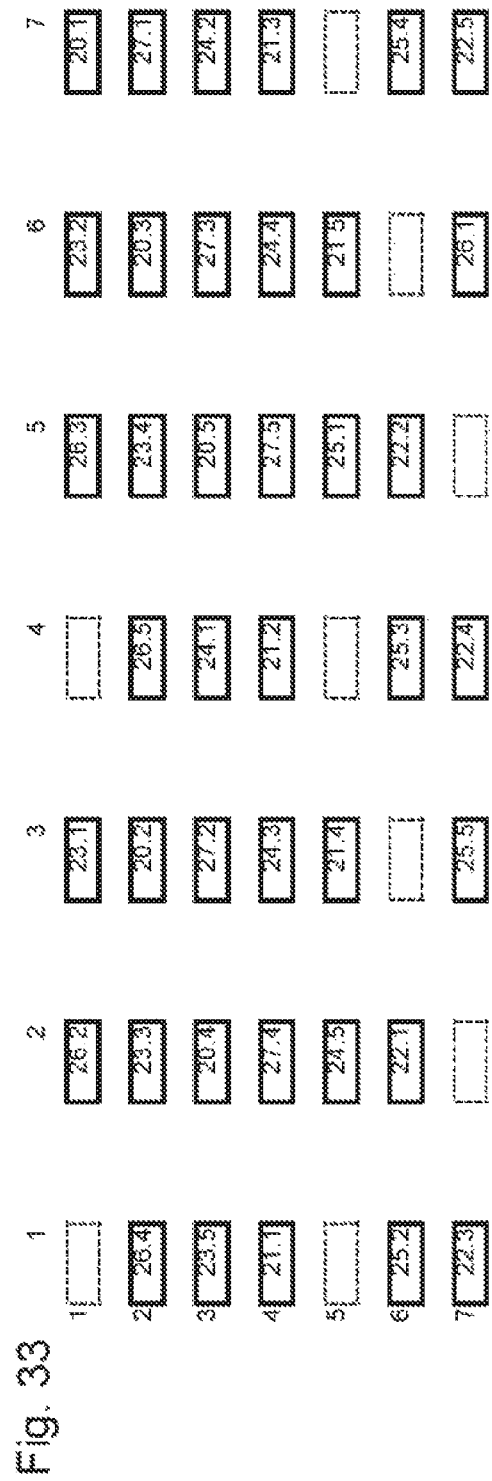
FIG. 33 shows a logical address space of dimension 7×7 where the logical address ranges of a stripe are incremented by two columns between address ranges, and the resultant wrap-around pattern.

FIG. 33 shows an arrangement similar to that of FIG. 32, except that the column increment between address ranges in a stripe is incremented by three.

FIG. 34 shows the striping pattern of FIG. 31 where the striping pattern of FIGS. 31-33 and higher order inter-address-range step patterns are concatenated so that a total of 47 stripes are allocated to logical address ranges. The effect of the non-commensurate length of the stripe and the width of the array has little effect on the uniformity of filling of the address space. In a large memory system where there may be from hundreds to tens of thousands of stripes, or more, the non-optimality of the distribution would not generally be a consideration.

Figure 35:
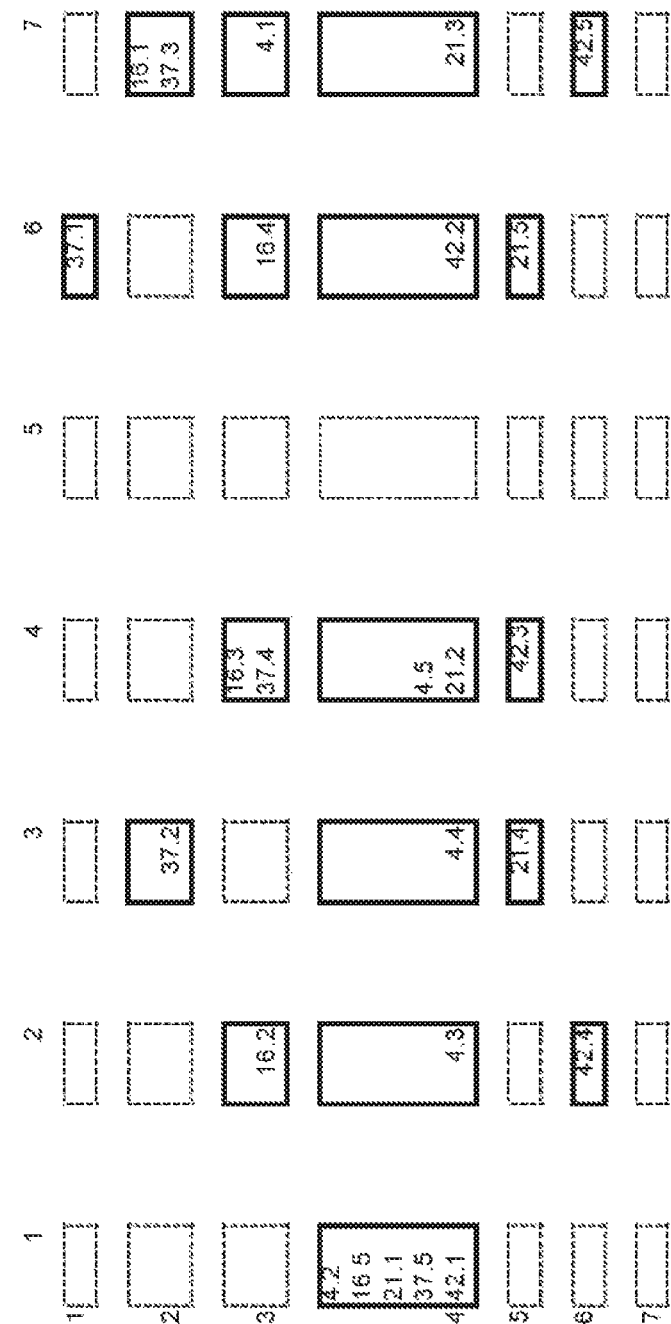
FIG. 35 shows the distribution of stripes that are common to the logical address space (1, 4) of the array address of dimension 7×7.

FIG. 35 shows the distribution of stripes intersecting at (1, 4) for the array pattern of FIG. 34. Five stripes intersect in the module, and the data associated with the stripes is distributed throughout the array, so that other data of the stripes is found in 17 array locations (which may correspond to 17 memory modules.). So, should there be a failure in the memory module associated with (1, 4), data is recovered from 17 modules. Depending on the column increments within a stripe, the length of the stripes, and the total number of stripes, the data becomes widely distributed over the non-failed modules so that the read and write load on each of the non-failed modules for the reconstruction of a failed module is relatively evenly distributed over the system.

Figure 36:
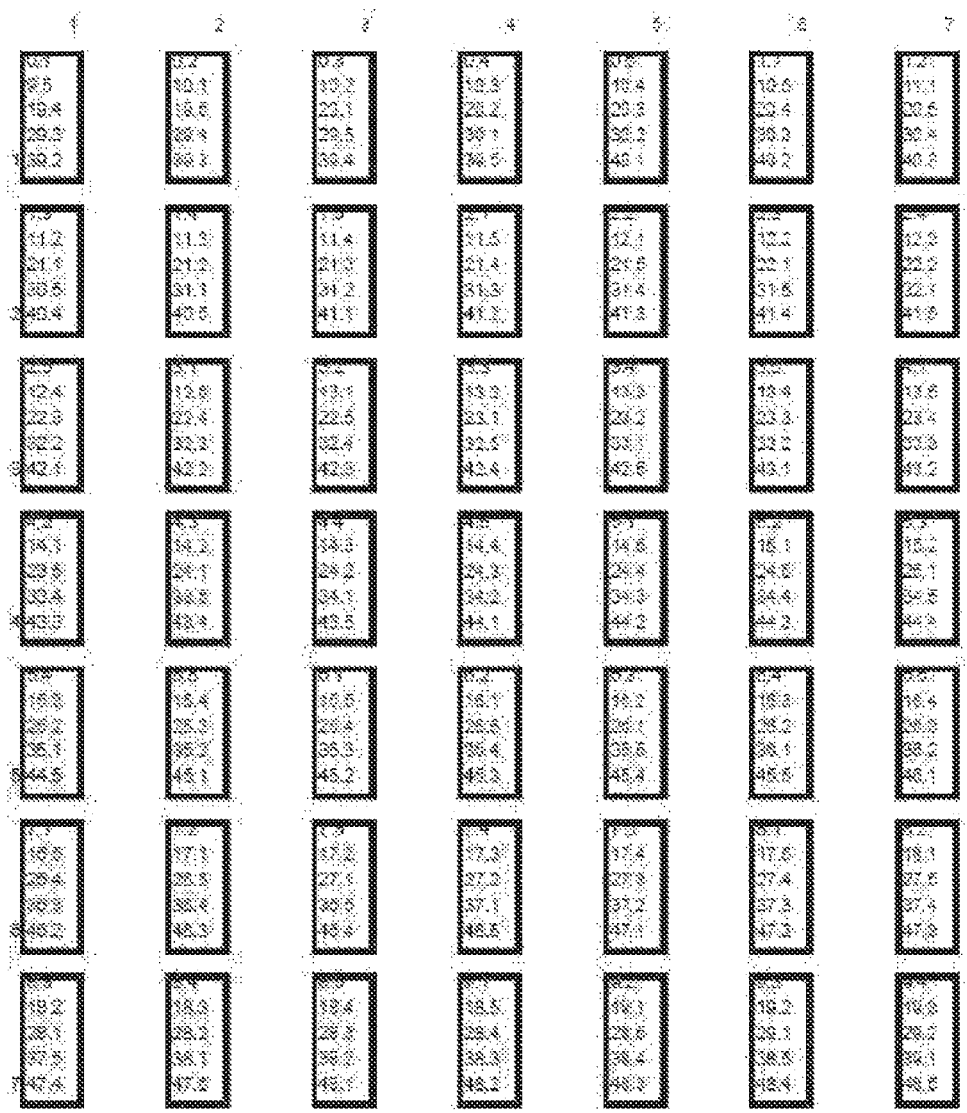
FIG. 36 shows the striping pattern of FIG. 31 as a generating pattern for a total of 48 stripes.
Figure 37:
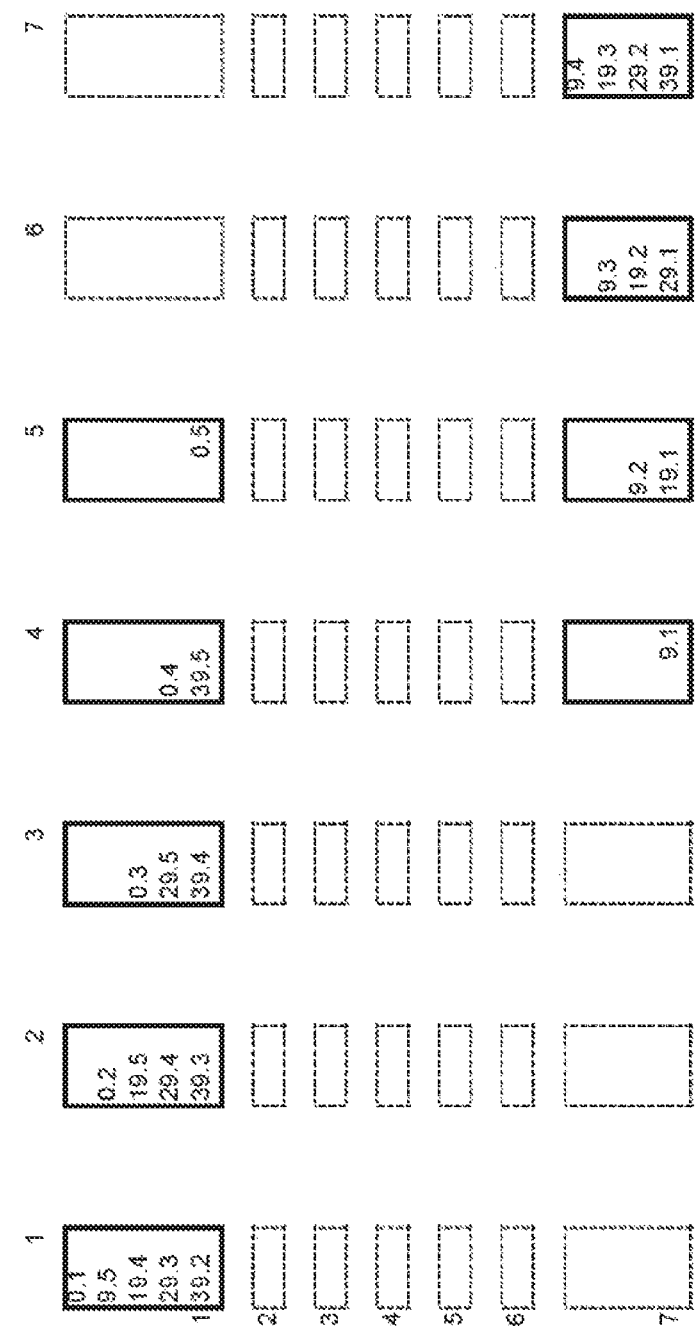
FIG. 37 shows the distribution of stripes passing through (1, 1) of FIG. 36.

FIG. 36 is an allocation pattern using the arrangement of FIG. 31 as a generating pattern, repeated 48 times. For the result of FIG. 36, FIG. 37 shows the relationship of the stripes passing through (1, 1), being representative of a failed module. The stripes are distributed over 8 modules, and some of the modules have four stripes passing through them. This is less optimum than the situation of FIG. 35, but illustrates that, depending on the striping patterns selected, the data of a memory module may be dispersed more or less widely over the memory system.

Figure 38:
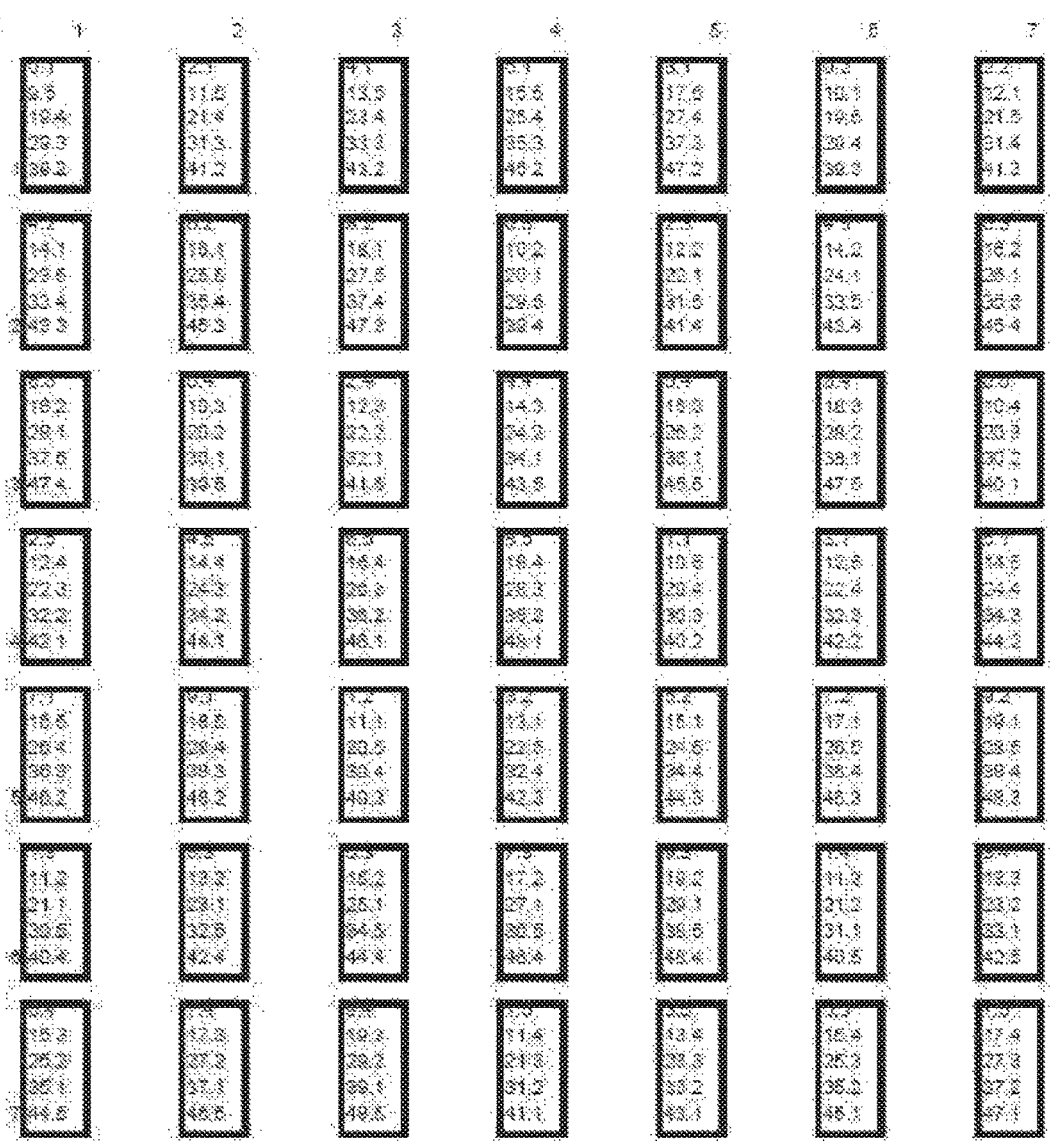
FIG. 38 is similar to FIG. 36, where the address range increment within a stripe is five.
Figure 39:
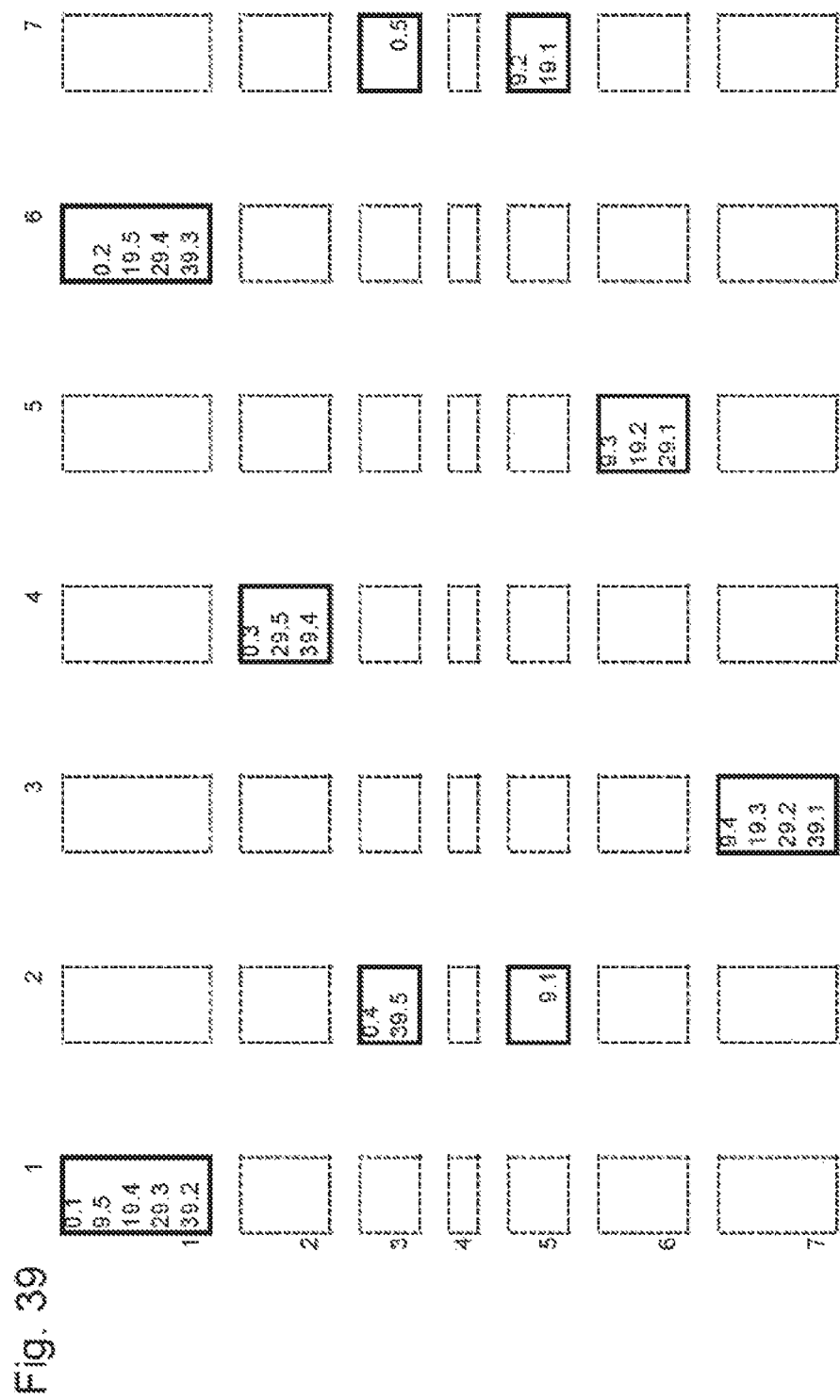
FIG. 39 shows the distribution of stripes passing through (1, 1) of FIG. 38.

FIGS. 38 and 39 show a similar situation to that of FIGS. 36 and 37, however the striping pattern is such that sequential address ranges of a stripe increment by 5 in the column direction. This results in a differing set of memory modules storing the data from which the data of the failed module can be recovered.

Figure 40:
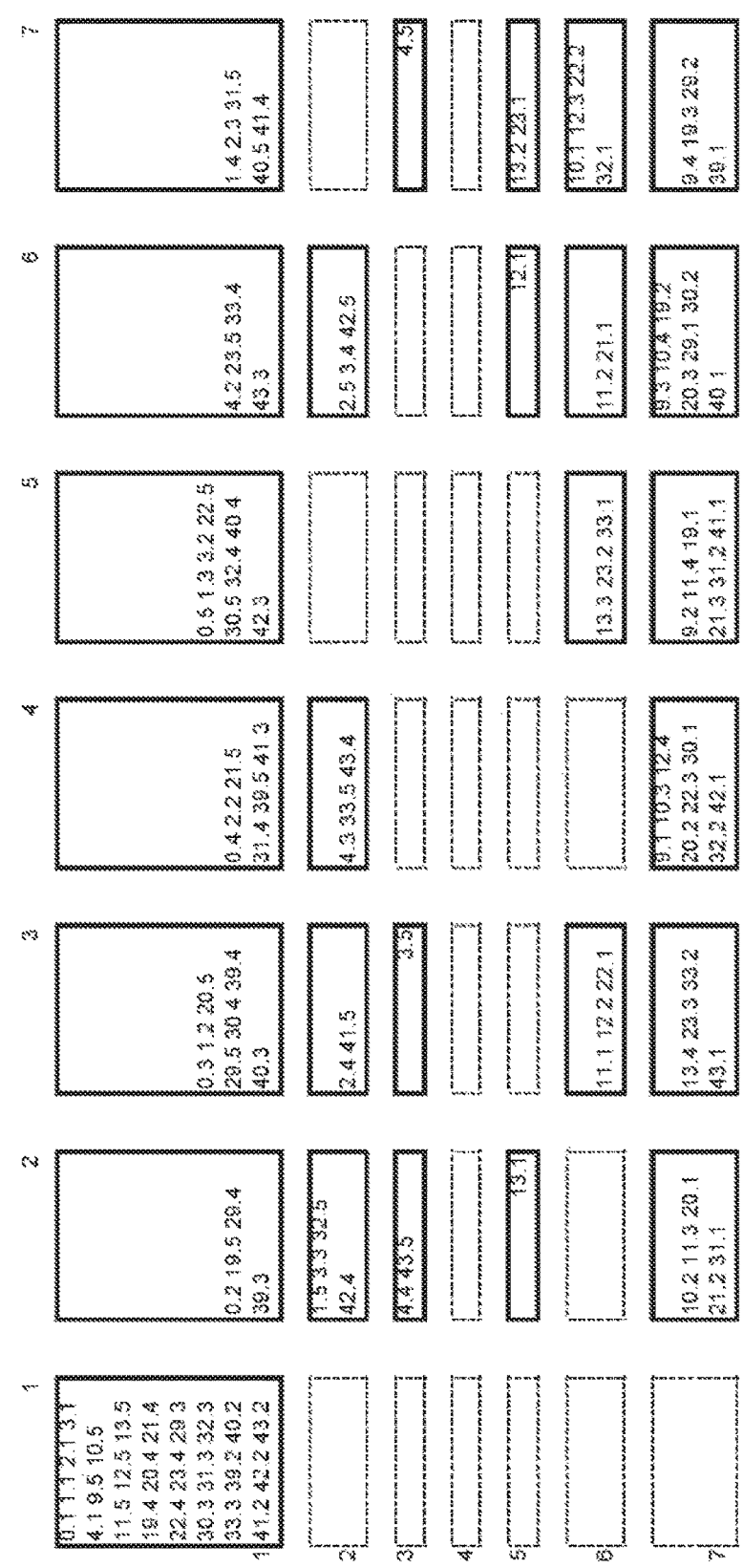
FIG. 40 shows the use of an number of different striping patterns to more widely distribute the stripes passing through a module over the logical address space.

When a number of differing striping patterns are combined so as to fill the array, the data is spread over a larger number of memory modules, as may be seen in FIG. 40. Here, the data is spread over 26 modules, although not uniformly.

Figure 41:
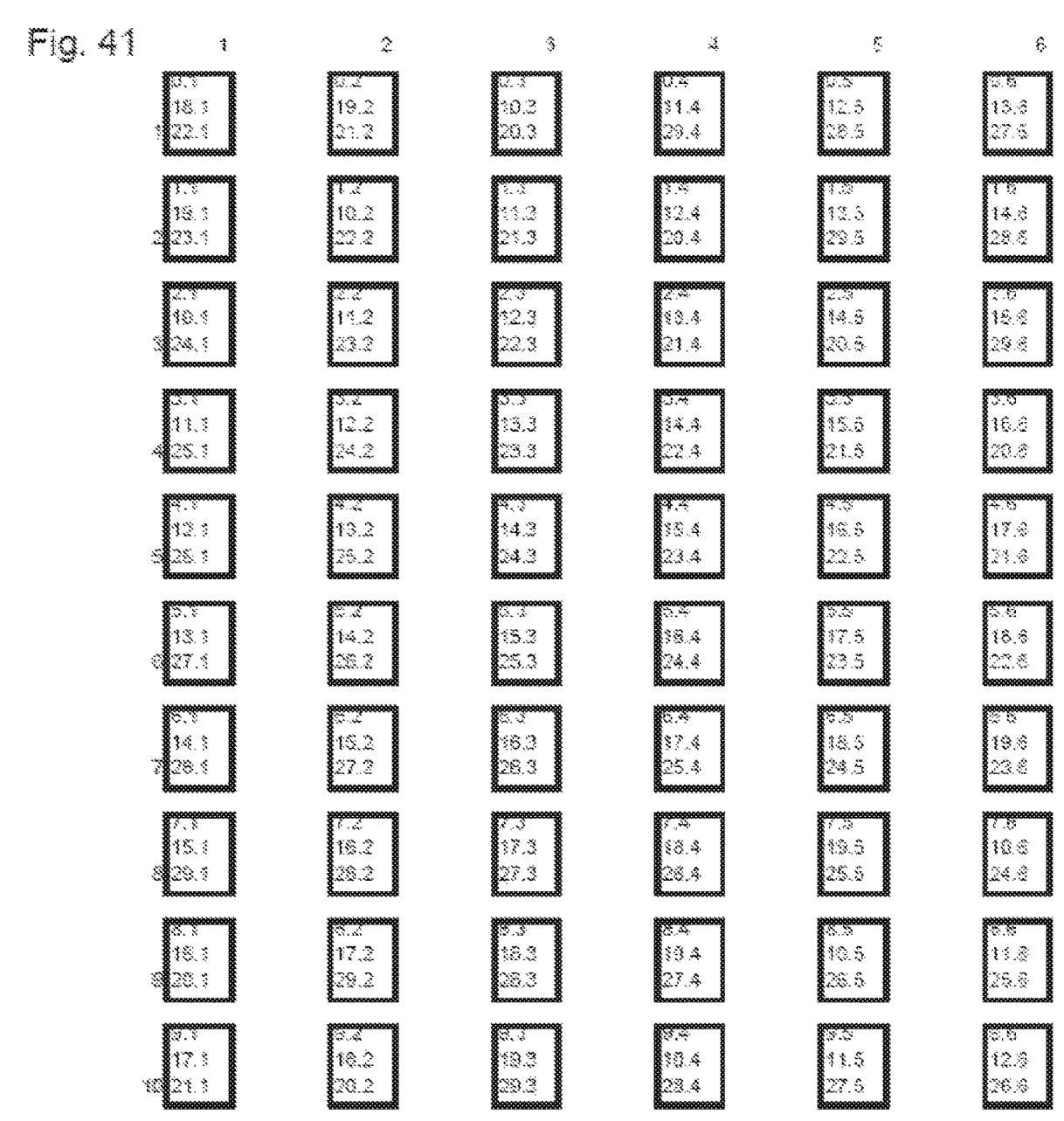

The effect of the failure of a memory module on the recovery of data for differing parity approaches may be better understood by reference to FIG. 41. The stripes are of length 6, and the matrix is a 6×10 logical array. Here stripes "0" through "9" are written with slope "0", stripes "10" through "19" are written as a left diagonal pattern and stripes "20" through "29" are written as a right diagonal pattern. There are 29 stripe patterns. Of course additional stripe patterns may be written, but the example is simplified so as to be followed by the reader in a figure. The patterns were generated by algorithm, and the association of columns and rows with stripe address ranges may be determined in practice by an algorithmic calculation or table look up.

Assume that the module associated with (1, 1) has failed. That is, address ranges 0.1, 18.1 and 22.1 are lost and need to be recovered. Stripe "1" is also found in (1, 2), (3, 1), (4, 1), (5, 1) and (6, 1). Stripe "18" is also found in ((2, 10), (3, 9), (4, 8), (5; 7) and 6, 6). Stripe "22" is found in (2, 2), (3, 3), (4, 4), 5, 5) and (6, 6). Each of the stripes in this example is of length L=6, having five data address ranges and one parity address range. So, the data of array location (1, 1) is recovered as previously described, eventually into a spare module that may then be assigned to array location (1, 1), completing a recovery process.

However, there is always a concern that a second module in the memory system may fail before the stripes are completely recovered. The characteristics of the data loss are of interest, both as to the number of stripes affected, the probability of data loss, and the pattern of data loss.

Consider a use of the stripe where there are five data logical address ranges and one parity address range. Let us assume, for purposes of example, that the parity is at address range (X.6). That is, in the sixth column. The data to be recovered is found in 14 of the 60 modules of the memory system.

For simplicity, let us consider a scenario where a second module fails immediately after the first failure. This situation might be considered improbable on a statistical basis, but not in practice, as a technician might inadvertently remove an incorrect module believing that it is the failed module, or may induce a failure by some other action. Where the second failure is in the same column as the first failure, there is no loss of data, as the array is configured so that the stripe having an address range in (1, 1) does not have an address range in any of the other modules in column (1, Y), where Y is the row number. So any of the 9 modules in column 1 may fail without data loss. That is, 9 of the remaining modules out of the remaining 50 could fail with no effect. They would be recoverable as previously described. Of the other modules, we have seen that 14 have data that will be used in recovering the stripes of the first failed module. A failure in any of the other 36 modules would not result in loss of the data needed to reconstruct the stripes of the first failed module. In sum, any one of 45 of the 60 modules could fail without causing data loss that could not be retrieved using single parity.

The effect of a second failure in one of the 14 modules having data being used in recovery, causing a loss of two address ranges, would be to cause an irretrievable loss of data for one stripe, in the single parity case. All of the other stripes would be recoverable. Failure of a particular module, may be more damaging to the data integrity as may be seen by considering the case of logical array location (6, 6) which, in the particular striping arrangement used in the example, has data from stripes "18" and "22". So, the data for two stripes may be lost if the second module to fail is module (6, 6). This would happen about one out of 49 double failures. Realizing this possibility exists, one may give priority to recovery of data from modules where data for more than one failed stripe needs to be recovered.

From another viewpoint, a failure in any of the remaining 13 modules of the recovery group would cause the loss of data in a single stripe. Depending in the width of the stripe (that is, the amount of data in the logical address range), the data loss may be generally restricted to one stripe of the data storage, and if the stripes are associated with applications, or virtualized users, the loss of data may be confined to a single one of a plurality of users.

Depending on the performance desired, a user may be assigned one stripe or a plurality of stripes, so that the pattern of data loss for a user may be managed. In an example, where each logical address range (in a logical column, row) is small, the user is allocated a plurality of stripes, which may be in a concatenated string, the data loss is widely spread when it occurs. Alternatively, the stripe width may be wide, and when the data loss occurs, the data may be a contiguous block of data for a user. The choice may depend on the nature of the data and the type of back up storage architecture used.

Although the parity might be presumed to be in (X.6), the parity may be any one of the logical address ranges in the stripe. That is, the "data" lost may be either the parity data or the data from which the parity was computed.

A stripe of length L=6 may also be configured with dual parity, so that two modules containing data of the stripe may fail before data cannot be recovered using the parity. The loss of data would require a particular three modules to fail before the data was recovered. Again one may ascertain the modules where more than one stripe of data to be recovered are located and recover those stripes first so that the likelihood of loss of data due to a third failure may be reduced.

The foregoing examples generally use the term module to represent a physical memory circuit, or a logical or physical address range, which may be a single address location, or distributed over a range of physical or logical locations. Memory circuits on a physical memory module may be grouped so as to be part of different RAID stripes, and have different time periods during which reading and writing and erasing may occur. As such, the use of the term module is a matter of convenience and is not intended to suggest or require a specific arrangement. Similarly, it would be understood that sub-optimum throughput configurations may be selected for other reasons, and may be mixed with the configurations described herein where desirable. Memory modules may be purely memory based storage, hybrid FLASH/disk storage, mixed memory configurations such as combinations of DRAM/FLASH, SLC FLASH/MLC FLASH, MEMS, phase change memory or the like.

For clarity of presentation, a memory module was considered to have a controller, a temporary data storage mechanism and a non-volatile storage mechanism. However, not all of these aspects may be found in embodied in a particular physical object. Alternatively, the capability of more than one memory module may be found in a particular physical object. The choice of embodiment is application dependent, and is likely to evolve with time as denser and more functional circuits are designed and produced.

The term memory module failure is used to denote a circumstance where the function of the memory module, or any memory circuit, is degraded to the point that, given specific system criteria, a recovery operation is performed to reconstruct data. However, such reconstruction of data may be performed without replacement of the memory module, providing that the nature of the failure permits. For example, consider a memory module having a plurality of semiconductor memory packages installed thereon. One or more of the semiconductor memory packages may suffer a failure that is independent of the operation of remainder of the module. Depending on the amount of spare memory space remaining, the data of the failed package may be recovered and stored elsewhere on the module, in a spare module, or the like. The overall process may thus be carried out at one or more levels of the system architecture, depending on the required reliability, speed of recovery, or other system performance criteria.

In another aspect, the efficiency of use of the memory on a module may be improved by policies that operate either in conjunction with or independent of a module-level erase-hiding configuration. These strategies may not preclude using an erase-hiding configuration within a module comprising a multiplicity of circuit packages. The packages themselves may include a plurality of die. At present, at some level of the system, a memory area, let us assume a die is constrained such that a read operation may not be performed when an erase or a write (program) operation is being performed. At that level of the architecture, at least, other policies may be used to improve the overall performance of the memory system. By describing the policies at such a level of the architecture, one should not presume that the policies could not be imposed a higher level of the memory system architecture when the hardware or software design may be expedited by using the policies.

Where the erase or write operations of a plurality of chips are performed without synchronizing the operations to specific epochs, or without other means of performing operations in a stripe in a sequential manner so as to preclude erase blockage of a read operation, the time between erase operations on a chip may be schedule at an average rate sufficient to perform the erase operations without a significant queue of requests developing. However, the time between erase operations may be selected as a bounded random variable. This policy tends to avoid periodic read blockage in a RAID group.

Another policy may be used to modulate the rate of garbage collection. The number of write operations to a chip may be monitored, and the rate of performance, or the initiation of, the garbage collection may be gaited such that a predetermined number of write operations may be performed between erase operations. For example, after a number of write operations proportional to, or equal to an erase block size on the chip has been executed, an erase operation may be dequeued. Again, to avoid developing synchronous patterns, the actual number of write operations used as the threshold for this process may be selected as a bounded random number. Similarly, a garbage collection process may be initiated based on a similar threshold value for the number of writes to a chip. This would tend to keep the average amount of free blocks within a design limit.

In another aspect, some users may read large blocks of contiguous data. A non-limiting example may be image processing system, a video server, or the like. In such situations, the overall amount of data that can be read from the chips or the packages may be limited by local bus bandwidths. A memory module of package having a local RAM buffer memory may temporarily buffer the data so that the reads may be performed at the maximum rate, even though they cannot be transmitted at that rate. When the data retained in the buffer memory exceeds the amount of data that may be transmitted from the buffer memory at the maximum bus bandwidth in a time interval equal to either an erase operation or a write operation, either the erase operation of the write operation may be dequeued from a queue of pending requests for erase or write operations without compromising the read latency. In this manner, by subsuming the performance of write or erase operations in the time when the read bus bandwidth is fully occupied, the overall number of write or erase operations may be increased.

As the write requests and data may be transmitted to a module while the read data is being retrieved from the module, this increases the write load that may be accommodated before the write load exceeds the threshold where full performance of the erase-hiding technique may no longer be possible. Such measures operate essentially autonomously from the higher level control architecture.

Other measures may be used when MLC FLASH memory or other memory technology is used where the higher level bits may be read or written at a different speed than the lower level bits. For example, each request may be sorted by chip and address (high, low) and a queue formed for each chip. The total response time for the package, and for each chip, may be computed based on the expected read time, and the total response time for the package may be computed for each chip. Providing that the response time for the chip, including an erase or a write operation is not longer that a specified read latency, a write or an erase operation, as appropriate, may be dequeued and performed.

Some of the lower level techniques described may be characterized as keeping track of the outstanding write and erase queues, and, when the read operations have buffered sufficient data such that a specified read latency may be achieved even when performing at least one write or erase operation, a pending write or erase operation may be performed.

In some data base systems a "re-do" log is maintained, the log being essentially a sequential listing of each and every command and data element that is transmitted to the memory. Periodically this log is check-pointed to a back-up storage device so as to provide for long term data security, as is known in the art. When a failure occurs in the data base, the re-do log may be processed so as to reconstruct the data base from the last valid image of the data base that may be retrieve from the back-up storage. Since the integrity of the data base depends on having a valid re-do log, compromising of the log due to a storage module failure may not be acceptable.

Often, a duplicate copy of the re-do log is maintained for additional security. By proper allocation of the address spaces of the stripes in which a re-do log and its duplicate are stored, the number of device failures that may occur prior to loss of data may be increased, and the recovery and back up of the data of the re-do log after a failure may be expedited. By doing this, one of the patterns continues to maintain the erase hiding property.

As has been described above, a plurality of stripes may be configured based on a stripe cluster centered on a module in logical space. The stripe patterns may be such that one or more stripes overlap at a module. Where the number of modules in a stripe is N, and the order of parity redundancy is M, and L modules of the memory contain data from two stripes, the probability of data loss due to a failure may be expressed as $P=(L-M)/(N-M)$. That is if the order of the parity is greater than or equal to the number of modules having overlapping data, a module failure will not result in the loss of data. In an example, where a single parity is used, a first failure would not cause data loss in a configuration where there was no overlap one module in data. Two module failures in the group of modules in which the data of the stripes is stored would be needed. If there was an overlap of two modules, then for a stripe of length 5 and order of parity of 1, there would be one chance in $(2-1)/(6-2)=¼$ that another module failure would cause a loss of data that could not be recovered.

In general then, when highly reliable storage of essential data is desired, then the order of the parity and the overlap of stripes in modules should be managed so that such dual data loss does not occur. When a module failure does occur, there are a number of strategies (policies) that may be applied to the recovery of the data. The lost data may be recovered into an available data area as previously described. Alternatively, the duplicate stripe may be read for the lost data locations and inserted instead of the lost data in the original stripe. Or, the data from the duplicate stripe may be used to verify the data recovered from the parity of the first log stripe. In another aspect, the duplicate data log may be check pointed to the back up storage at the time of the failure in the first data log, so as to preserve the data. One can consider various combinations of the methods, where a consideration may be one of recovering the data with the least impact of the performance of the other operations of the memory system, or with the objective of recovering the lost data in the fastest possible time, or minimizing the probability of loss of data from the combination of the two logs. For example, the policy may be one which retains erase hiding for at least one log. The selection of the policy, or the combination of policies, may vary depending on the user expectations, where the user may be one of a plurality of users of the memory system.

For the purpose of managing the selection and execution of various policies a "stripe group" comprising a selection of RAID stripes or of stripe clusters may be defined where one or more of the user, the data, the data fidelity, data reliability, data encryption, or other property may have common attributes. Such attributes may also include response time, read latency, write bandwidth, block size, input/output operations per second and the like. A particular example might be logical unit number (LUN), partitions, or any other administrative or performance grouping of data, but it is not intended that the stripe group be limited to the construct commonly understood to be a LUN. Yet, one may appreciate that the stripe group may comprise a predefined or extensible memory region (logical or physical) which may map to physical memory areas that are used to store and otherwise manipulate the data.

So more than one user may share this stripe group, or the stripe group may be allocated to individual users, where a user may be a customer of the memory system operator, an operating program in a suite of software, or the like. In the event of a module failure, the address ranges may be associated with a particular stripe group and the associated attributes. Based on the attributes, a policy may be selected so as to maintain the performance of the stripe group in accordance with a desired attribute, or to restore the performance to the pre-failure state. This policy may differ from stripe-group-to-stripe group, and may be modified so as to accommodate the requirements of other stripe groups.

Although the present invention has been explained by way of the examples described above, it should be understood to the ordinary skilled person in the art that the invention is not limited to the examples, but rather that various changes or modifications thereof are possible without departing from the spirit of the invention. It is therefore intended that the following claims, including all equivalents, are intended to define the spirit and scope of this invention.

The invention claimed is:

1. A memory system, comprising:
a controller in communication with a plurality of memory modules, the controller configured to:
receive data for a write operation;
compute redundancy data for the data; and
store the data and the redundancy data in the memory modules so that when an erase operation prevents a read operation from at least some of the memory modules where the data for the read operation is stored, the data and redundancy data stored in some of the other memory modules can be read to provide the data for the read operation, with a time delay of less than a time period required to perform the erase operation in the memory modules.

2. The memory system of claim 1, wherein the data for the read operation is provided to a user prior to completion of the erase operation.

3. The memory system of claim 1, wherein the stored data and the redundancy data from the other memory modules are used to reconstruct the data for the read operation when the erase operation prevents the read operation for the data from being performed.

4. The memory system of claim 1, wherein the redundancy data is single parity data and the data for the read operation is reconstructed using an exclusive-OR operation.

5. The memory system of claim 1, wherein the redundancy data is dual parity data.

6. The memory system of claim 1, wherein the memory modules are Solid State Disks (SSD).

7. The memory system of claim 6, wherein the SSDs use an industry standard protocol.

8. The memory system of claim 7, wherein the industry standard protocol is one of SATA, SCSI or Fibre Channel.

9. The memory system of claim 1, wherein memory modules are NAND FLASH chips, or NAND FLASH dies.

10. The memory system of claim 1, wherein the memory modules are comprised of NANO FLASH memory circuits.

11. The memory system of claim 1, wherein the memory modules are configured as a RAID (Redundant Array of Independent Disks) group.

12. A non-transitory computer-readable media (NTCRM) comprising instructions for storing data in a memory system, wherein execution of the instructions by a controller in communication with a plurality of memory modules and a computing device is to cause the controller to:
receive a write operation from the computing device to write data in the memory system;
compute redundancy data for the data; and
store the data and the redundancy data in the memory modules so that when an erase operation or a write operation prevents a read operation from one or more memory modules where the data for the read operation is stored, the data for the read operation can be read and reconstructed from the data and redundancy data stored in the other memory modules.

13. The NTCRM of claim 12, wherein execution of the instructions is to cause the controller to compute an exclusive-OR (X-OR) of the data and redundancy data read from the other memory modules to reconstruct the data.

14. The NTCRM of claim 12, wherein execution of the instructions is to cause the controller to send a read command only to the modules that are not performing the erase operation or write operation.

15. The NTCRM of claim 12, wherein the memory modules are configured as a Redundant Array of Independent Disks (RAID) group.

16. A memory system, comprising:
multiple memory modules;
a controller in communication with the memory modules, wherein the controller is operable to:
write data into the memory modules such that, responsive to a read operation for data stored in one or more memory modules, when a write operation prevents the read operation from being performed on some of the memory modules where the requested data is stored, previously stored data and redundancy data from other memory modules is read to provide the data for the read operation, wherein a time delay to complete the read operation is less than a time period required to perform a write data operation in the memory modules.

17. The memory system of claim 16, wherein the write operation is a plurality of write data operations performed to a plurality of the memory modules.

18. The memory system of claim 16, wherein the data requested by the read operation is provided to a user prior to a completion of the write operation.

19. The memory system of claim 16, wherein the memory modules are Solid State Disks (SSD).

20. The memory system of claim 16, wherein the memory modules are configured as a Redundant Array of Independent Disks (RAID) group.

* * * * *